US008427352B2

(12) United States Patent
Tanizawa

(10) Patent No.: US 8,427,352 B2
(45) Date of Patent: Apr. 23, 2013

(54) A/D CONVERTER CIRCUIT INCLUDING PULSE CIRCULATION CIRCUIT WITH DELAY UNITS COUPLED TOGETHER IN RING SHAPE

(75) Inventor: Yukihiko Tanizawa, Kariya (JP)

(73) Assignee: Denso Corporation, Kariya (JP)

( * ) Notice: Subject to any disclaimer, the term of this patent is extended or adjusted under 35 U.S.C. 154(b) by 42 days.

(21) Appl. No.: 13/233,272

(22) Filed: Sep. 15, 2011

(65) Prior Publication Data

US 2012/0075137 A1 Mar. 29, 2012

(30) Foreign Application Priority Data

Sep. 28, 2010 (JP) ................................ 2010-216767
Apr. 15, 2011 (JP) ................................ 2011-091439

(51) Int. Cl.
*H03M 1/60* (2006.01)

(52) U.S. Cl.
USPC ........... 341/157; 341/163; 341/155; 340/514; 340/540; 332/109; 327/175; 327/176; 324/522; 324/537; 324/72

(58) Field of Classification Search .......... 341/140–160; 250/214, 1, 214 R; 324/72, 522, 537, 117 H; 340/514, 540, 551
See application file for complete search history.

(56) References Cited

U.S. PATENT DOCUMENTS

| 5,872,315 | A * | 2/1999 | Nagase et al. ................... 73/726 |
| 6,064,278 | A * | 5/2000 | Tanizawa ....................... 332/109 |
| 7,612,699 | B2 * | 11/2009 | Tanizawa ....................... 341/157 |
| 7,639,169 | B2 * | 12/2009 | Tanizawa ....................... 341/155 |
| 7,834,307 | B2 * | 11/2010 | Tanizawa ................... 250/214.1 |
| 2003/0011502 | A1 | 1/2003 | Watanabe |
| 2007/0080844 | A1 | 4/2007 | Terazawa et al. |
| 2008/0284633 | A1 | 11/2008 | Tanizawa |
| 2008/0309542 | A1 | 12/2008 | Tanizawa |
| 2009/0195430 | A1 | 8/2009 | Yamamoto et al. |

* cited by examiner

*Primary Examiner* — Lam T Mai
(74) *Attorney, Agent, or Firm* — Posz Law Group, PLC

(57) ABSTRACT

An A/D converter circuit includes first to fourth pulse circulation circuits and first and second counters and configured to provide high conversion accuracy irrespective of a temperature change. The first pulse circulation circuit operates with a difference voltage of a specified voltage and an analog input voltage. The first counter outputs a difference of the number of pulse circulation in the first and the second pulse circulation circuits. The third pulse circulation circuit operates with a difference voltage of the specified voltage and a set voltage. The fourth pulse circulation circuit operates with the set voltage. The second counter outputs a difference of the number of pulse circulation in the third and the fourth pulse circulation circuits. When an output value of the second counter reaches a specified value, an output value of the first counter at that time is outputted as A/D conversion data.

22 Claims, 48 Drawing Sheets

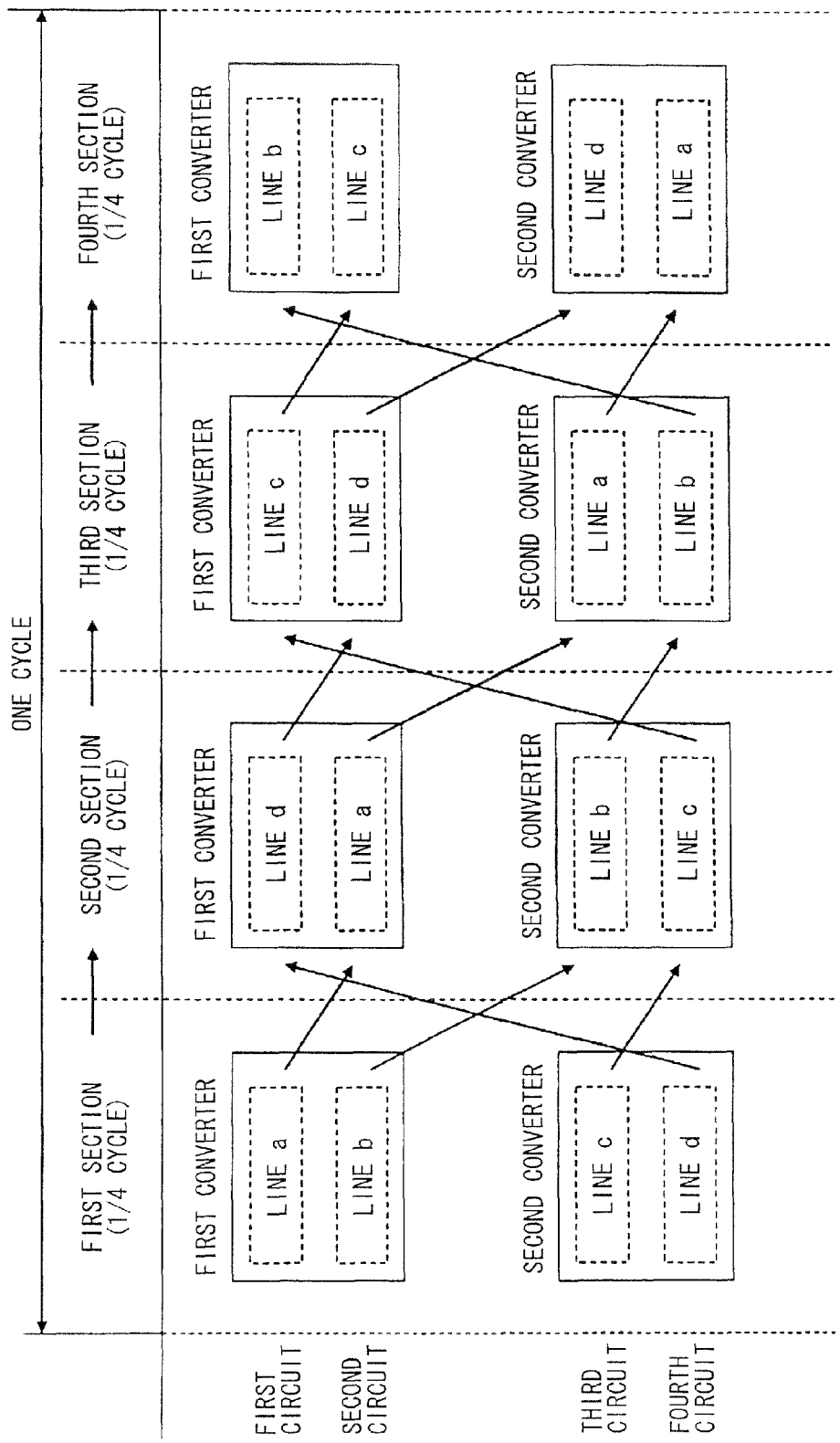

FIG. 41

A/D CONVERTER CIRCUIT INCLUDING PULSE CIRCULATION CIRCUIT WITH DELAY UNITS COUPLED TOGETHER IN RING SHAPE

CROSS REFERENCE TO RELATED APPLICATION

This application is based on and incorporates herein by reference Japanese patent applications No. 2010-216767 filed on Sep. 28, 2010 and No. 2011-91439 filed on Apr. 15, 2011.

FIELD OF THE INVENTION

The present invention relates to an A/D converter circuit using a pulse circulation circuit, in which delay units are coupled together in a ring shape (for example, ring oscillator).

BACKGROUND OF THE INVENTION

An A/D converter circuit of the time A/D (TAD) system provided with a pulse circulation circuit is proposed. The pulse circulation circuit is configured with delay units, which are coupled together in a ring shape, and which output an input pulse signal after delaying it by a delay time corresponding to a power supply voltage. This A/D converter circuit is supplied with an analog input voltage to be A/D-converted as a power supply voltage of the delay units, counts the circulation number (number of circulation) of a pulse signal in the pulse circulation circuit, and produces A/D conversion data based on the count value. The A/D converter circuit of a TAD system can be configured with digital circuit elements, such as a gate, and possesses many advantages that the circuit configuration is comparatively simple and can be realized at low cost.

However, since the delay unit (for example, inverter) with a delay time, which depends on the power supply voltage, is formed of semiconductors such as a MOS transistor, the A/D converter circuit of a TAD system has the characteristics that the delay time thereof changes depending on temperature. That is, although the power supply voltage (analog input voltage) is constant, at low temperature, the delay time of the delay unit becomes short and the circulation number to be counted increases. On the contrary, at high temperature, the delay time of the delay unit becomes long and the circulation number to be counted decreases. Accordingly, A/D conversion data changes depending on ambient temperature of the A/D converter circuit.

A compensation technology to the temperature change is disclosed by the following patent documents 1, 2, and 3, for example.
(Patent document 1) JP 4396063A (FIG. 5); US 2003/0011502A1,
(Patent document 2) JP 2008-312185A (FIGS. 12 to 16); US 2008/0309542A1
(Patent document 3) JP 2007-104475A (FIG. 13); US 2007/0080844A1

In an A/D converter circuit disclosed by patent document 1, an analog input voltage is inputted to a first pulse circulation circuit and a fixed reference voltage is inputted to a second pulse circulation circuit, then A/D conversion data is produced by numeric conversion of a ratio of transmission speed of a pulse signal produced in each pulse circulation circuit. However, accurate compensation can be attained only in the case where the analog input voltage is comparatively high, for example, higher than 5V. Therefore, due to the circumstances, it is hard to adopt the A/D converter to equipment, such as a vehicle sensor which operates with a power supply voltage of 5V.

On the other hand, an A/D converter circuit disclosed by patent document 2 allows an accurate compensation in the case where the analog input voltage is comparatively low, for example, about 2V. This A/D converter circuit utilizes a point γ (gamma), at which the difference of temperature characteristics of a delay unit is zero. That is, storing in a memory in advance data Y0 produced when a voltage corresponding to the point γ is inputted to a first pulse circulation circuit, and assuming that data produced when the analog input voltage is inputted to the first pulse circulation circuit is Y, and that data produced when a reference voltage Vref is inputted to the second pulse circulation circuit is Yref, then, the result of compensating operation (Y−Y0)/(Yref−Y0) is defined as the A/D conversion data.

In an A/D converter circuit disclosed by patent document 3, a voltage that an analog input voltage is added to an offset voltage and a voltage that the analog input voltage is subtracted from the offset voltage are inputted to a pulse delaying circuit, respectively, and a difference of the circulation numbers for these voltages is defined as A/D conversion data. Accordingly, relation between the analog input voltage and the A/D conversion data is linearized. In this case, by preparing A/D conversion data of a reference voltage as reference data, the temperature compensation is performed by dividing the produced A/D conversion data by the reference data.

As described above, in the temperature compensation technology to TAD in the past, the range of analog input voltage, which can be compensated to a temperature change, is dominated by the high voltage side or the low voltage side of a voltage range (for example, 0 to 5V) of the power supply voltage for operation usually used in a sensor device etc. Therefore, sufficient temperature compensation was not attained for the central voltage (for example, a voltage range centering on 2.5V), which is most used as an output voltage of a sensor etc. The range of analog input voltage, for which the temperature compensation could be performed successfully, was also narrow.

Since a digital operation including a division was necessary, the operation required time and shortening of conversion time was difficult. In a method using the point γ, at which the difference of temperature characteristics is zero, it is necessary to perform actual measurement of the temperature characteristics for each product in an inspection process after manufacture. Accordingly, production cost becomes high.

SUMMARY OF THE INVENTION

It is an object of the present invention to provide an A/D converter circuit, in which a high conversion accuracy is produced to a wide range of the analog input voltage including a voltage near the center of the power supply voltage for operation, irrespective of a temperature change, and of which a compensating operation and a prior characteristics measurement are unnecessary.

According to the present invention, an A/D converter circuit is provided with a first pulse circulation circuit, a second pulse circulation circuit, a first counter, a third pulse circulation circuit, a fourth pulse circulation circuit, a second counter and a conversion control circuit.

The first pulse circulation circuit is configured with a plurality of delay units coupled together in a ring shape and operable to circulate a pulse signal around the delay units. The plural delay units use a difference voltage of a specified voltage and an analog input voltage as a first power supply voltage and output an input signal after a delay of a delay time defined in accordance with the first power supply voltage.

The second pulse circulation circuit is configured with a plurality of delay units coupled together in a ring shape and operable to circulate a pulse signal around the delay units. The plural delay units use the analog input voltage as a second power supply voltage and output an input signal after a delay of a delay time defined in accordance with the second power supply voltage.

The first counter is operable to count a circulation number of the pulse signal in the first pulse circulation circuit and a circulation number of the pulse signal in the second pulse circulation circuit, and operable to output a difference of the circulation numbers.

The third pulse circulation circuit is configured with a plurality of delay units coupled together in a ring shape and operable to circulate a pulse signal around the delay units. The delay units are supplied with a set voltage different from a reference voltage and using a difference voltage of the specified voltage and the set voltage as a third power supply voltage, and output an input signal after a delay of a delay time defined in accordance with the third power supply voltage.

The fourth pulse circulation circuit is configured with a plurality of delay units coupled together in a ring shape and operable to circulate a pulse signal around the delay units. The delay units operate with the use of the set voltage as a fourth power supply voltage and output an input signal after a delay of a delay time defined in accordance with the fourth power supply voltage.

The second counter is operable to count the circulation number of the pulse signal in the third pulse circulation circuit and the circulation number of the pulse signal in the fourth pulse circulation circuit, and operable to output a difference of the circulation numbers.

The conversion control circuit is operable to make the first to the fourth pulse circulation circuits start respective circulation operation of the pulse signals concurrently, operable to output a conversion data output process signal when the difference outputted by the second counter reaches a predetermined specified value, and operable to output the difference outputted by the first counter at a time as A/D conversion data corresponding to the analog input voltage.

The delay units provided in each of the first to the fourth pulse circulation circuits are in the same number and formed in a thermally coupled state with each other.

BRIEF DESCRIPTION OF THE DRAWINGS

The above and other objects, features and advantages of the present invention will become more apparent from the following detailed description made with reference to the accompanying drawings. In the drawings:

FIG. 24 is a schematic diagram illustrating an arrangement change method of a ring delay line;

FIG. 41 is a circuit diagram illustrating Embodiment 16 in a similar manner as FIG. 1;

DESCRIPTION OF THE PREFERRED EMBODIMENTS

The present invention will be described in detail with reference to a plurality of embodiments, in which the same sign is attached to the same or substantially same component.

Embodiment 1

Figure 1:
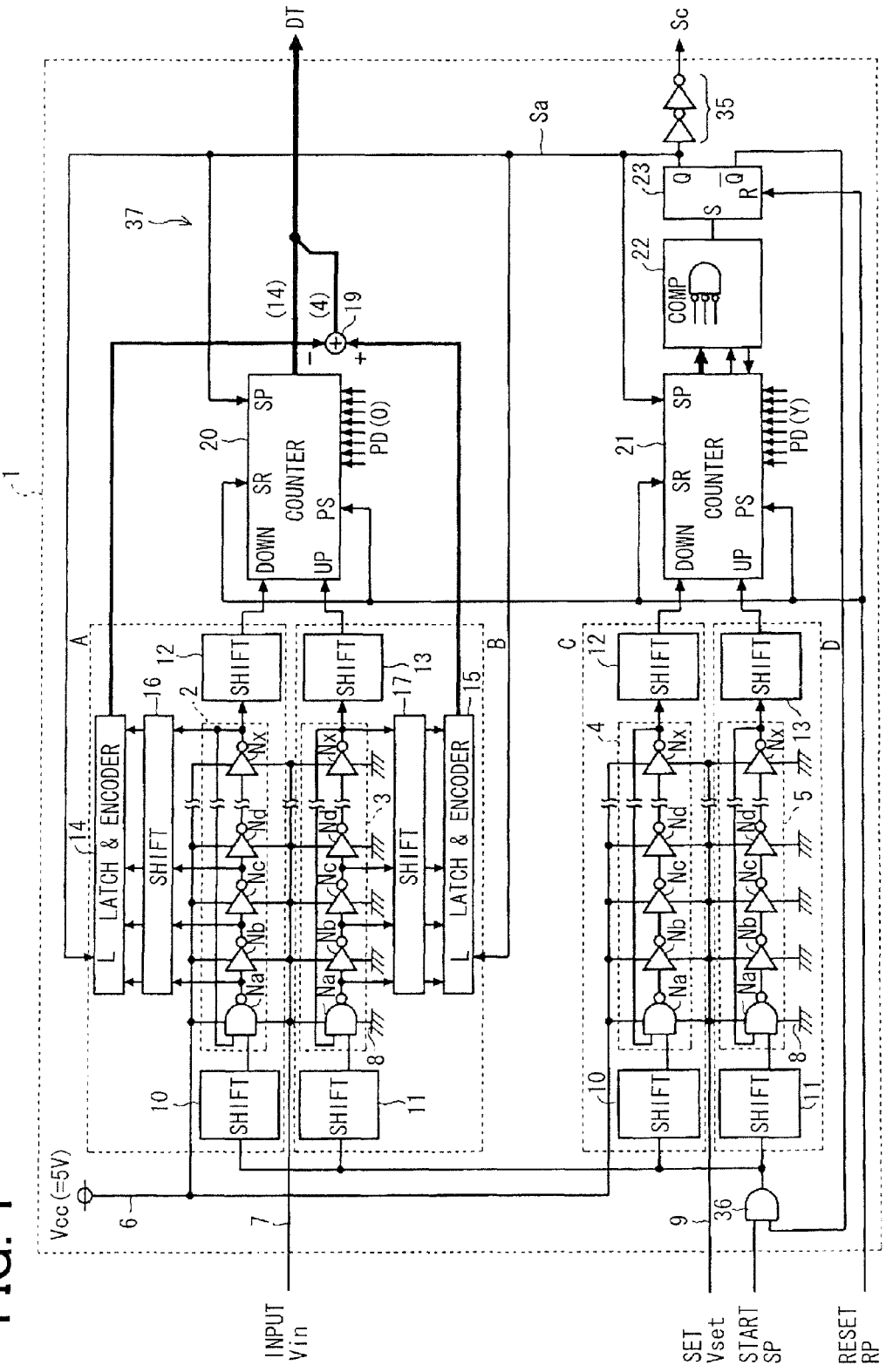
FIG. 1 illustrates a circuit diagram of an A/D converter circuit according to Embodiment 1.

Referring to FIG. 1, an A/D converter circuit 1 of a time A/D system (TAD system is formed by the use of a MOS manufacturing process in semiconductor integrated circuit devices, such as a microcomputer which is mounted for example in an electronic control unit (ECU) of a vehicle and sensor products which possess a digital communication function with the ECU. The A/D converter circuit 1 inputs an analog signal Vin outputted from a sensor etc., converts the analog input voltage Vin (voltage to be converted) into a digital value corresponding to a difference with a reference voltage Vref, and outputs the digital value as A/D conversion data DT.

The A/D converter circuit 1 includes four pulse circulation circuits, namely, a first pulse circulation circuit 2, a second pulse circulation circuit 3, a third pulse circulation circuit 4, and a fourth pulse circulation circuit 5. These pulse circulation circuits 2 to 5 are configured with plural and same number of inverter circuits (delay units) Na, Nb, - - -, Nx, which are coupled together in a ring shape and which output an input signal after a delay of a delay time defined in accordance with a power supply voltage.

Among the inverter circuits Na to Nx, the inverter circuit Na is configured with a NAND gate and the inverter circuits Nb to Nx are configured with inverters. The inverter circuits Nb to Nx included in the pulse circulation circuits 2 to 5 are formed in a thermally coupled state with each other. During a period when a start pulse SP of a high level (H level) is inputted to a non-ring side input terminal of the NAND gate, a pulse signal circulates around the inverter circuits Na to Nx at speed, which is decided by a power supply voltage.

In the four pulse circulation circuits 2 to 5, the first pulse circulation circuit 2 and the second pulse circulation circuit 3 operate in a pair, and the third pulse circulation circuit 4 and the fourth pulse circulation circuit 5 operate in a pair. The inverter circuits Na to Nx of the first pulse circulation circuit 2 are supplied with a power supply voltage (Vcc−Vin) from a specified voltage line 6 with a specified voltage Vcc (for example, 5V) and a signal input line 7, into which an analog input voltage Vin is inputted. The inverter circuits Na to Nx of the second pulse circulation circuit 3 are supplied with a power supply voltage (Vin) from the signal input line 7 and a ground line 8. Therefore, the inverter circuits Na to Nx of the first pulse circulation circuit 2 and the inverter circuits Na to Nx of the second pulse circulation circuit 3 are configured in a vertically stacked manner, respectively, with the signal input line 7 interleaved between the specified voltage line 6 and the ground line 8.

Similarly, the inverter circuits Na to Nx of the third pulse circulation circuit 4 are supplied with a power supply voltage (Vcc−Vset) from the specified voltage line 6 with the specified voltage Vcc (for example, 5V) and a set voltage line 9 into which a set voltage Vset is inputted. The inverter circuits Na to Nx of the fourth pulse circulation circuit 5 are supplied with the power supply voltage (Vset) from the set voltage line 9 and the ground line 8. Therefore, the inverter circuits Na to Nx of the third pulse circulation circuit 4 and the inverter circuits Na to Nx of the fourth pulse circulation circuit 5 are configured in a vertically stacked manner, respectively, with the set voltage line 9 interleaved between the specified voltage line 6 and the ground line 8.

In the A/D converter circuit 1, the other parts of circuits except the pulse circulation circuits 2 to 5 operate with supply of the specified voltage Vcc from the specified voltage line 6 and the ground line 8. Since the specified voltage Vcc and each of the power supply voltages of the pulse circulation circuits 2 to 5 are different, a level shift circuit is required for input and output of a signal to and from the pulse circulation circuits 2 to 5. An input level shift circuit 10 is provided at an input side (pre-stage) of the inverter circuit (NAND gate) Na of the pulse circulation circuits 2 and 4, and an input level shift circuit 11 is provided at an input side of the inverter circuit (NAND gate) Na of the pulse circulation circuits 3 and 5. An output level shift circuit 12 is provided at an output side (post-stage) of the inverter circuit Nx of the pulse circulation circuits 2 and 4, and an output level shift circuit 13 is provided at an output side of the inverter circuit Nx of the pulse circulation circuits 3 and 5.

The first pulse circulation circuit 2 and the second pulse circulation circuit 3 are respectively provided with a latch and encoder 14 and a latch and encoder 15 as the first and the second circulating position detecting circuit, in order to detect a pulse position in the pulse circulation circuit at the time of outputting a conversion data output process signal Sa to be described later. Also between the first pulse circulation circuit 2 and the latch and encoder 14 and between the second pulse circulation circuit 3 and the latch and encoder 15, output level shift circuits 16 and 17 are provided, respectively.

Figure 2:
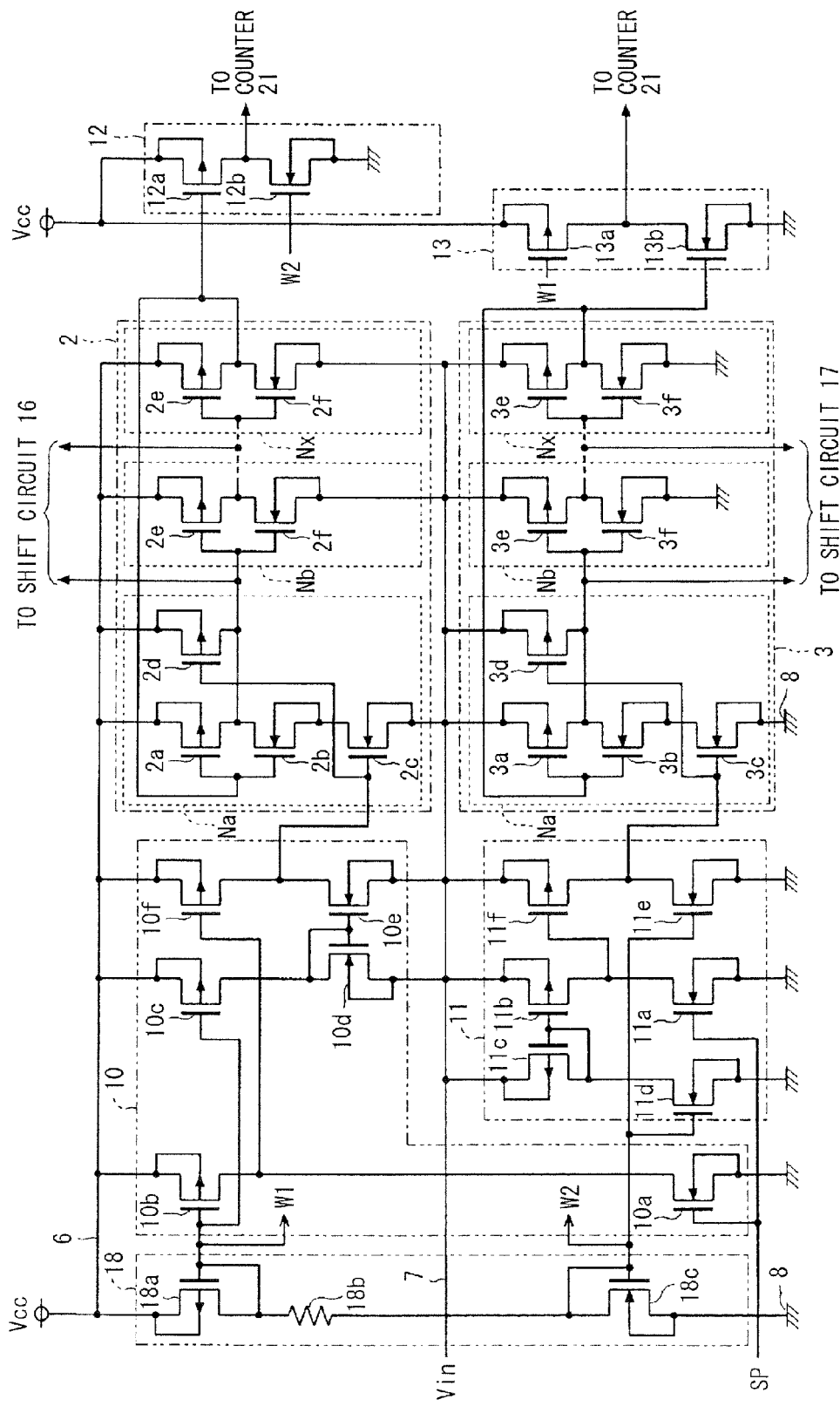
FIG. 2 illustrates a circuit diagram of a pulse circulation circuit and a level shift circuit.

FIG. 2 illustrates a detailed circuit configuration of the first pulse circulation circuit 2, the second pulse circulation circuit 3, the input level shift circuits 10 and 11, and the output level shift circuits 12 and 13. Between the specified voltage line 6 and the ground line 8, a constant current circuit 18 is provided, in which a transistor 18a, a resistor 18b, and a transistor 18c are coupled in series.

The first pulse circulation circuit 2 is formed between the specified voltage line 6 and the signal input line 7, the inverter circuit (NAND gate) Na is configured with transistors 2a to 2d, and each of the inverter circuits (inverters) Nb, - - -, Nx is configured with transistors 2e and 2f. In order to circulate a pulse, an output node of the inverter circuit (inverter) Nx located at the end is coupled to a ring-side input node of the inverter circuit (NAND gate) Na located at the top.

The second pulse circulation circuit 3 is formed between the signal input line 7 and the ground line 8, and similarly configured with transistors 3a to 3f. Since current is inputted in and outputted from the pulse circulation circuit, it is preferred to input the analog input voltage Vin and the set voltage Vset via a buffer circuit, which possesses sufficient current driving capacity.

The input level shift circuit 10 performs the level conversion of the start pulse SP of amplitude Vcc from the ground potential to a signal of amplitude (Vcc−Vin) from the signal input line 7, and supplies the converted signal to the first pulse circulation circuit 2. The input level shift circuit 10 is configured with transistors 10a to 10f. The transistors 10b and 10c form a current mirror circuit with the transistor 18a of the constant current circuit 18, and operate as a constant current driving circuit.

The input level shift circuit 11 performs the level conversion of the start pulse SP of amplitude Vcc from the ground potential to a signal of amplitude Vin, and supplies the converted signal to the second pulse circulation circuit 3. The input level shift circuit 11 is configured with transistors 11a to 11f. The transistors 11d and 11e form a current mirror circuit with the transistor 18c of the constant current circuit 18, and operate as a constant current driving circuit.

The output level shift circuit 12 performs the level conversion of a circulating pulse signal of amplitude (Vcc−Vin) from the signal input line 7 to a signal of amplitude 5V from the ground potential, and supplies the converted signal to a first counter 20 to be described later. The output level shift circuit 12 is configured with transistors 12a and 12b. The transistor 12b forms a current mirror circuit with the transistor 18c of the constant current circuit 18, and operates as a constant current driving circuit. The output level shift circuit 13 performs the level conversion of the circulating pulse signal of amplitude Vin to a signal of amplitude Vcc, and supplies the converted signal to the first counter 20 to be described later. The output level shift circuit 13 is configured with transistors 13a and 13b. The transistor 13a forms a current mirror circuit with the transistor 18a of the constant current circuit 18, and operates as a constant current driving circuit.

In the output level shift circuit 16, the same circuit as the output level shift circuit 12 is provided to each output terminal of the inverter circuits Na to Nx of the pulse circulation circuit 2. Similarly, in the output level shift circuit 17, the same circuit as the output level shift circuit 13 is provided to each output terminal of the inverter circuits Na to Nx of the pulse circulation circuit 3.

The latch and encoder 14 illustrated in FIG. 1 inputs output signals of the inverter circuits Na to Nx of the first pulse circulation circuit 2 in parallel via the output level shift circuit 16. The latch and encoder 14 detects the circulating position of a pulse signal in the first pulse circulation circuit 2 based on these output signals (encoding). That is, when a conversion data output process signal Sa of an H level is inputted to a latch instruction terminal of the latch and encoder 14, the latch and encoder 14 latches position data of the inverter circuits Na to Nx of the pulse circulation circuit 2, and outputs the position data with a bit width (for example, 4 bits) corresponding to the number thereof. The latch and encoder 15 is configured similarly. A subtractor 19 subtracts the position data outputted by the latch and encoder 14 from the position data outputted by the latch and encoder 15, and sets the subtraction value at the time when the conversion data output process signal Sa is inputted, as lower-order 4 bits of the A/D conversion data, which is indicated as (4) in FIG. 1.

In order to distinguish easily four pulse circulation circuits 2 to 5 in the following description, a circuit including the first pulse circulation circuit 2, the latch and encoder 14, and the level shift circuits 10, 12, and 16 may be referred to as a "system A"; a circuit including the second pulse circulation circuit 3, the latch and encoder 15, and the level shift circuits 11, 13, and 17 may be referred to as a "system B"; a circuit including the third pulse circulation circuit 4 and the level shift circuits 10 and 12 may be referred to as a "system C"; and a circuit including the fourth pulse circulation circuit 5 and the level shift circuits 11 and 13 may be referred to as a "system D."

The first counter 20 is an up/down-counter of the first kind which counts the circulation number of a pulse signal in the first pulse circulation circuit 2, and the circulation number of a pulse signal in the second pulse circulation circuit 3, and outputs the difference of these circulation numbers (for example, 14 bits, which is indicated as (14) in FIG. 1). An output signal of the inverter circuit Nx of the second pulse circulation circuit 3 is inputted to a count-up input terminal via the output level shift circuit 13, and an output signal of the inverter circuit Nx of the first pulse circulation circuit 2 is inputted to a count-down input terminal via the output level shift circuit 12.

A reset pulse RP of an H level to the A/D converter circuit 1 is inputted to a preset terminal P and a stop release terminal (SR), and a conversion data output process signal Sa of an H level is inputted to a stop terminal (SP). Preset data (PD) of the first counter 20 is set as all bits zero (L level). The output value of the first counter 20 at the time when the conversion data output process signal Sa is inputted is set as higher-order 14 bits of the A/D conversion data, for example.

A second counter 21 is an up/down-counter of the first kind which counts the circulation number of a pulse signal in the third pulse circulation circuit 4, and the circulation number of a pulse signal in the fourth pulse circulation circuit 5, and outputs the difference of these circulation numbers (for example, 14 bits). An output signal of the inverter circuit Nx of the fourth pulse circulation circuit 5 is inputted to a count-up input terminal via the output level shift circuit 13, and an output signal of the inverter circuit Nx of the third pulse circulation circuit 4 is inputted to a count-down input terminal via the output level shift circuit 12.

A reset pulse RP of an H level to the A/D converter circuit 1 is inputted to a preset terminal and a stop release terminal, and a conversion data output process signal Sa of an H level is inputted to a stop terminal. When the reset pulse RP is supplied to the preset terminal, a value (specified value Y) set to ROM is set as preset data.

A comparator (determination circuit) 22, which determines that all the bits of the output value of the second counter 21 become zero, is provided in the latter stage of the second counter 21. The second counter 21 notifies the comparator 22 of the fact that the count value is determined so that the comparator 22 can perform comparison after an ever-changing output value of the second counter 21 is determined.

The second counter 21 outputs a determination completion signal of an H level (that is, a comparison start signal) to the comparator 22, when the count value is determined, and resets the determination completion signal to an L level, when a comparison completion signal of an H level (that is, a determination canceling signal) is inputted from the comparator 22. When there is a possibility that an omission in determining by the comparator 22 may occur due to too fast change of the output value of the second counter 21, it will be preferable not to use the lower-order bits of the output value of the second counter 21 for determining.

Figure 3:
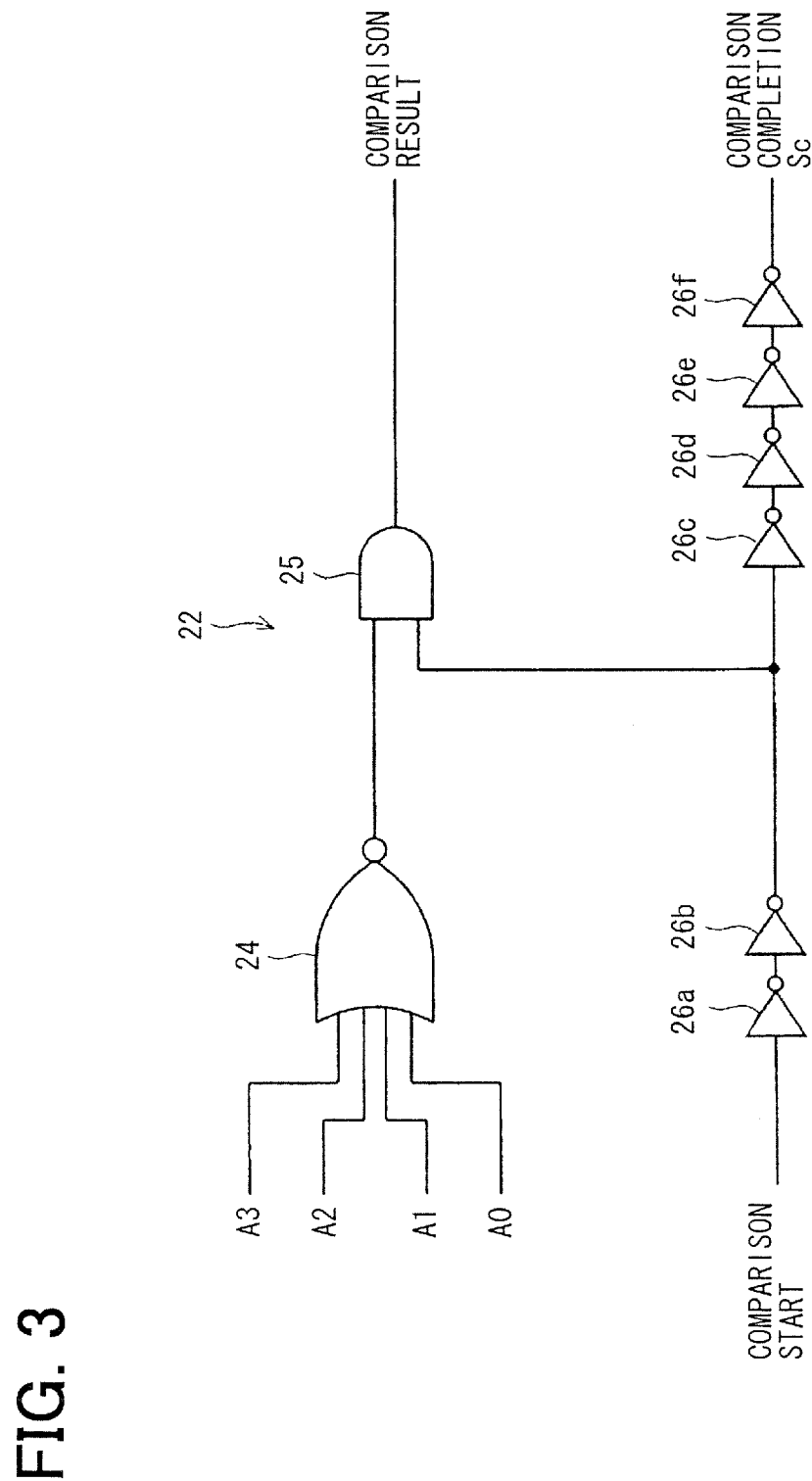
FIG. 3 illustrates a circuit diagram of a comparator.

FIG. 3 illustrates a circuit configuration of the comparator 22 in a 4-bit configuration, for example. However, the actual configuration has the number of bits equal to that of the second counter 21. The output values A3 (MSB) to A0 (LSB) of the second counter 21 is inputted to a NOR gate 24, and the output thereof is outputted to an RS flip-flop 23 (refer to FIG. 1) via an AND gate 25. The comparison start signal is inputted to one terminal of the AND gate 25 through even numbers of inverters 26a and 26b, and is outputted as the comparison completion signal through further even numbers of inverters 26c, 26d, 26e, and 26f. Here, the number of inverters is determined so that the total delay time of the inverters 26a and 26b is longer than the delay time of the NOR gate 24, and the total delay time of the inverters 26c, 26d, 26e, and 26f is longer than the delay time of the AND gate 25.

Figure 4:
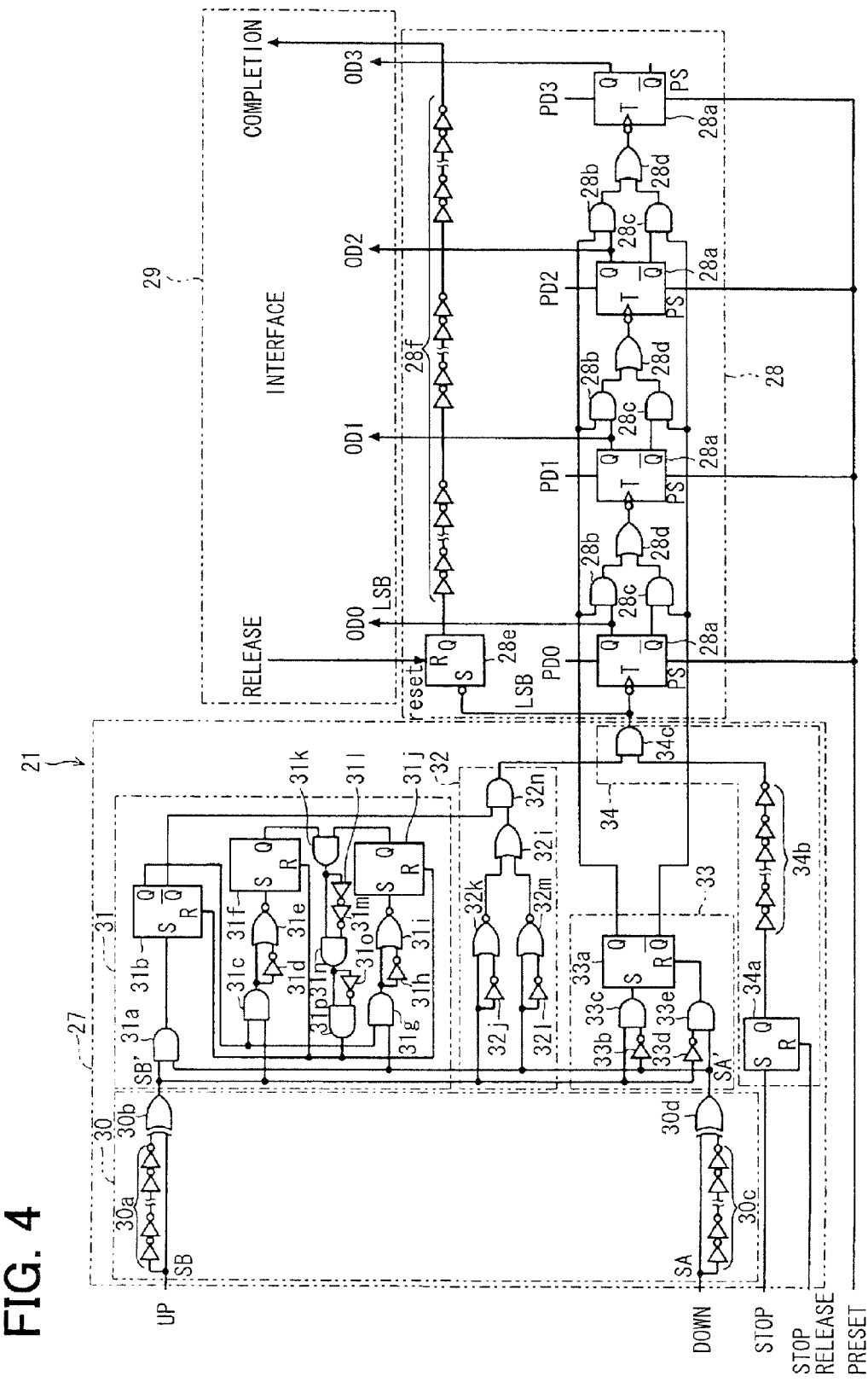
FIG. 4 illustrates a circuit diagram of an up/down-counter.
Figure 5:
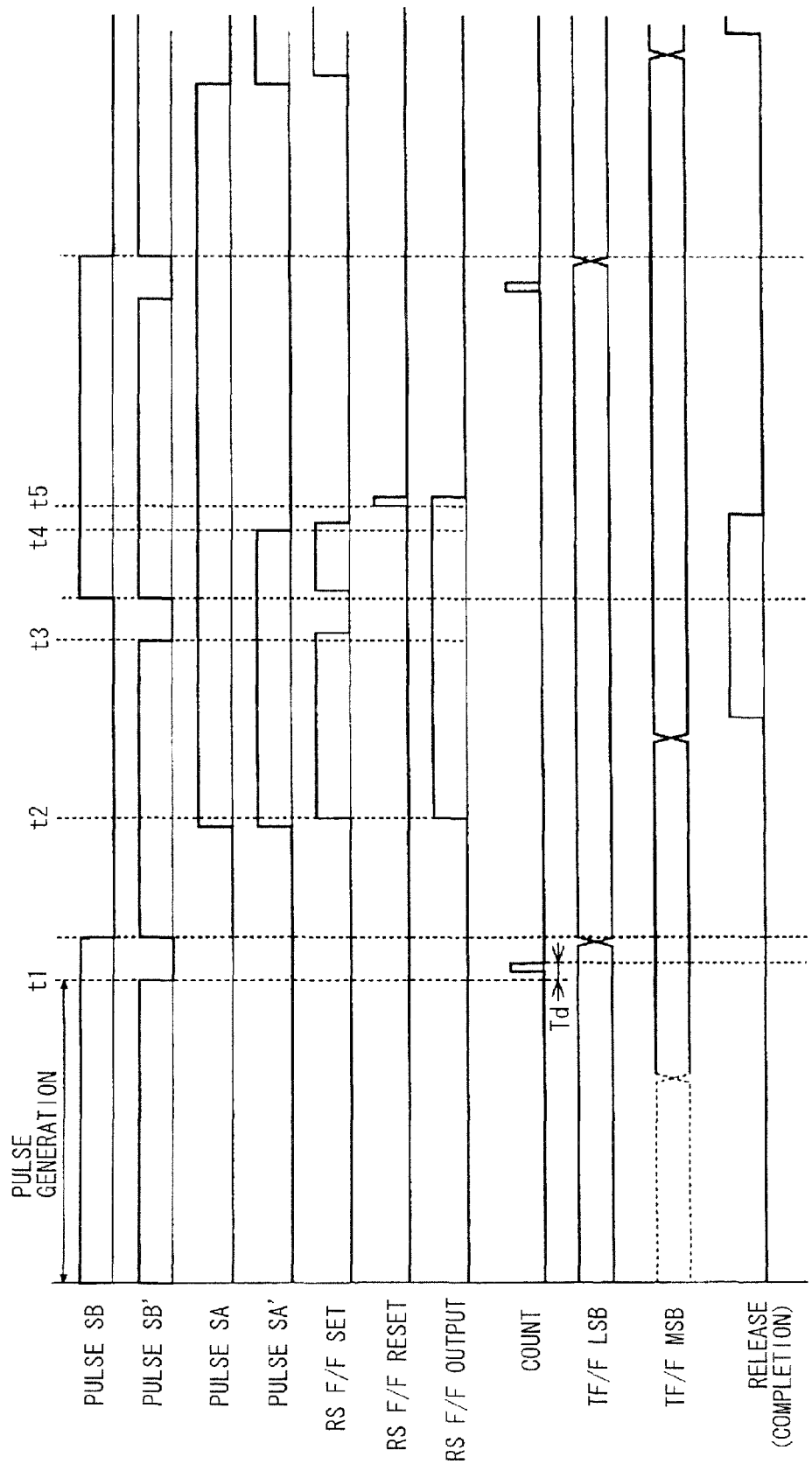
FIG. 5 illustrates a timing chart of an up/down-counter.

FIG. 4 illustrates a circuit configuration of the second counter 21, and FIG. 5 illustrates a timing chart. Here, FIG. 4 illustrates a 4-bit configuration as an example; in fact, however, more bits are used.

The second counter 21 is provided with a count-up input terminal (UP), a count-down input terminal (DOWN), a stop terminal (STOP; count-stop terminal) for stopping a count, a stop release terminal (STOP RELEASE) for releasing or canceling stoppage of a count, a preset terminal (PRESET), a preset data terminal, a determination completion signal terminal, and a determination canceling signal terminal. The first counter 20 has the same configuration as the second counter 21. However, an L level is supplied to all bits of the preset data, and the preset terminal is used as the reset terminal.

The second counter 21 is configured with an input unit 27 which generates a count signal and a mode signal for instructing the count-up and the count-down according to an inputted pulse signal, a counter unit 28 which performs the up-count or the down-count of the count signal, according to the mode signal, and an interface unit 29 which outputs the count value to the comparator 22. Preset data PD can be set to the counter unit 28 by supplying a preset signal of an H level.

The input unit 27 is configured with a pulse generating unit 30, an overlap detector 31, a count signal output unit 32, a mode setting unit 33, and a count-stop control unit 34. The pulse generating unit 30 is configured with even numbers of inverters 30a and 30c and exclusive-OR (ExOR) gates 30b and 30d. When pulse signals SB and SA are inputted to the count-up input terminal and the count-down input terminal, synchronizing with the up-edge and down-edge thereof, narrow pulse signals of an H level SB' and SA' are generated respectively.

The overlap detector 31 monitors occurrence or non-occurrence of an overlapping state, in which the pulse signal SB' as a count-up signal and the pulse signal SA' as a count-down signal are inputted concurrently. When occurrence of an overlapping state is detected, the overlap detector 31 outputs an overlap detection signal of an L level to the count signal output unit 32. The overlap detector 31 stops the output of the overlap detection signal (resets to an H level) after at least a delay time between an input and an output of the count signal output unit 32 has elapsed from a time when the two overlapping pulse signals concerned have terminated.

An AND gate 31a detects that outputs of the ExOR gates 30b and 30d have been concurrently set to an H level, namely, that the pulse signals SB' and SA' have overlapped with each other. When the pulse signals SB' and SA' overlap with each other, an RS flip-flop 31b stores occurrence of the overlapping state by changing a Q output from an L level to an H level, and changing a /Q (inverted Q) output serving as the overlap detection signal from an H level to an L level. The storage of the overlapping state is maintained even after the output of the AND gate 31a returns to an L level. After that, the RS flip-flop 31b resets the overlapping state stored, when both pulse signals SB' and SA' have once returned to an L level.

An AND gate 31c, an inverter 31d, and a NOR gate 31e make an RS flip-flop 31f set the Q output thereof to an H level, in response to the pulse signal SB' having changed to an L level at the time of detecting the overlapping state. Similarly, an AND gate 31g, an inverter 31h, and a NOR gate 31i make an RS flip-flop 31j set the Q output thereof to an H level, in response to the pulse signal SA' having changed to an L level at the time of detecting the overlapping state.

Here, a down-edge detection circuit is formed by combining odd numbers of inverters and a NOR gate, like the combination of the inverter 31d and the NOR gate 31e, or the combination of the inverter 31h and the NOR gate 31i. The combination of an inverter 32j and a NOR gate 32k and the combination of an inverters 32l and a NOR gate 32m, to be described later, are also the same.

An AND gate 31k outputs a reset request signal of an H level, when the Q outputs of the RS flip-flops 31f and 31j are both set to an H level. This reset request signal resets the RS flip-flops 31b, 31f, and 31j, via the rising delay circuit configured with even numbers of inverters 31l and 31m and an AND gate 31n and the up-edge detection circuit configured with an odd number of inverter 31o and an AND gate 31p. The delay time of the delay circuit is set longer than the delay time between an input and an output of the count signal output unit 32. When the RS flip-flop 31b is reset, the /Q output (inversion of Q output) serving as the overlap detection signal returns from an L level to an H level.

When the overlap detection signal is at an H level, the count signal output unit 32 outputs a count signal to the counter unit 28 via the count-stop control unit 34, in response to a pulse signal having been inputted to a count-up input terminal or a count-down input terminal. When the overlap detection signal is at an L level, the count signal output unit 32 stops output of a count signal to the counter unit 28.

An inverter 32j and a NOR gate 32k output a count signal of an H level, in synchronization with a down-edge of the pulse signal SB', and an inverter 32l and a NOR gate 32m output a count signal of an H level, in synchronization with a down-edge of the pulse signal SA'. These count signals are outputted via an OR gate 32i and the AND gate 32n. The AND gate 32n passes the count signal from the OR gate 32i, when the overlap detection signal is at an H level.

The mode setting unit 33 switches to the count-up mode or the count-down mode, according to which the count-up input terminal and the count-down input terminal inputs a pulse signal. When a pulse signal is inputted to the count-up input terminal, the pulse signal SB' of an H level is generated in synchronization with the up-edge and the down-edge thereof. Therefore, an RS flip-flop 33a is set via an inverter 33b and an AND gate 33c, and the mode shifts to the count-up mode. On the other hand, when a pulse signal is inputted to the count-down input terminal, the pulse signal SA' of an H level is generated in synchronization with the up-edge and the down-edge thereof. Therefore, the RS flip-flop 33a is reset via an inverter 33d and an AND gate 33e, and the mode shifts to the count down mode.

The count-stop control unit 34 stops a count operation in response to the conversion data output process signal Sa having been inputted to the stop terminal, and resumes the count operation in response to the reset pulse RP (canceling signal) having been inputted to the stop release terminal (SR). That is, when the conversion data output process signal Sa is inputted, an RS flip-flop 34a is set and an AND gate 34c becomes in a cut-off state via odd numbers of inverters 34b. When the canceling signal is inputted, the RS flip-flop 34a is reset and the AND gate 34c becomes in a through state.

The counter unit 28 is an asynchronous counter provided with T flip-flops 28a as many as the number of bits and a ripple carry circuit configured with AND gates 28b and 28c and an OR gate 28d. When a preset signal of an H level is inputted to a preset terminal of the T flip-flop 28a, preset data is set. An RS flip-flop 28e is set in synchronization with a down-edge of the count signal. Even numbers of inverters 28f have a delay time longer than time required for a ripple carry and a count operation. The output signal of the inverters 28f is the determination completion signal described above, and a signal inputted in a reset terminal of the RS flip-flop 28e is the determination canceling signal.

A timing chart illustrated in FIG. 5 expresses, beginning at the top; count-up pulse signals SB and SB', count-down pulse signals SA and SA', a set terminal input signal of the RS flip-flop 31b, a reset terminal input signal of the RS flip-flop 31b (a reset request signal after delay), a Q output signal of the RS flip-flop 31b (an inverted signal of the overlap detection signal), an output signal of the AND gate 34c (a count signal), an output of the T flip-flop 28a of the least significant bit, an output of the T flip-flop 28a of the most significant bit, and a determination canceling signal (a comparison completion signal).

Synchronizing with an up-edge and a down-edge of the pulse signals SB and SA, the pulse signals SB' and SA' are generated, respectively. Since an overlap has not occurred in the pulse signals SB' and SA' at time t1, the overlap detection signal (the inverted signal of the RS flip-flop 31b) is at an H level, and a count signal is outputted with a narrow H level followed by a down-edge after a gate propagation delay time Td of the count signal output unit 32 in response to a down-edge of the pulse signal SB'.

When an overlap occurs in the pulse signals SB' and SA' at time t2, the RS flip-flop 31b is set after a time of delay of the AND gate 31a, and the occurrence of an overlapping state is stored. When the pulse signal SB' falls at time t3, the Q output of the RS flip-flop 31f is set to an H level (detection of falling of the pulse signal SB' after storing the overlapping state).

When the pulse signal SA' falls at time t4, the Q output of the RS flip-flop 31j is set to an H level (detection of falling of the pulse signal SA' after storing the overlapping state). Since both of the count-up pulse signal SB' and the count-down pulse signal SA' have fallen at this time, a reset request signal is generated, the RS flip-flops 31b, 31f, and 31j are reset, and the overlapping state is canceled (time t5).

In order not to generate a count signal (an output signal of the AND gate 34c) accidentally in the overlapping state, the delay time from a time when both of the pulse signals SB' and SA' terminate until the overlapping state is canceled (until an overlap detection signal becomes an H level) is set up longer than at least the time Td (time equal to a delay time between the input and the output of the count signal output unit 32) as illustrated in the figure.

In the configuration according to the this embodiment, whenever the count value of the second counter 21 increases or decreases by one, the comparator 22 can determine whether all the bits are zero or not. For that purpose, the digital comparison operation by the comparator 22 should just be completed within the period when the count value increases or decreases by one. Actually, a rate-limiting factor to a series of operation of a count operation by the second counter 21 and a digital comparison operation by the comparator 22 is the operating time of the second counter 21 (mainly propagation time of the counter unit 28).

The time for pulse generation illustrated in FIG. 5 is a period from a time when the count-up pulse signal SB (or the count-down pulse signal SA) is inputted, to a time when the pulse signal SB' (or the pulse signal SA') falls. Since the second counter 21 generates and counts a count signal at the falling time of the pulse signals SB' and SA', the time for pulse generation corresponds to a latency time until the next count signal is generated during the count operation of the pulse signals SB and SA which have been inputted last time. Accordingly, it is necessary to set up the time for pulse generation longer than the operating time of the counter 21. Consequently, it is necessary to satisfy the relation that (digital comparison operation time of the comparator 22) < (counter operating time) < (time for pulse generation).

On the other hand, the output of the pulse circulation circuits 4 and 5 repeats "1" (H level) and "0" (L level) for every circulation; the second counter 21 generates a count signal both at a rising and a falling. Accordingly, it is necessary to satisfy the relation that (time for pulse generation) < (minimum time of one circulation of the pulse circulation circuit). From the above, it is necessary to satisfy the relation that (digital comparison operation time of the comparator 22) < (counter operating time) < (time for pulse generation) < (minimum time of one circulation of the pulse circulation circuit).

Referring to FIG. 1 again, when a comparison result signal of an H level indicating all bits zero is outputted from the comparator 22, the RS flip-flop 23 is set and outputs from the Q output thereof a conversion data output process signal Sa of an H level. The conversion data output process signal Sa is supplied to the stop terminal SP of the counters 20 and 21, and the latch instruction terminal of the latch and encoders 14 and 15. In addition, the conversion data output process signal Sa becomes a conversion completion signal Sc via a delay element configured with inverters 35. The /Q output of the RS flip-flop 23 is inputted to the AND gate 36. The start pulse SP has been supplied to the level shift circuits 10 and 11 via the AND gate 36. However, the output of the AND gate 36 is set to an L level in synchronization with the timing when the /Q output of the RS flip-flop 23 is set to an L level at the time of completion of the conversion; accordingly, the circulation of a pulse signal stops. When A/D conversion is performed again, once the start pulse SP is set at an L level, and the RS flip-flop 23 is reset by inputting the reset pulse RP, then the A/D conversion is resumed.

In the configuration which has been described above, the subtractor 19, the comparator 22, the RS flip-flop 23, and the AND gate 36 form a conversion control circuit 37. The conversion control circuit 37 makes the first pulse circulation circuit 2 to the fourth pulse circulation circuit 5 start a pulse circulating operation concurrently. When a difference outputted by the second counter 21 reaches a specified value Y decided in advance, the conversion control circuit 37 outputs the conversion data output process signal Sa, and outputs a difference which the first counter 20 and the latch and encoders 14 and 15 output at the time, as the A/D conversion data to the analog input voltage Vin.

Next, operation of the present embodiment is described with reference to FIG. 6 to FIG. 8.

Figure 6:
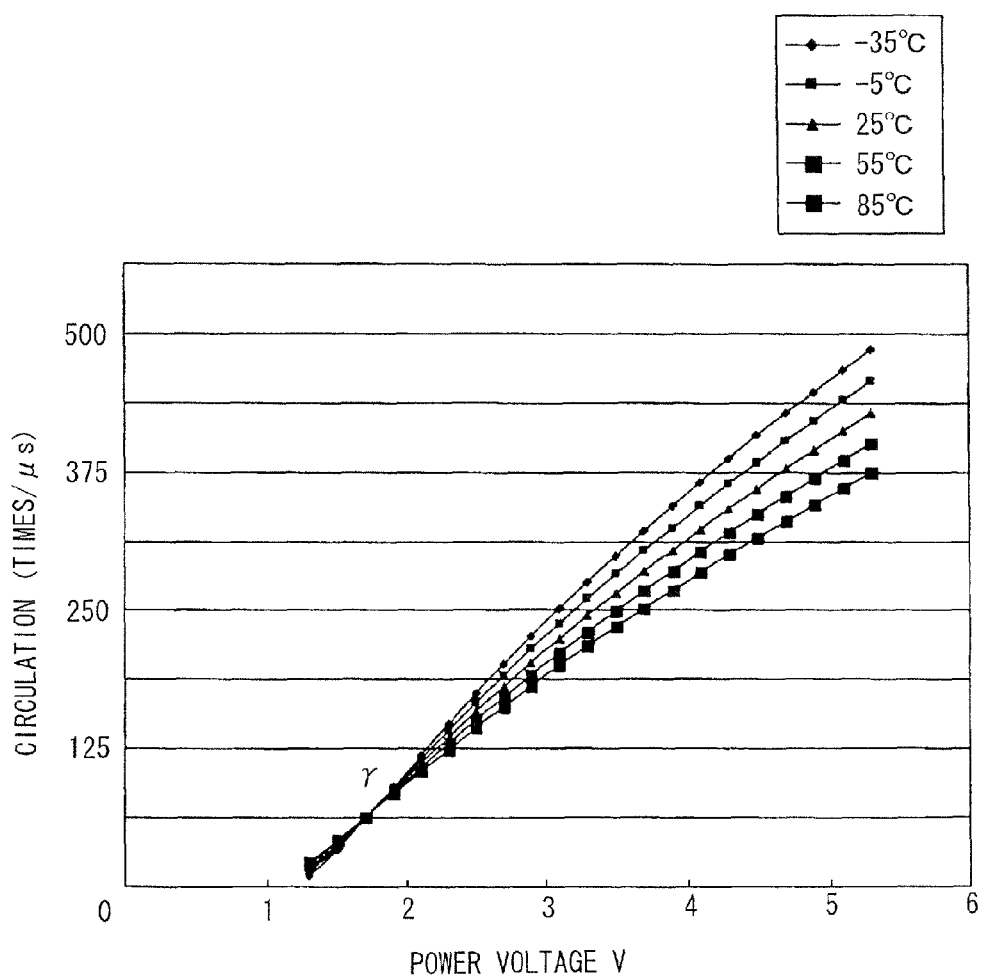
FIG. 6 is a graph illustrating an actual transfer characteristic of a pulse circulation circuit alone.

FIG. 6 illustrates an example of the individual transfer characteristic (in the case of 16 inverters) of the pulse circulation circuits 2 to 5 used in the present embodiment. Since the pulse circulation circuits 2 to 5 are coupled thermally with each other and are provided with the same numbers of the inverter circuits Na to Nx, the pulse circulation circuits 2 to 5 have a very close transfer characteristic with each other. The horizontal axis shows a power supply voltage applied, and the vertical axis shows a circulation number per unit time (times/µs). Ambient temperatures are −35° C., −5° C., 25° C., 55° C., and 85° C.

It is seen from FIG. 6 that relation between the voltage and the circulation number per unit time is not linear but possesses characteristics which can be approximated by a quadratic function, and that as the ambient temperature is low, a delay of the inverter circuits Na to Nx becomes small, and the circulation number per unit time increases. In the neighborhood of the power supply voltage of 1.8V, the characteristic lines of each temperature cross at one point. This point is the point γ, at which the difference of temperature characteristics becomes zero as described in patent document 2. The numerical examples depend on a semiconductor process and an element layout.

Figure 7:
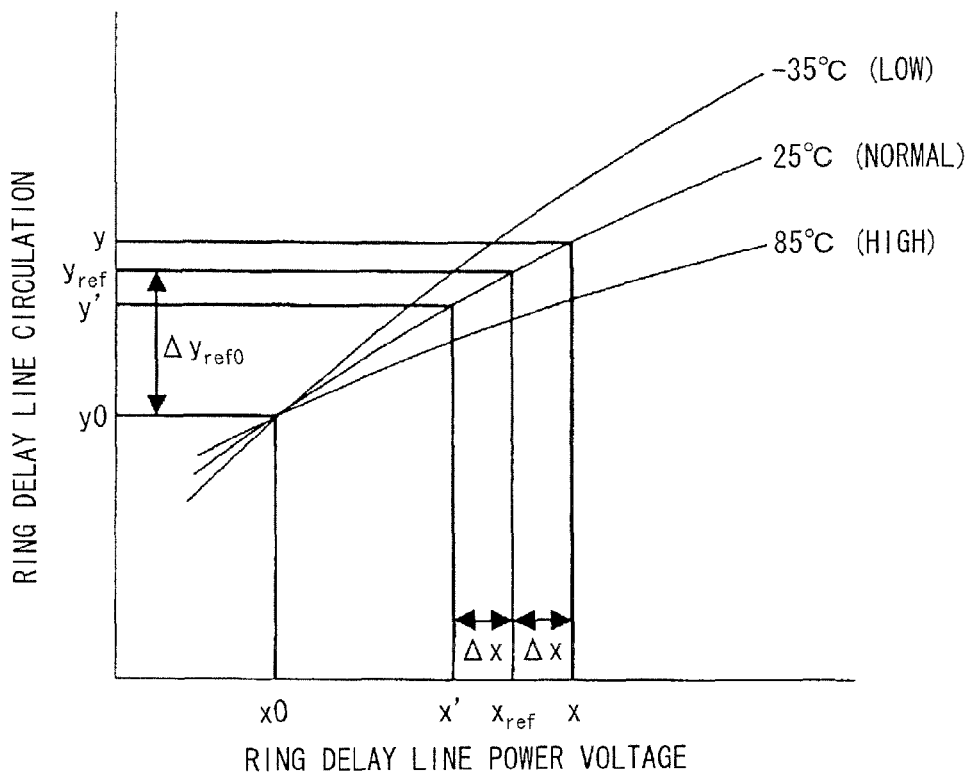
FIG. 7 is a graph illustrating a transfer characteristic of a pulse circulation circuit alone.

FIG. 7 is a graph for deviation of A/D conversion data to be described in the following and illustrates the individual transfer characteristic of the pulse circulation circuits of the system A to the system D, as is the case with FIG. 6. The horizontal axis shows a power supply voltage applied to the pulse circulation circuit, and the vertical axis shows a circulation number per unit time. The ambient temperatures of −35° C. (low temperature), 25° C. (normal temperature), and 85° C. (high temperature) are illustrated. Since it is an explanatory graph, each characteristic line is drawn with a little exaggeration. The point (x0, y0) shown in the figure is the point γ.

According to the configuration of the A/D converter circuit 1 illustrated in FIG. 1, a power supply voltage x (=the set voltage Vset) is applied to the pulse circulation circuit 5 of the system D, and a power supply voltage x' (=Vcc−Vset) is applied to the pulse circulation circuit 4 of the system C. Consequently, Equation (1) and Equation (2) hold always to the reference voltage xref. Δx is a difference voltage of the set voltage Vset and the reference voltage xref in the system C and the system D.

$$x = xref + \Delta x \quad (1)$$

$$x' = xref - \Delta x \quad (2)$$

That is, when the power supply voltage of the fourth pulse circulation circuit 5 of the system D increases by Δx, the power supply voltage of the third pulse circulation circuit 4 of the system C decreases by Δx. When the power supply voltages to the pulse circulation circuits 4 and 5 of the system C and the system D become equal, the power supply voltage is given by the reference voltage xref. The reference voltage xref has a voltage value ½ times as many as the specified voltage Vcc, and the power supply voltage x (=the set voltage Vset) is set up differently from the reference voltage xref as described later.

The characteristics of the pulse circulation circuit of the system A to the system D can be approximated by a quadratic function expressed by Equation (3) and Equation (4) centering on an arbitrary reference voltage xref. y and y' are a circulation number per unit time when the power supply voltage x and x' are applied to the pulse circulation circuits 5 and 4 of the system D and the system C, respectively.

$$y = A \cdot (\Delta x)^2 + B \cdot (\Delta x) + yref \quad (3)$$

$$y' = A \cdot (-\Delta x)^2 + B \cdot (-\Delta x) + yref \quad (4)$$

Here, a coefficient A is a second-order coefficient to Δx and a coefficient B is a first-order coefficient to ΔX and they are expressed as Equation (5) and Equation (6), respectively. α2 and β2 are second-order coefficients to temperature t° C., and α1 and β1 are first-order coefficients to temperature t° C. Third-order and higher-order terms are assumed to be negligibly small. "a" and "b" are the coefficients to Δx at 25° C. In the present case, the reference temperature is set to 25° C., however, it can be changed to any reference temperature.

$$A = a \cdot (1 + \alpha 1 \cdot (t-25) + \alpha 2 \cdot (t-25)^2) \quad (5)$$

$$B = a \cdot (1 + \beta 1 \cdot (t-25) + \beta 2 \cdot (t-25)^2) \quad (6)$$

As shown in FIG. 7, Equation (7) holds true.

$$yref = \Delta yref0 + y0 \quad (7)$$

From Equation (3) and Equation (4), Equation (8) holds true.

$$y - y' = 2 \cdot B \cdot \Delta x \quad (8)$$

According to Equation (8), the term of the second-order coefficient A which is a nonlinear component to the voltage change Δx has disappeared from y−y' which is the difference of circulation number per unit time of the system D and the system C. This fact means that an excellent linearity is ensured. Furthermore, y−y' becomes irrelevant also to the circulation number y0 at the point γ. Since the pulse circulation circuit 2 of the system A and the pulse circulation circuit 3 of the system B have the same configuration as the system C and the system D, the linearity of the A/D conversion data becomes excellent similarly.

Time TAD (A/D conversion time) when the difference of circulation numbers of the pulse circulation circuits 4 and 5 of the system C and the system D becomes Y can be expressed by Equation (9).

$$TAD = Y/(y-y') = Y/(2 \cdot B \cdot \Delta x) \quad (9)$$

On the other hand, also in the system A and the system B, when the power supply voltage of the pulse circulation circuit 3 of the system B increases by ΔxAB, the power supply voltage of the pulse circulation circuit 2 of the system A decreases by ΔxAB. When the power supply voltages to the pulse circulation circuits 2 and 4 of the system A and the system B become equal, the power supply voltage is given by the reference voltage xref. Therefore, as is the case with the system C and the system D, Equation (8) holds true except that the analog input voltage Vin is used in lieu of the set voltage Vset.

When the pulse circulation circuits 2 to 5 of the systems A to D are made to start a pulse circulating operation concurrently, the difference of circulation number YAB of the pulse circulation circuits 2 and 3 of the systems A and B at the time after the time TAD has elapsed can be expressed by Equation (10). ΔxAB is a difference voltage Vin−xref of the analog input voltage Vin and the reference voltage xref in the systems A and B.

$$YAB = 2 \cdot B \cdot \Delta xAB \cdot TAD = (\Delta xAB/\Delta x) \cdot Y \quad (10)$$

Figure 9:
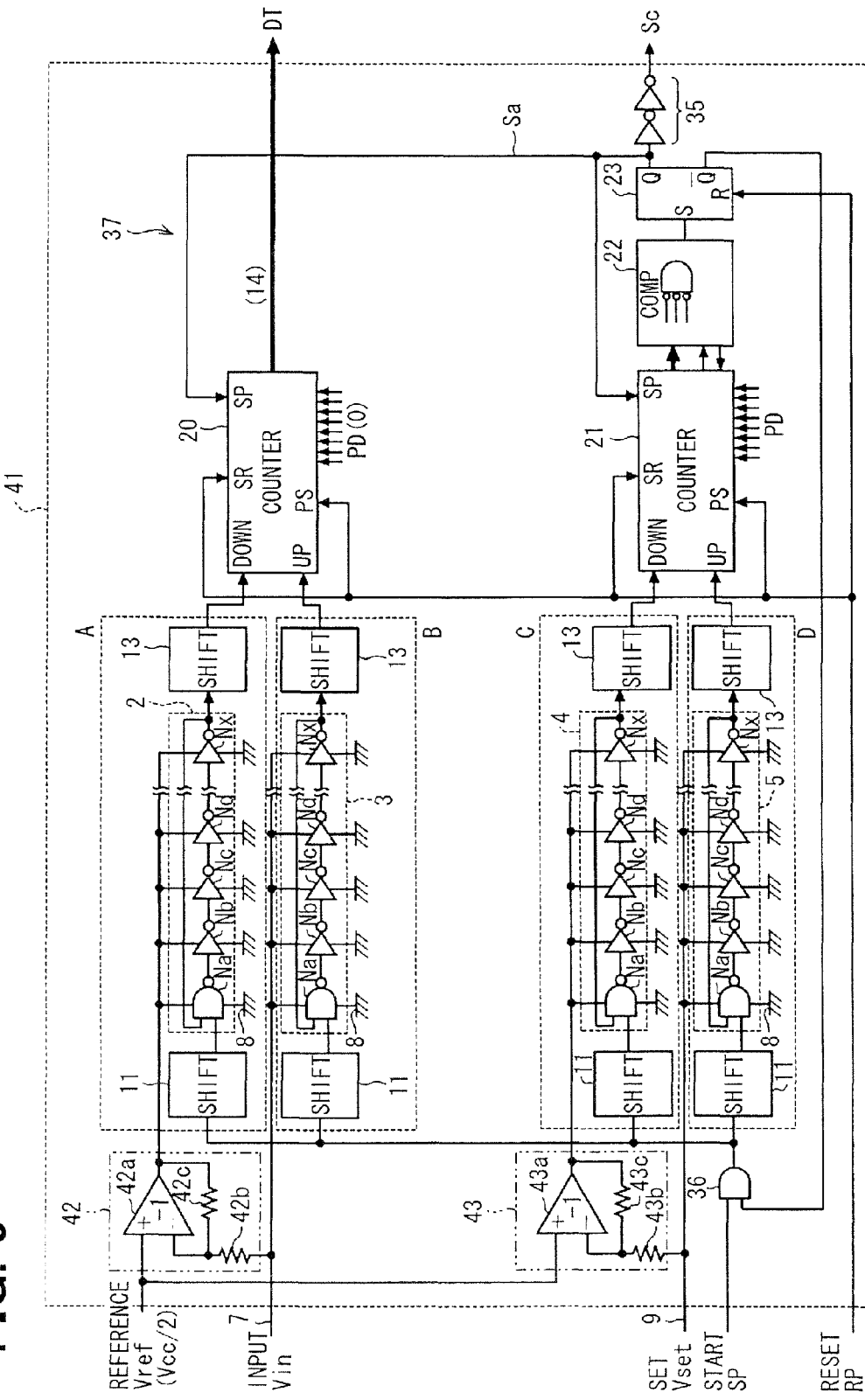
FIG. 9 is a circuit diagram illustrating Embodiment 2 in a similar manner as FIG. 1.
Figure 41:
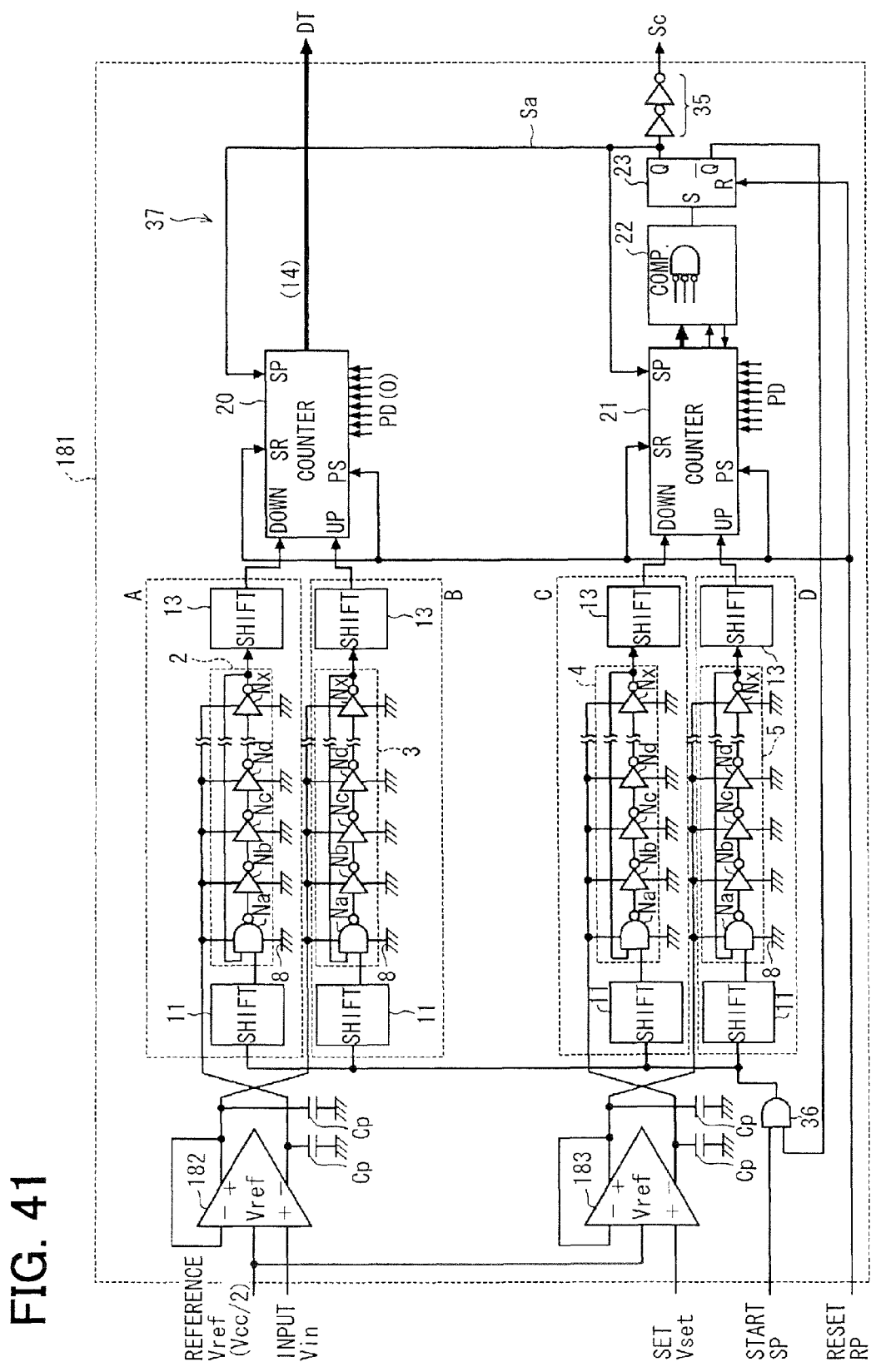

This difference of circulation number YAB itself serves as the A/D conversion data of the analog input voltage Vin seen from the reference voltage xref. As clearly seen from Equation (10), Δx cannot be set to 0 (x=xref). That is, the set voltage Vset (=x) is set up so that the power supply voltage of the system C may differ from the power supply voltage of the system D. In the configuration illustrated in FIG. 1, since the reference voltage xref has a voltage value ½ times as many as the specified voltage Vcc, it is necessary to set the set voltage Vset as a different value from Vcc/2. In a configuration, in which an amplifier circuit is arranged in a preceding stage as illustrated in FIG. 9 and FIG. 41, it is not necessary to set the reference voltage xref as a voltage value ½ times as many as the specified voltage Vcc.

ΔxAB can take both a positive value and a negative value according to the analog input voltage Vin. When the analog input voltage Vin is equal to the reference voltage xref, ΔxAB=0, therefore, the A/D conversion data YAB=0. When the analog input voltage Vin is equal to the set voltage Vset, ΔxAB=Δx, therefore, the A/D conversion data YAB=Y, and when the analog input voltage Vin is equal to −Vset, ΔxAB=−Δx, therefore, the A/D conversion data YAB=−Y.

Since the voltage Δx is converted into the difference of circulation number Y (specified value) in this way, it is necessary to associate the voltage Δx and the specified value Y in setting, according to a required resolution of the A/D conversion data. For example, when a resolution of 12 bits (=$2^{12}$) is assumed to 100 mV, it is set such that Δx=100 mV and Y=4095. In the case of an analog input voltage Vin which has amplitude of 100 mV centering on the reference voltage Vref, 13-bit A/D conversion data is produced as follows. In the present embodiment, since the latch and encoders 14 and 15 detect the circulating position of a pulse signal within the pulse circulation circuits 2 and 3, a still higher resolution will be produced.

A/D conversion value for Vin=2.6V=0 1111 1111 1111 (+4095)

A/D conversion value for Vin=2.5V=0 0000 0000 0000 (0)

A/D conversion value for Vin=2.4V=1 0000 0000 0001 (−4095)

As a larger value is set up as the specified value Y, the A/D conversion time increases more, however, a higher resolution is produced. A/D conversion data to a mean value of the analog input voltage Vin during the conversion is produced. The pulse circulation circuits 2 to 5 has the configuration in which the P-channel MOS transistor 2e and the N-channel MOS transistor 2f are coupled in series, as illustrated in FIG. 2; accordingly, the analog input voltage Vin which can undergo A/D conversion is influenced by a threshold voltage Vth of the MOS transistors 2e and 2f. Therefore, the analog input voltage Vin which can undergo A/D conversion is roughly given by a voltage ranging from a voltage higher than the ground potential (GND) by Vth to a voltage lower than Vcc by Vth. It is desirable to determine the voltage range to be used according to a required accuracy, based on data of temperature characteristics, nonlinearity, etc. Centering on the reference voltage xref and closer to the reference voltage xref, the temperature characteristics and the nonlinearity become small.

Equation (10) is an expression in which the coefficients A and B which have temperature characteristics are removed; accordingly it indicates that there is no temperature characteristic in the produced A/D conversion data YAB. That is, it means that A/D conversion data without temperature dependence can be produced, by detecting a time when the difference of circulation number per unit time y−y' of the systems C and D becomes equal to the specified value Y, and producing the difference of circulation number YAB of the systems A and B at that time. The A/D converter circuit 1 can remove the temperature dependence of TAD, without performing a digital operation. Accordingly, it becomes unnecessary to perform processing after the A/D conversion. Therefore, it is possible to reduce conversion time required, and it becomes advantageous when utilizing for a sensor equipment or the like which need a high speed response.

It is not necessary to measure at a factory etc., the point γ, at which the difference of temperature characteristics of a pulse circulation circuit becomes zero. Accordingly, it is possible to greatly reduce time and effort in an inspection process after manufacture. The point γ has a different value for every semiconductor manufacturing process, however, it is not necessary to examine this point of view when changing a semiconductor manufacturing process. This is another merit that the present invention possesses.

Next, a sequence of detailed A/D conversion is described. At first, a reset pulse RP is supplied and the first counter 20 and the RS flip-flop 23 are reset. At the same time, the specified value Y is preset to the second counter 21. Since a count value of the second counter 21 increases when the set voltage Vset to be used is higher than the specified voltage Vcc/2, a two's complement (complement of 2) of the specified value Y is preset to the second counter 21. Since a count value of the second counter 21 decreases when the set voltage Vset is lower than the specified voltage Vcc/2, on the contrary, the specified value Y is preset to the second counter 21.

Describing in the following embodiments that the second counter counts a specified value Y (or Y/4) shall include both of a case where a two's complement of the specified value Y is preset and a case where the specified value Y is preset, except for a clearly unsuitable case on an operation.

After that, a start pulse SP which holds an H level at least during the A/D conversion period is supplied. Since the /Q output of the RS flip-flop 23 is at an H level by the reset, the pulse circulation circuits 2 to 5 of the systems A to D start a pulse circulating operation concurrently in response to the input of the start pulse SP. In the systems A and B, the first counter 20 performs up-count whenever a pulse of the pulse circulation circuit 3 of the system B makes one circulation, and performs down-count whenever a pulse of the pulse circulation circuit 2 of the system A makes one circulation.

On the other hand, in the systems C and D, the second counter 21 performs up-count whenever a pulse of the pulse circulation circuit 5 of the system D makes one circulation, and performs down-count whenever a pulse of the pulse circulation circuit 4 of the system C makes one circulation. When the count value is determined, the second counter 21 outputs a determination completion signal to the comparator 22, via the interface unit 29 provided internally (refer to FIG. 4). The comparator 22 determines whether the output values of the second counter 21 are all bits zero or not. When the determination is completed, the comparator 22 outputs a comparison completion signal (a determination canceling signal) to the second counter 21. When the second counter 21 counts from an initial preset state up to the specified value Y and all bits becomes zero, the RS flip-flop 23 is set and the conversion data output process signal Sa of an H level is outputted. The conversion data output process signal Sa serves as the conversion completion signal to an external circuit.

When the conversion data output process signal Sa is set to an H level, the AND gate 36 is closed and the pulse circulation circuits 2 to 5 stop a pulse circulating operation. At the same time, the first counter 20 of the systems A and B stops, and outputs a 14-bit-width difference which is produced by subtracting the circulation number of a pulse signal in the first pulse circulation circuit 2 from the circulation number of a pulse signal in the second pulse circulation circuit 3. The latch and encoders 14 and 15 latch and output the position data indicating a position of a pulse signal in the pulse circulation circuits 2 and 3, respectively. The subtractor 19 subtracts the position data outputted by the latch and encoder 14 from the position data outputted by the latch and encoder 15, and outputs the resultant data in a 4-bit width. When a carry (positive value) or a borrow (negative value) occurs in the present subtraction, they are carried over to the higher-order 14 bits. The 18-bit data produced by summing the higher-order 14 bits and the lower-order 4 bits becomes the A/D conversion data DT.

Figure 8:
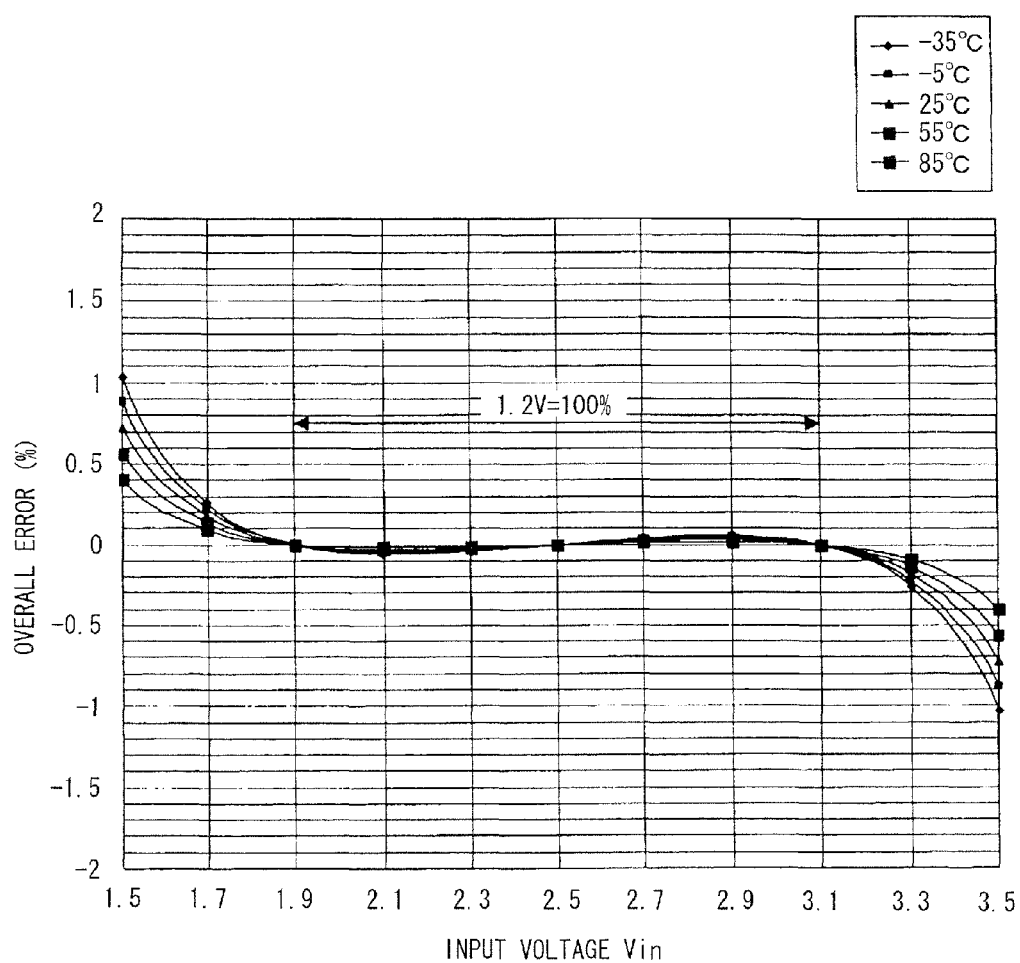
FIG. 8 is a graph illustrating an overall error of an A/D converter circuit.

FIG. 8 is a graph illustrating overall errors including the nonlinearity of the A/D converter circuit 1. The horizontal axis shows an analog input voltage Vin, and the vertical axis shows an overall error (%). In FIG. 8, a pulse circulation circuit possessing the characteristics illustrated in FIG. 6 is applied to all the systems A to D, with the ambient temperature of −35° C., −5° C., 25° C., 55° C., and 85° C. Setting the reference voltage xref to 2.5V and Δx to 0.6V (the set voltage is 3.1V), and assuming that the overall error is zero at Vin=2.5V and 3.1V, the two points are connected by a straight line. The graph indicates an error to the straight line. It is assumed that a range of 1.2V (=2·Δx) of Vin=1.9V to 3.1V (2.5±0.6V) corresponds to 100% of a voltage range of the analog input voltage Vin.

In the input voltage range of 1.2V centering on the central value 2.5V of the specified voltage Vcc which is the power supply voltage for operation of the A/D converter circuit 1, very excellent linearity is ensured between the analog input voltage Vin and the A/D conversion data DT. It is clearly seen from the graph that, even if a temperature change as wide as −35 to +85° C. occurs, the overall error is very small, and that a high linearity is maintained irrespective of the temperature change.

When Δx is set small, linearity within the range of xref±Δx increases, but resolution of the conversion time becomes low relatively. An overall error gets worse outside the voltage range of xref±Δx. This is considered, as one factor, due to the fact that the relation between the power supply voltage of the pulse circulation circuit and the circulation number per unit time deviates from a quadratic function. Therefore, it is preferred to set up the voltage range of xref±Δx equal to or a little wider than the voltage range of the analog input voltage Vin.

According to the present preference, in the case of the reference voltage xref of 2.5V, if the voltage range of the analog input voltage Vin is 1.9V to 3.1V, Δx may be set up a little larger than 0.6V, and if the voltage range of the analog input voltage Vin is 1.9V to 3.5V, or 1.5V to 3.1V, Δx may be set up a little larger than 1.0V. Δx may be a negative value. For example, the set voltage Vset may be set to 1.9V (Δx=−0.6V) instead of setting to 3.1V (Δx=0.6V).

As described above, the A/D converter circuit 1 according to the present embodiment comprises the first pulse circulation circuit 2 and the second pulse circulation circuit 3, respectively configured in a vertically stacked manner, with the signal input line 7 (Vin) interleaved between the specified voltage line 6 (Vcc) and the ground line 8 (0V); the third pulse circulation circuit 4 and the fourth pulse circulation circuit 5, respectively configured in a vertically stacked manner, with the set voltage line 9 (Vset) interleaved between the specified voltage line 6 (Vcc) and the ground line 8 (0V); the first counter 20 which counts a difference of the circulation numbers of the first pulse circulation circuit 2 and the second pulse circulation circuit 3; and the second counter 21 which counts a difference of the circulation numbers of the third pulse circulation circuit 4 and the fourth pulse circulation circuit 5.

In the configuration, after supplying a start pulse SP to the pulse circulation circuits 2 to 5 all at once, the count value of the first counter 20 (the difference of the number of pulse circulation) and the difference of the pulse positions of the latch and encoders 14 and 15 are produced at a time when the second counter 21 has counted up to the specified value Y. The count value of the first counter 20 and the difference of the pulse positions are outputted as higher-order bits and lower-order bits of data, respectively. This data becomes the A/D conversion data of the analog input voltage Vin seen from the reference voltage Vref.

The present A/D converter circuit 1 possesses a very excellent linearity at least in a voltage range of the reference voltage xref±Δx (xref=Vcc/2, Δx=Vset−xref), and possesses a high conversion accuracy, maintaining the excellent linearity irrespective of a wide temperature change. When the specified voltage Vcc is used for the power supply voltage for operation of a sensor, etc., A/D conversion data of high accuracy is produced in a voltage range of ±Δx centering on the reference voltage Vref (Vcc/2) which is the central value of the specified voltage. Accordingly, unlike the A/D converter circuit in the past in which the temperature compensation range is limited to the high voltage side or the low voltage side, the present A/D converter circuit 1 can be suitably applied to A/D conversion of the sensor signal, etc. Since the point γ, at which the difference of temperature characteristics of the pulse circulation circuit becomes zero, is not utilized, measurement of the point γ in a factory or other places becomes unnecessary.

The systems A and B are provided with the latch and encoders 14 and 15 which detect movement amount less than one circulation of a pulse signal circulating the first pulse circulation circuit 2 and the second pulse circulation circuit 3, as a position data. The detected position data is used as lower-order bits of the A/D conversion data. Accordingly, a still higher resolution is produced corresponding to the number of inverter circuits which form the pulse circulation circuits 2 and 3. It is only necessary to provide the latch and encoders 14 and 15 if needed.

The A/D converter circuit 1 according to the present embodiment offsets the temperature characteristics through the use of the fact that the four pulse circulation circuits 2 to 5 exhibit the same characteristics. Accordingly, it is desirable to design element layout of a semiconductor integrated circuit device with due considerations to the following point of view.

(1) Four pulse circulation circuits 2 to 5 are arranged closely with each other over the same semiconductor chip. Accordingly, the temperature of the inverter circuits Na to Nx becomes almost equal, and the temperature characteristics can be offset.

(2) Four pulse circulation circuits 2 to 5 are arranged with an identical shape and an identical size. Accordingly, the characteristics of the inverter circuits Na to Nx become equal, and the temperature characteristics can be offset favorably.

(3) Four pulse circulation circuits 2 to 5 are arranged in the same direction. Accordingly, quality in the semiconductor process becomes the same, and the temperature characteristics can be offset favorably.

(4) Size of four pulse circulation circuits 2 to 5 are enlarged as much as possible. Accordingly, a size variation in the semiconductor process becomes small relatively, and the temperature characteristics can be offset favorably.

(5) Peripheral circuits, such as the first counter 20, the second counter 21, and the comparator 22, are arranged closely to the pulse circulation circuits 2 to 5 over the same chip. Accordingly, parasitic capacitance accompanying wiring can be reduced and malfunction due to signal delay can be avoided.

Embodiment 2

FIG. 9 illustrates Embodiment 2, in which a configuration of applying the power supply voltage to the first pulse circulation circuit 2 and the third pulse circulation circuit 4 is changed from Embodiment 1. The latch and encoders 14 and 15 are not provided although they may be provided. An A/D converter circuit 41 is useful to a configuration in which there is no alternative other than to couple a back gate of an N-channel MOS transistor, which forms the pulse circulation circuits 2 and 4, the input level shift circuit 10, etc., to the substrate potential (ground).

A first amplifier circuit 42 is an inverting amplification circuit which is configured with an operational amplifier 42a and resistors 42b and 42c. The first amplifier circuit 42 inputs the analog input voltage Vin and the reference voltage Vref, and outputs a voltage expressed by Equation (11). Unlike Embodiment 1, the inverter circuits Na to Nx of the first pulse circulation circuit 2 are supplied with a voltage from an output line of the first amplifier circuit 42, and the ground line 8.

Output voltage of first amplifier circuit 42=$V$ref−
($V$in−$V$ref)     (11)

A second amplifier circuit 43 is configured with an operational amplifier 43a and resistors 43b and 43c. The second amplifier circuit 43 inputs the set voltage Vset and the reference voltage Vref, and outputs a voltage expressed by Equation (12). Unlike Embodiment 1, the inverter circuits Na to Nx of the third pulse circulation circuit 4 is supplied with a voltage from an output line of the second amplifier circuit 43, and the ground line 8.

Output voltage of second amplifier circuit 43=$V$ref−
($V$set−$V$ref)     (12)

A configuration of coupling in the second pulse circulation circuit 3 and the fourth pulse circulation circuit 5 is the same as that of Embodiment 1. By the above configuration, all of sources and back gates of N-channel MOS transistors located in the low potential side of the pulse circulation circuits 2 to 5 are coupled to the ground potential. The input level shift circuit 11 is provided at the input side of the inverter circuit (NAND gate) Na of the pulse circulation circuits 2 to 5, and the output level shift circuit 13 is provided at the output side of the inverter circuit Nx of the pulse circulation circuits 2 to 5.

According to the present configuration, as is the case with Embodiment 1, the following relation holds: that is, when the power supply voltage of the pulse circulation circuit 3 of the system B increases by ΔxAB, the power supply voltage of the pulse circulation circuit 2 of the system A decreases by ΔxAB, and when the power supply voltage of the pulse circulation circuit 5 of the system D increases by Δx, the power supply voltage of the pulse circulation circuit 4 of the system C decreases by Δx. Therefore, the A/D conversion data DT is produced according to Equation (10), as is the case with Embodiment 1, and the same operation effect as in Embodiment 1 is produced.

In a MOS transistor, a potential difference with the back gate influences characteristics due to a substrate bias effect. In Embodiment 1, each terminal of the transistors which form the first pulse circulation circuit 2 and the third pulse circulation circuit 4 departs from the ground potential, and each terminal of the transistors which form the second pulse circulation circuit 3 and the fourth pulse circulation circuit 5 is close to the ground potential. Therefore, when there is no alternative other than to couple the back gate to the substrate potential (ground), a characteristic difference is readily produced between both transistors that make a pair. As compared with this, in the present embodiment, since all terminals of transistors which form the first pulse circulation circuit 2 to the fourth pulse circulation circuit 5 are close to the ground potential, a characteristic difference is rarely produced between both transistors. Accordingly, the A/D conversion data of further higher accuracy is produced.

In Embodiment 1, the first pulse circulation circuit 2 and the second pulse circulation circuit 3 are configured in a vertically stacked manner, respectively, with the signal input line 7 interleaved between the specified voltage line 6 and the ground line 8, and the third pulse circulation circuit 4 and the fourth pulse circulation circuit 5 are configured in a vertically stacked manner, respectively, with the set voltage line 9 interleaved between the specified voltage line 6 and the ground line 8. Therefore, the reference voltage xref becomes Vcc/2 inevitably. As compared with this, in the present embodiment, there are no such restrictions. Therefore, the reference voltage xref is not restricted to Vcc/2, but should just be a voltage with which the characteristics of the pulse circulation circuits 2 to 5 can be approximated by a quadratic function.

Embodiment 3

Figure 10:
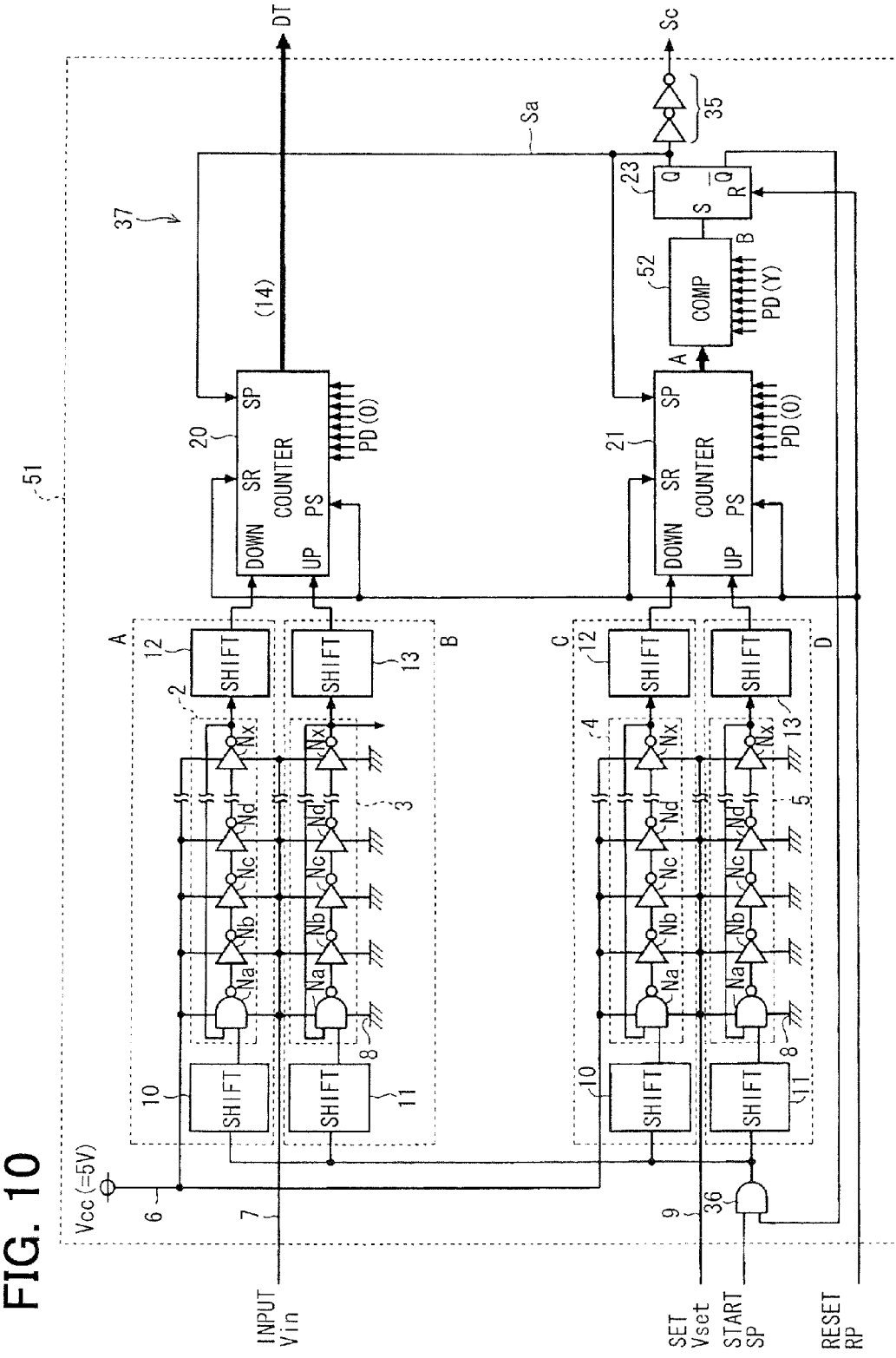
FIG. 10 is a circuit diagram illustrating Embodiment 3 in a similar manner as FIG. 1.

FIG. 10 illustrates Embodiment 3 in which a configuration of a comparator is changed compared with Embodiment 1. The latch and encoders 14 and 15 are not provided (they may be provided). An A/D converter circuit 51 includes a comparator 52, which compares a difference A outputted by the second counter 21 with a comparison reference value B which is the preset value. The preset data of the second counter 21 is set as all bits zero (L level), and when a reset pulse RP is inputted, all the bits of the count value are reset to zero. Before supplying a start pulse SP to the first pulse circulation circuit 2 to the fourth pulse circulation circuit 5, a specified value Y is supplied as the comparison reference value to the comparator 52. When an output of the comparator 52 is reversed, a conversion data output process signal Sa is outputted.

Figure 11:
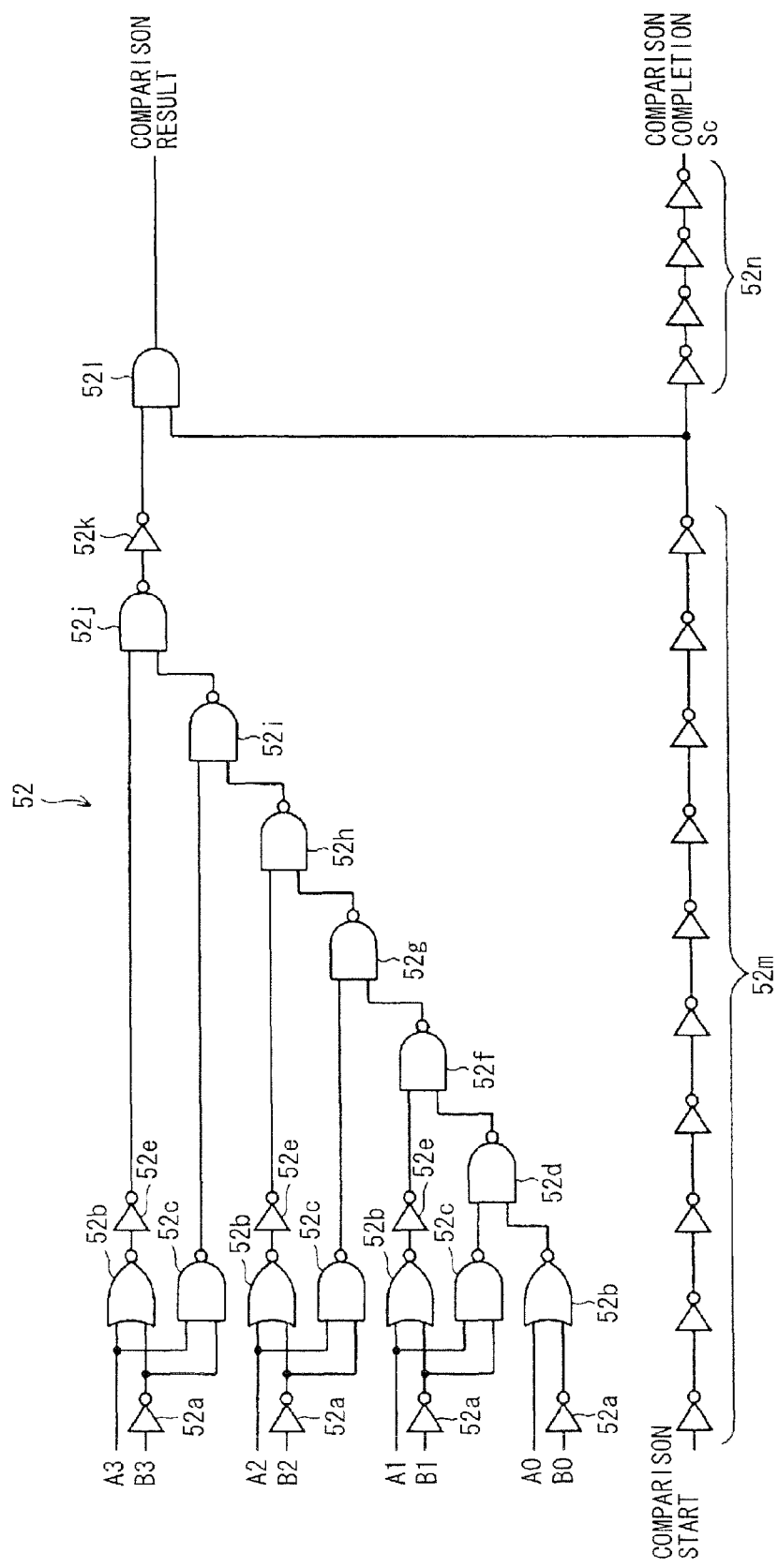
FIG. 11 illustrates a circuit diagram of a comparator.

FIG. 11 illustrates a circuit configuration of the comparator 52 in a 4-bit configuration. However, the actual configuration has the number of bits of the second counter 21. Comparison reference values B3 (MSB) to B0 (LSB) are reversed by an inverter 52a and inputted to a NOR gate 52b and a NAND gate 52c, together with an output value A3 (MSB) to A0 (LSB) of the second counter 21, each bit in a pair. A0 and B0 are inputted only into the NOR gate 52b.

An output of a NOR gate 52b, to which A0 and B0 are inputted, and an output of a NAND gate 52c, to which A1 and B1 are inputted, are inputted to a NAND gate 52d. An output of a NOR gate 52b to which A1 and B1 are inputted is inverted by an inverter 52e, and inputted to a NAND gate 52f with an output of the NAND gate 52d. An output of a NAND gate 52c to which A2 and B2 are inputted is inputted to a NAND gate 52g with an output of a NAND gate 52f. Same applies to NAND gates 52h to 52j.

An output of the NAND gate 52j serves as a comparison result signal via an inverter 52k and an AND gate 52l. A comparison start signal inputted from the second counter 21 is inputted to one terminal of the AND gate 52l through even numbers of inverters 52m, and in addition, is outputted as a comparison completion signal through even numbers of inverters 52n. A gate propagation delay time of the inverters 52m is set longer than a delay time of the comparator circuit.

The comparator 52 opens the AND gate 52l when the gate propagation delay time has elapsed, after the comparison start signal of an H level is inputted. When (the output value A of the second counter 21)≧(the comparison reference value B) at this time, a comparison result signal of an H level is outputted. Accordingly the RS flip-flop 23 illustrated in FIG. 10 is set, and a conversion data output process signal Sa of an H level and hence a conversion completion signal are outputted. As is the case with Embodiment 1, when there is a possibility that an omission in determining by the comparator 52 may occur due to too fast change of the output value of the counter 21, it will be preferable not to use the lower-order bits of the output value of the counter 21 for determining. Also according to the present embodiment described above, the same operation-effect as in Embodiment 1 is produced.

Embodiments 4, 5, and 6

Figure 12:
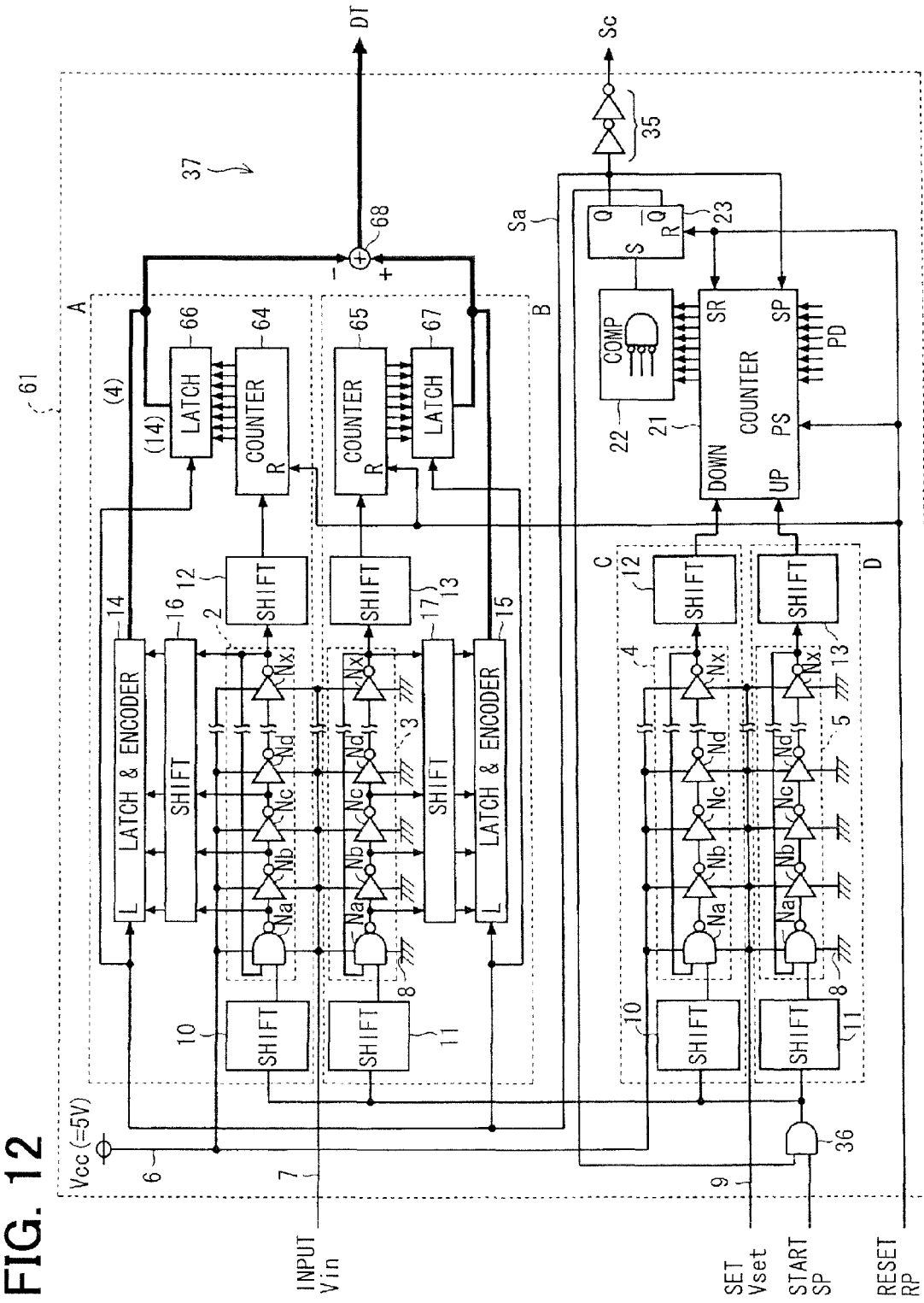
FIG. 12 is a circuit diagram illustrating Embodiment 4 in a similar manner as FIG. 1.
Figure 13:
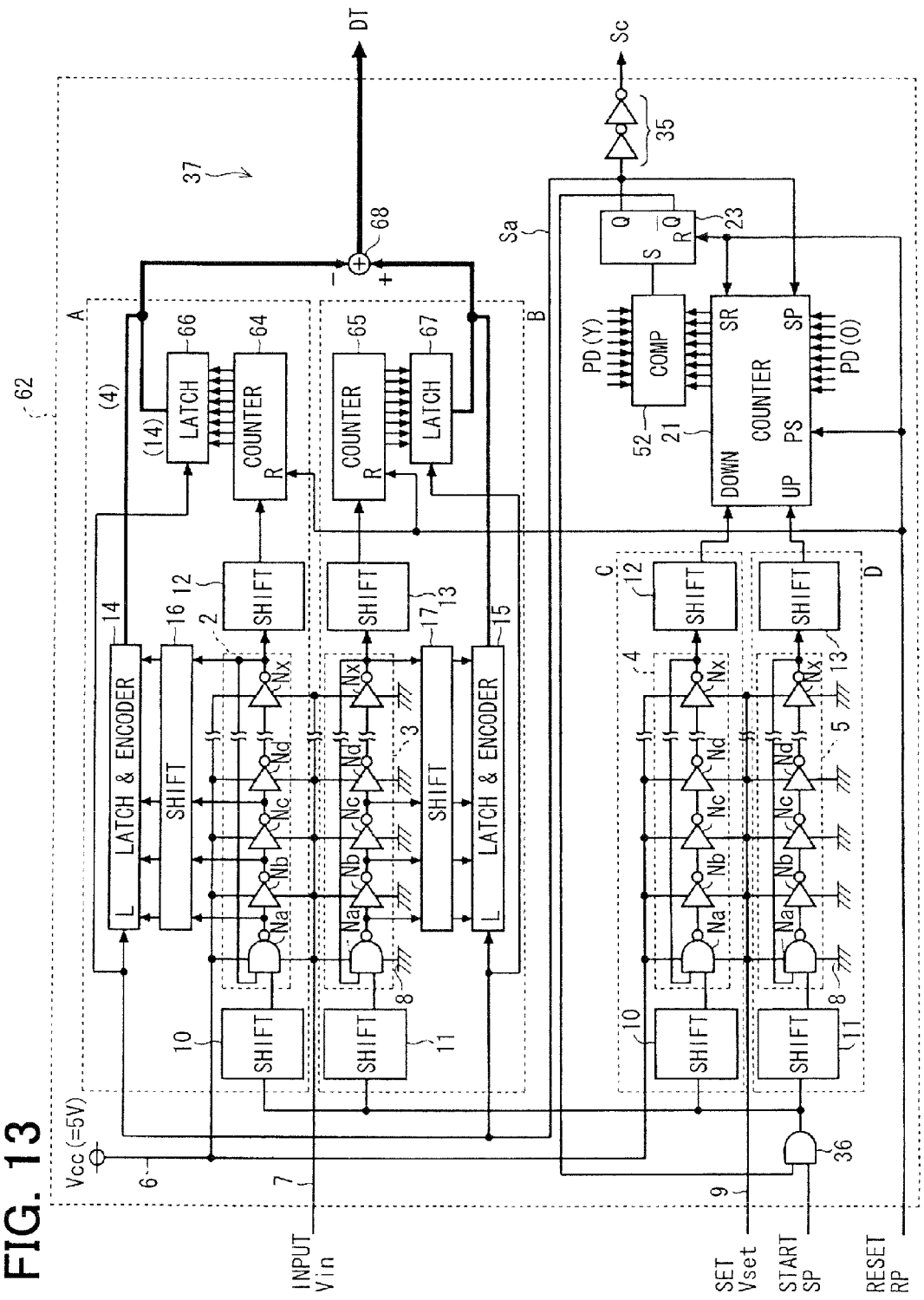
FIG. 13 is a circuit diagram illustrating Embodiment 5 in a similar manner as FIG. 1.
Figure 14:
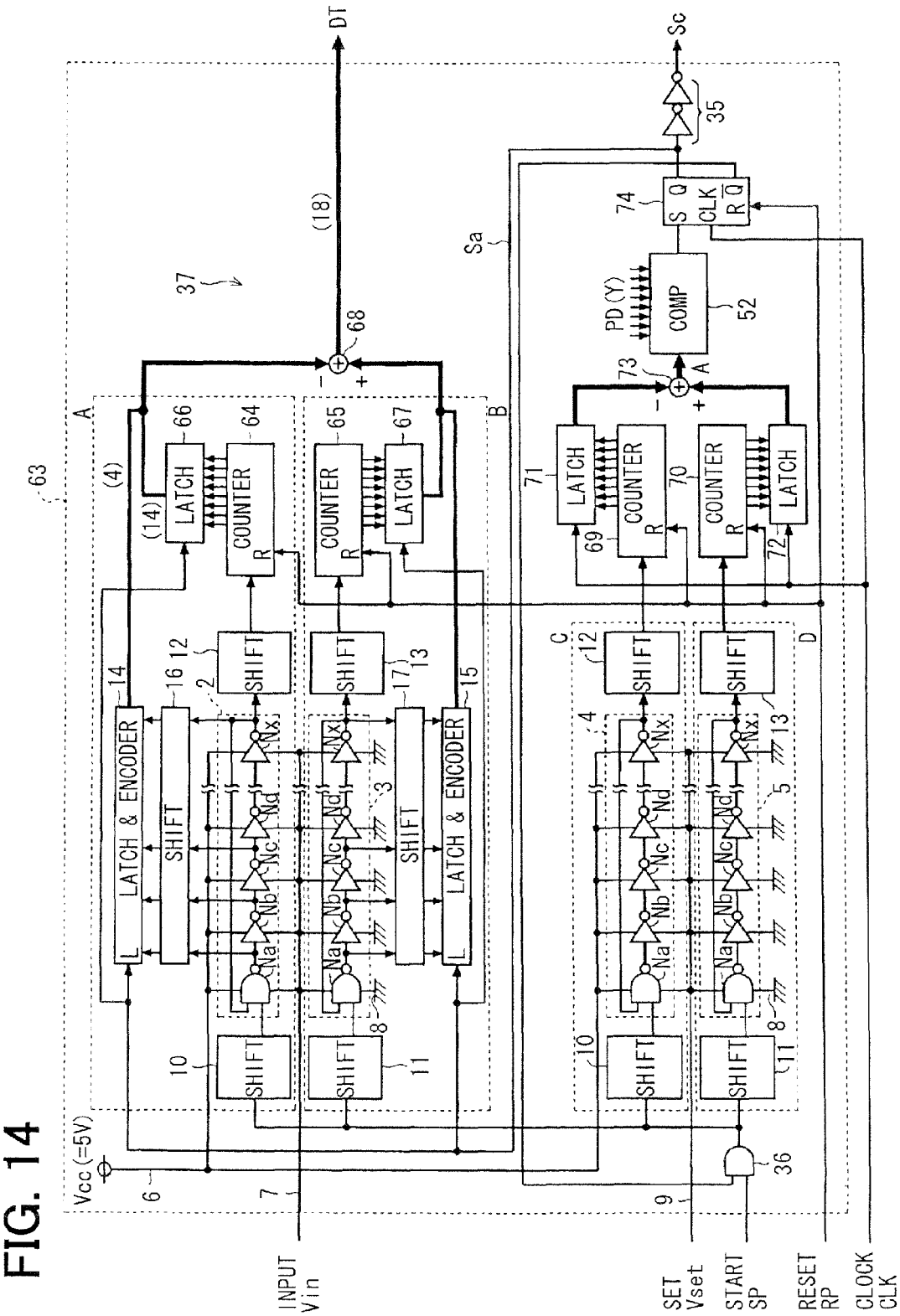
FIG. 14 is a circuit diagram illustrating Embodiment 6 in a similar manner as FIG. 1.

FIG. 12, FIG. 13, and FIG. 14 illustrate A/D converter circuits 61, 62, and 63 according to Embodiments 4, 5, 6, respectively. These A/D converter circuits are different from that of Embodiment 1 in the configuration of the counter. The A/D converter circuits 61, 62, and 63 are provided with counters 64 and 65 corresponding to the first pulse circulation circuit 2 and the second pulse circulation circuit 3, respectively, in lieu of the first counter 20 of the systems A and B.

Accompanied with latches 66 and 67 and a subtractor 68, the counters 64 and 65, which make a pair, form a 14-bit up/down-counter of the second kind, for example. When a reset pulse RP is inputted, the counters 64 and 65 reset the count value to zero, and perform up-count in response to output signals of the first pulse circulation circuit 2 and the second pulse circulation circuit 3, respectively.

Output values of the counters 64 and 65 are held at the latches 66 and 67, in response to a conversion data output process signal Sa of an H level. Data of the circulation number held at the latches 66 and 67 serves as higher-order 14 bits, and position data outputted from the latch and encoders 14 and 15 serves as lower-order 4 bits. The subtractor 68 subtracts the circulation number and the position data of the system A from the circulation number and the position data of the system B, and produces 18-bit A/D conversion data DT. The present subtraction is performed in synchronization with the clock pulse CLK. It is only necessary to provide the latch and encoders 14 and 15 if needed.

The systems C and D of the A/D converter circuits 61 and 62 illustrated in FIG. 12 and FIG. 13 have the same configuration as those illustrated in FIG. 1 and FIG. 10, respectively. In FIG. 12, the determination completion signal (comparison start signal) and the determination canceling signal (comparison completion signal) between the second counter 21 and the comparator 22 are omitted.

The systems C and D of the A/D converter circuit 63 illustrated in FIG. 14 are provided with counters 69 and 70 corresponding to the third pulse circulation circuit 4 and the fourth pulse circulation circuit 5, respectively, in lieu of the second counter 21, in a similar manner as the systems A and B. Accompanied with latches 71 and 72 and a subtractor 73, the counters 69 and 70, which make a pair, form an up-counter of the second kind. When a reset pulse RP is inputted, the counters 69 and 70 reset the count value to zero, and perform up-count in response to output signals of the third pulse circulation circuit 4 and the fourth pulse circulation circuit 5, respectively.

Output values of the counters 69 and 70 are held at latches 71 and 72 in synchronization with the clock pulse CLK. The subtractor 73 subtracts the data of the circulation number of the system C from the data of the circulation number of the system D, and produces difference data of the circulation number. The present subtraction is also performed in synchronization with the clock pulse CLK. The comparator 52 compares the difference data of the circulation number A with the comparison reference value B (specified value Y) which is the preset value. Unlike the RS flip-flop 23 illustrated in FIG. 1 etc., an RS flip-flop 74 performs a set and reset operation in synchronization with the clock pulse CLK.

According to Embodiments 4, 5, and 6, the general-purpose up-counters 64, 65, 69, and 70 can be utilized. In the A/D converter circuit 63 which adopts the counters 69 and 70 in the systems C and D, the counters 69 and 70 themselves perform count by capturing all the edges. Therefore, there is no omission in count. However, before performing comparison operation by the comparator 52, it is necessary to perform subtraction operation by the subtractor 73. Accordingly, the comparison operation will be delayed by just that much, and may cause an A/D conversion error in some cases.

On the other hand, in the A/D converter circuits 61 and 62 which adopt the general-purpose up-counters 64 and 65 in the systems A and B, it is only necessary to perform the subtraction by means of the subtractor 68 only once at the end of conversion. Therefore, the A/D converter circuits 61 and 62 can perform the subtraction operation, even after starting the next A/D conversion. Accordingly, it is possible to produce A/D conversion data of high accuracy, utilizing the general-purpose up-counters 64 and 65.

Embodiment 7

Figure 15:
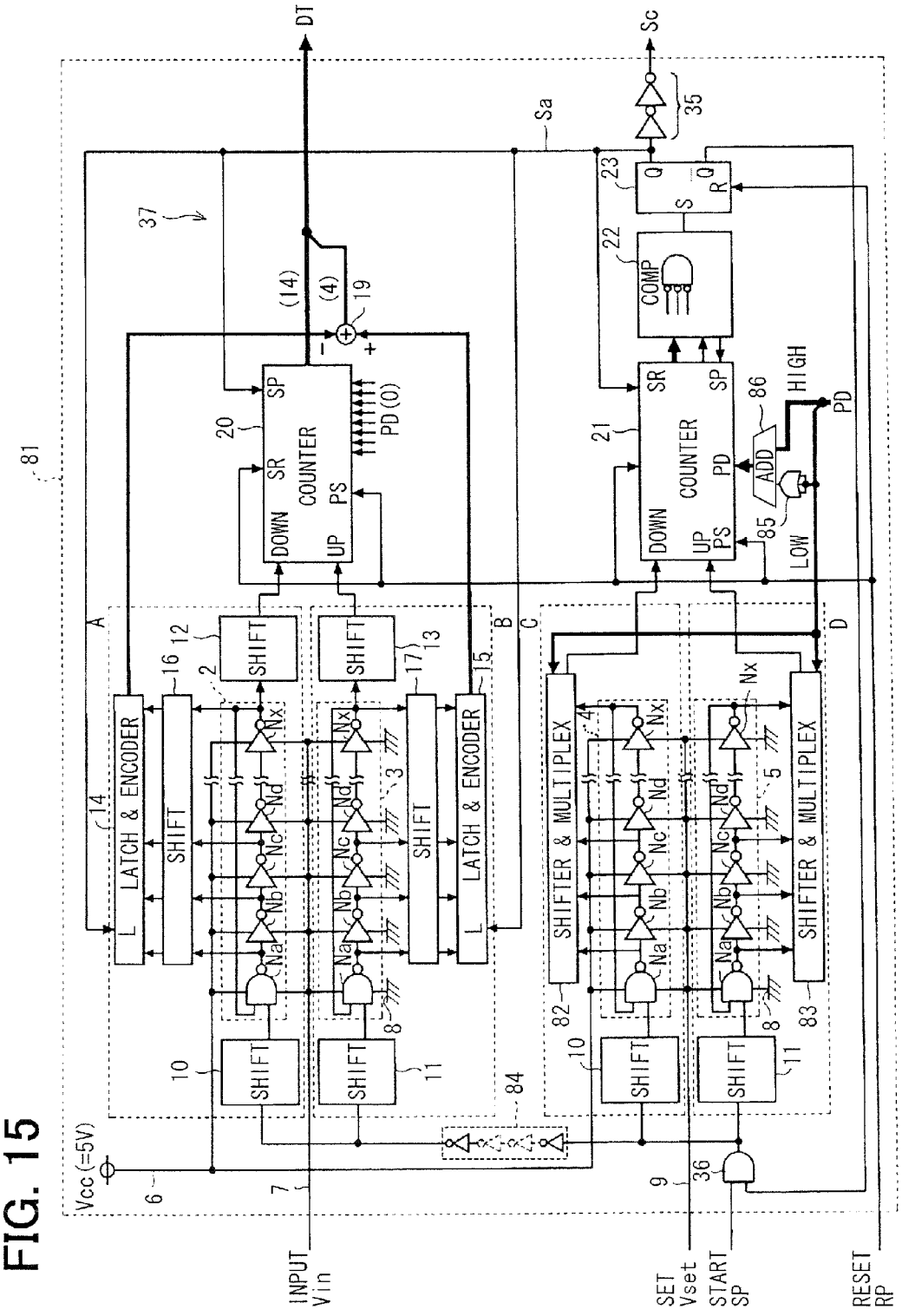
FIG. 15 is a circuit diagram illustrating Embodiment 7 in a similar manner as FIG. 1.

Embodiment 7 is described with reference to FIG. 15 and FIG. 16. An A/D converter circuit 81 illustrated in FIG. 15 is provided with level shifter and multiplexers 82 and 83, which fetch a pulse signal from inverter circuits Na, Nb, - - - , specified by a lower-order preset value and located at the same position with each other in the third pulse circulation circuit 4 and the fourth pulse circulation circuit 5. The level shifter and multiplexers 82 and 83 output the fetched pulse signal to a count-down input terminal and a count-up input terminal of the second counter 21 after performing a level conversion. An OR gate 85 outputs a carried value "1", when the lower-order preset value is not "000" in a binary digit. An adder 86 adds a higher-order preset value and the carried value, and inputs the added value to the second counter 21.

Figure 16:
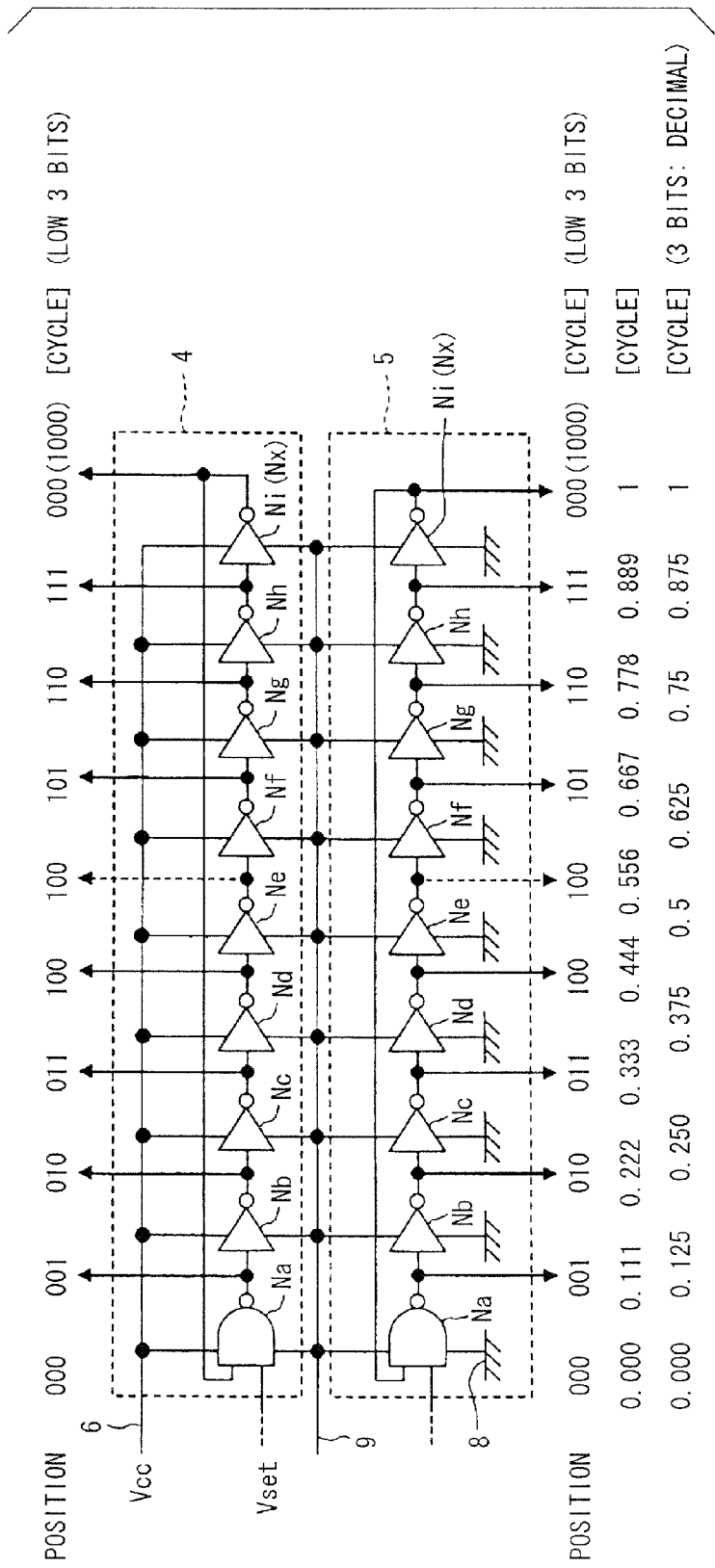
FIG. 16 is a circuit diagram illustrating a third and a fourth pulse circulation circuits associated with a lower preset value.

FIG. 16 illustrates the third pulse circulation circuit 4 and the fourth pulse circulation circuit 5, associated with a lower-order preset value. Although a configuration of three bits is illustrated, actually, more numbers of bits are used. The pulse circulation circuits 4 and 5 are brought to oscillate by providing odd-numbered inverter circuits in total, including the NAND gate Na and the inverters Nb, Nc, - - - . Since the present example has nine inverter circuits Na, - - - , Ni (=Nx), only eight inverter circuits can be selected with the three-bit configuration.

Therefore, an output position of the NAND gate Na at the top is defined as "001" in a binary digit, an output position of the inverter Nb as "010", and similarly in the following, an output position of the inverter Nh is defined as "111", and an output position of the inverter Ni at the end is defined as "000." The output position of inverters Nd and Ne located in the center are defined as "100." In an actual design, what is necessary is just to define either of the inverters Nd and Ne as the output position "100." In FIG. 16, in the lower column of the three-bit position data (lower-order preset value), exact positions of nine inverter circuits Na to Ni are shown as a reference value, such as 1/9 (=0.111), 2/9 (=0.222), - - - , 8/9 (=0.889), and 9/9 (=1). In the further lower column, values of the three-bit position data defined in the above are shown.

When the specified value Y is set to 500.7 as an example, as a higher-order preset value, 500+1 (1 is a carried value)=501 is set in the second counter 21 and as a lower-order preset value, the position data 101 (0.667) or 110 (0.778) near 0.7 is set. That is, a pulse signal, which has started circulation from the inverter circuit Na in response to the start pulse SP supplied, circulates the pulse circulation circuits 4 and 5 by 0.7 round and is fetched out from the position of the inverter circuit Nf or Ng, and is inputted to the second counter 21. A pulse signal after that repeats circulation of 500 rounds with the fetch position concerned as the starting point.

Like the present embodiment, when a pulse signal is fetched from a position specified by the lower-order preset value in the third pulse circulation circuit 4 and the fourth pulse circulation circuit 5, the resolution can be improved, without increasing the specified value Y, that is without increasing the A/D conversion time. When the conversion control circuit 37 possesses operation delay and an output of the conversion data output process signal Sa is delayed by that much, the specified value Y is adjusted in the decreasing direction in terms of the lower-order preset value. Accordingly, deterioration of the conversion accuracy due to the delay concerned can be prevented beforehand.

In the present embodiment, an inverter 84 (delay circuit) is provided between the AND gate 36 and the input level shift circuits 10 and 11 of the first pulse circulation circuit 2 and the second pulse circulation circuit 3, in order to delay the start pulse SP by a time which corresponds to a delay time of the second counter 21, the comparator 22, and the RS flip-flop 23. Accordingly, it is possible to delay the start of the circulation operation of the first pulse circulation circuit 2 and the second pulse circulation circuit 3 from the start of the circulation operation of the third pulse circulation circuit 4 and the fourth pulse circulation circuit 5, by the amount of the delay time from a time when a difference of the circulation number of a pulse signal in the third pulse circulation circuit 4 and the circulation number of a pulse signal in the fourth pulse circulation circuit 5 reaches the specified value Y, to a time when the conversion data output process signal Sa is outputted. Consequently, it is possible to prevent that the number of pulse circulation in the first pulse circulation circuit 2 and the second pulse circulation circuit 3 increases rather than an original value, due to the operation delay of the conversion control circuit 37, and it is possible to produce the A/D conversion data of higher accuracy.

The present embodiment adopts a configuration, in which the lower-order preset value can be used and the inverter 84 is provided as a delay circuit at the same time. However, it is also preferable to adopt a configuration, in which at least one of them is provided.

Embodiment 8

Embodiment 8 is described with reference to FIG. 17 to FIG. 19. The present embodiment relates to technology, in which an offset voltage of an operational amplifier included in an input interface is canceled, by the use of the feature of an A/D converter circuit of a TAD system.

Figure 17:
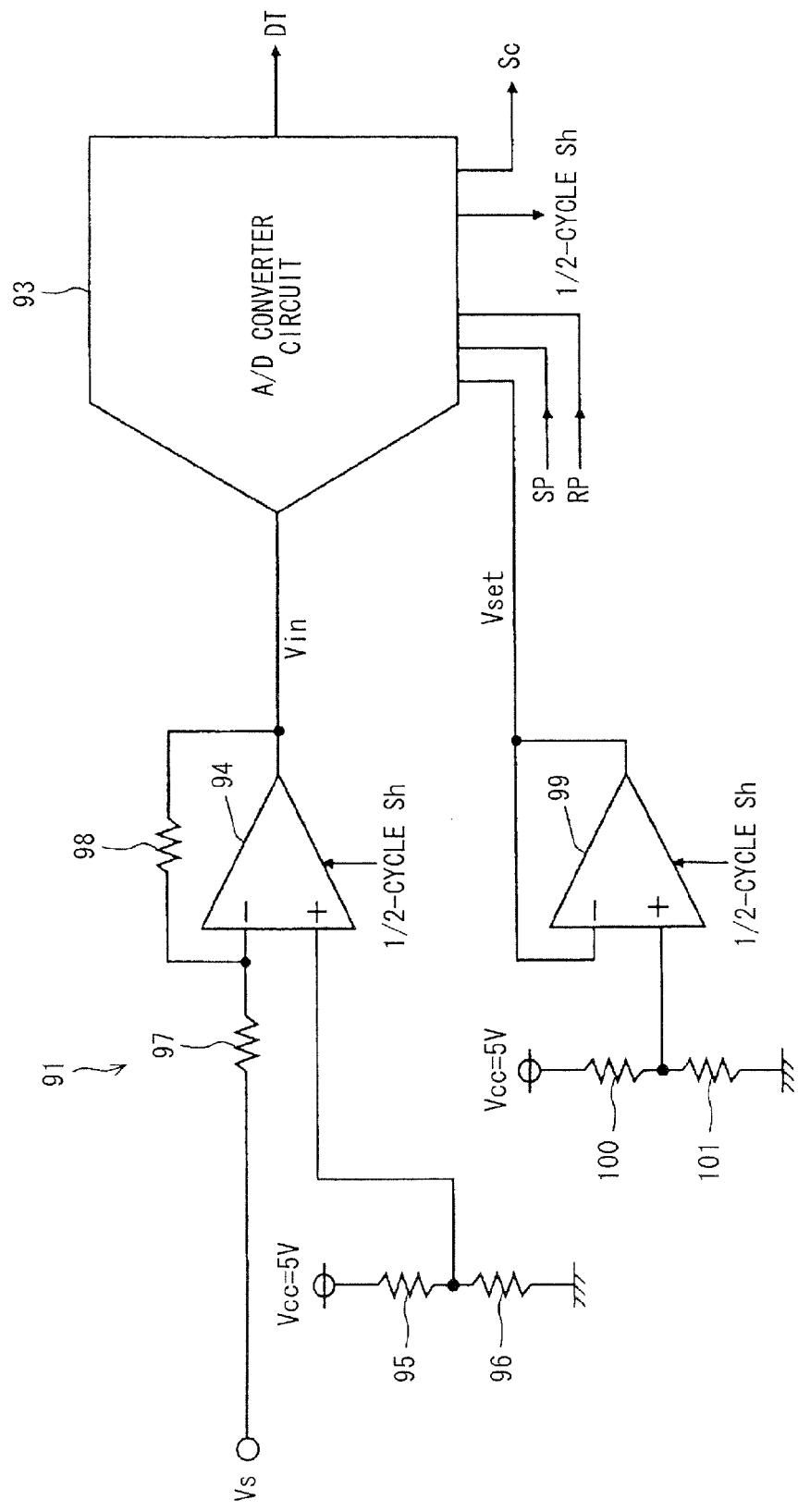
FIG. 17 illustrates a circuit diagram (No. 1) of an input interface according to Embodiment 8.
Figure 18:
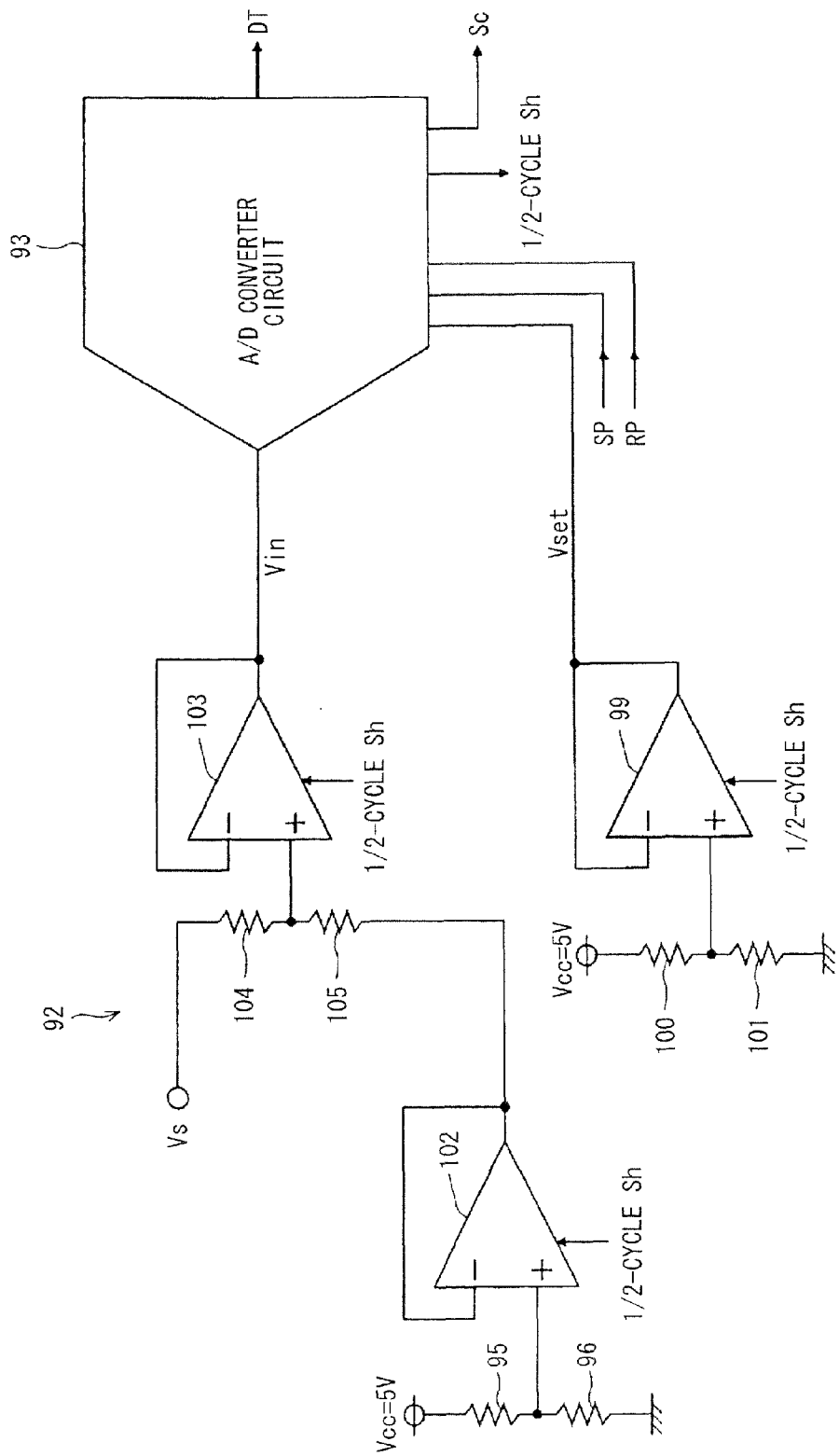
FIG. 18 illustrates a circuit diagram (No. 2) of the input interface.

FIGS. 17 and 18 illustrate input interfaces 91 and 92, which output an analog input voltage Vin and a set voltage Vset to an A/D converter circuit 93, respectively. These input interfaces 91 and 92 are formed in the same semiconductor integrated circuit device as the A/D converter circuit 93. The A/D converter circuit 93 has a configuration, in which a ½-cycle signal Sh (switching signal) that distinguishes the first half period and the second half period of one A/D conversion period, is generated and outputted, in addition to the configuration of one of the A/D converter circuits described above or to be described below. An input voltage Vs from a sensor etc. is a signal voltage which changes within the range of from 0V to Vcc (5V) as the power supply voltage range.

In FIG. 17, an operational amplifier 94 amplifies an input voltage Vs by −k1 times (0<k1<1) on the basis of a voltage of Vcc/2 (2.5V), to produce the analog input voltage Vin. The non-inverting input terminal of the operational amplifier 94 is supplied with a half voltage Vcc/2 produced by sub-dividing the specified voltage Vcc by resistors 95 and 96 with the same value of resistance, and the inverting input terminal thereof is coupled to resistors 97 and 98 which determine the gain. A value of resistance of the resistor 97 is set up greater than a value of resistance of the resistor 98. An operational amplifier 99 outputs the set voltage Vset produced by sub-dividing the specified voltage Vcc by resistors 100 and 101 with different values of resistance.

In FIG. 18, an operational amplifier 102 outputs a half voltage Vcc/2 produced by sub-dividing the specified voltage Vcc by resistors 95 and 96 with the same value of resistance. An operational amplifier 103 outputs an input voltage Vs sub-divided by resistors 104 and 105 on the basis of the voltage Vcc/2, as analog input voltage Vin. That is, the input voltage Vs is amplified by +k2 times (0<k2<1) on the basis of the voltage of Vcc/2, to produce the analog input voltage Vin.

Figure 19:
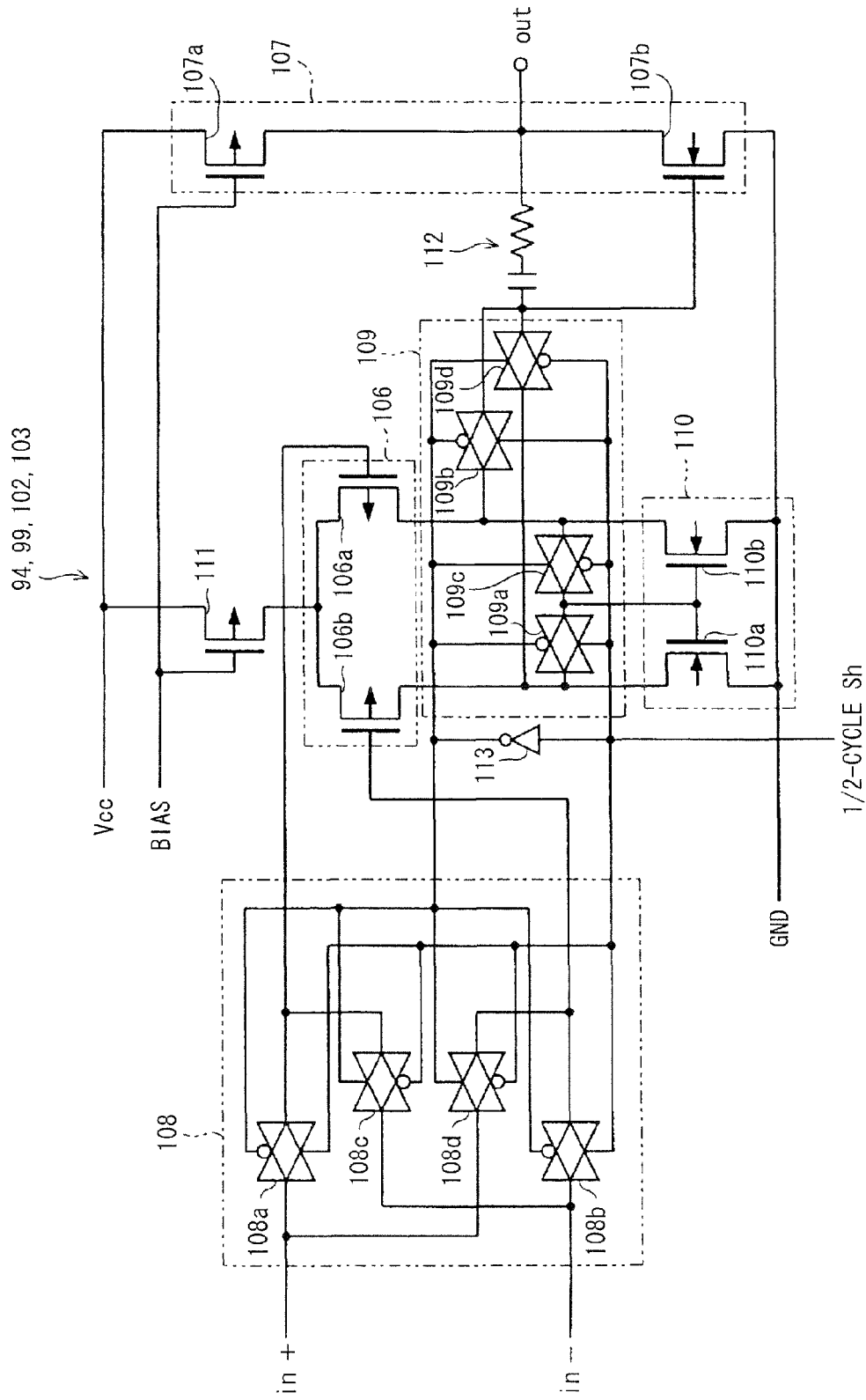
FIG. 19 illustrates a circuit diagram of an operational amplifier.

FIG. 19 illustrates a configuration of the operational amplifiers 94, 99, 102, and 103 described above. This operational amplifier includes a differential pair sub-circuit 106, an output sub-circuit 107, an input switching sub-circuit 108, an output switching sub-circuit 109, a load sub-circuit 110, a transistor 111 (constant current sub-circuit), and a phase compensation sub-circuit 112.

The differential pair sub-circuit 106 is configured with a first transistor 106a and a second transistor 106b, and is supplied with a constant current via a transistor 111. The output sub-circuit 107 is located in the latter stage of the differential pair sub-circuit 106, and is configured with a transistor 107a to which a bias voltage is supplied, and a transistor 107b to which an output voltage of the differential pair sub-circuit 106 is inputted. The load sub-circuit 110 is configured with transistors 110 and 110b.

The input switching sub-circuit 108 is configured with four analog switches 108a to 108d, and outputs input voltages fed to a non-inverting input terminal and an inverting input terminal, respectively to the first transistor 106a and the second transistor 106b or to the second transistor 106b and the first transistor 106a, according to a ½-cycle signal Sh and an inverted signal of the signal Sh by an inverter 113. The output switching sub-circuit 109 is configured with four analog switches 109a to 109d, and outputs an output voltage of the first transistor 106a or the second transistor 106b to the output sub-circuit 107, according to the ½-cycle signal Sh and the inverted signal thereof.

When the ½-cycle signal Sh is at an H level, the analog switches 108a, 108b, 109a, and 109b are set to ON and the analog switches 108c 108d, 109c, and 109d are set to OFF. When the ½-cycle signal Sh is at an L level, all switches are reversed. That is, when the level of the ½-cycle signal Sh is reversed, coupling of the first transistor 106a and the second transistor 106b of the differential pair sub-circuit 106 and the transistors 110a and 110b of the load sub-circuit 110 becomes opposite with respect to the output sub-circuit 107. Accordingly, the direction (positive/negative) of an offset voltage of the operational amplifier becomes opposite.

On the other hand, in the A/D converter circuit 93 of a TAD system, a pulse circulating speed in the pulse circulation circuits 2 to 5 changes during an A/D conversion period, according to the magnitude of voltages Vcc−Vin and Vin, which are applied to the pulse circulation circuits 2 and 3, and according to the magnitude of voltages Vcc−Vset and Vset, which are applied to the pulse circulation circuits 4 and 5. Therefore, it is considered that the A/D converter circuit 93 produces A/D conversion data to a mean value of the analog input voltage Vin and a mean value of the set voltage Vset during the A/D conversion period.

Therefore, the level of the ½-cycle signal Sh is reversed in the first half period and the second half period of one cycle of the A/D conversion, thereby the direction of the offset voltage of the operational amplifiers 94, 99, 102, and 103 is reversed. According to this scheme, the mean value of the offset voltage included in the analog input voltage Vin and the set voltage Vset over one cycle of the A/D conversion becomes zero, and it is possible to produce A/D conversion data of high accuracy in which an offset voltage of an operational amplifier is canceled.

Before reversing the level of the ½-cycle signal Sh at the middle time of an A/D conversion cycle, it is preferable to once return the start pulse SP to an L level to stop the pulse circulating operation of the A/D converter circuit 93, and after reversing the level of the ½-cycle signal Sh and after waiting for a stabilization time, to return the start pulse SP to an H level again to resume the pulse circulating operation.

Offset compensation of an operational amplifier according to the present embodiment utilizes the voltage equalization property in a pulse circulating operation which the A/D converter circuit 93 possesses. Accordingly, a sample hold circuit for holding circulation data at the end of the first half period and an adder circuit for adding the circulation data of the first half period and the circulation data of the second half period become unnecessary.

Embodiment 9

Figure 20:
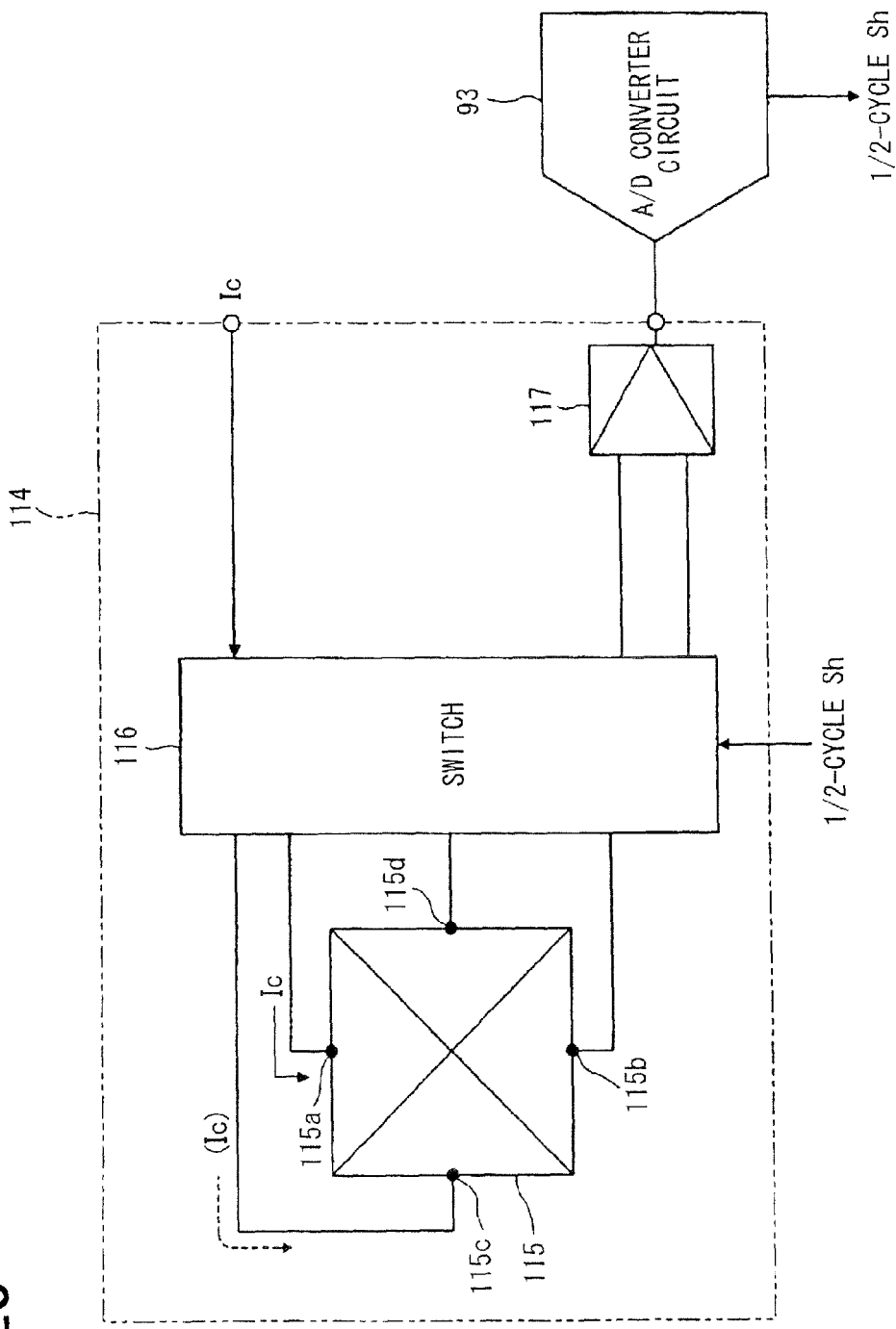
FIG. 20 is a circuit diagram illustrating an outline configuration of an exemplified application of an A/D converter circuit to a Hall sensor, according to Embodiment 9.

Embodiment 9 is described with reference to FIG. 20. Embodiment 9 is an example of application of an A/D converter circuit to a Hall sensor. A Hall sensor 114 includes a Hall element 115, a switching circuit 116, and a differential amplifier circuit 117. An A/D converter circuit 93 is one of the A/D converter circuits described above or to be described below, and performs A/D conversion of a Hall voltage VH which is outputted from the Hall element 115 and amplified by the differential amplifier circuit 117. The A/D converter circuit 93 generates and outputs the ½-cycle signal Sh (switching signal) described above.

The Hall element 115 includes a terminal pair 115a and 115b, which make a pair, and a terminal pair 115c and 115d, which make another pair. The Hall element 115 is driven at a constant current by a control current Ic, and outputs a Hall voltage VH, which is proportional to the control current Ic and a flux density B according to magnetoelectric conversion characteristics.

The switching circuit 116 switches between a terminal pair, which makes the control current Ic flow through the Hall element 115 according to the ½-cycle signal Sh, and a terminal pair, which detects the Hall voltage VH to be supplied to the differential amplifier circuit 117 from the Hall element 115 according to the ½-cycle signal Sh.

Since the Hall element 115 can be regarded as a bridge circuit configured with parasitic resistance, the Hall element 114 has an offset voltage in the output thereof, originating from the bridge circuit. Accordingly, the level of the ½-cycle signal Sh is reversed in the first half period and the second half period of one cycle of the A/D conversion. At this time, the terminal pair which makes the control current Ic flow and the terminal pair for detection are interchanged by the switching circuit 116, and the polarity of an offset voltage included in the output from the Hall element 115 becomes opposite. For example, in the first half period, a current is made to flow from the terminal 115a to the terminal 115b and detection is performed in the terminals 115c and 115d. In the second half period, a current is made to flow from the terminal 115c to the terminal 115d and detection is performed in the terminals 115b and 115a, in the positional relationship after the terminal position is rotated by 90 degrees. At this time, the Hall voltage VH included in the output has the same polarity in the first half period and the second half period of one cycle of the A/D conversion, however, an offset voltage included in the output has an opposite polarity. Accordingly, a mean value of the offset voltage over one cycle of the A/D conversion becomes zero. Therefore, when A/D conversion of the Hall voltage VH amplified by the differential amplifier circuit 117 is performed by the A/D converter circuit 93, it is possible to perform addition of the first half period and the second half period without using a sample hold circuit and an adder circuit, as is the case with Embodiment 8. Therefore, it is possible to produce A/D conversion data of high accuracy in which an offset voltage is canceled.

Also in the present embodiment, before reversing the level of the ½-cycle signal Sh at the middle time of an A/D conversion cycle, it is preferable to once return the start pulse SP to an L level to stop the pulse circulating operation of the A/D converter circuit 93, and after reversing the level of the ½-cycle signal Sh and after waiting for a stabilization time, to return the start pulse SP to an H level again to resume the pulse circulating operation.

Embodiment 10

Embodiment 10 is described with reference to FIG. 21. The present embodiment relates to technology, in which a ratiometric A/D conversion system is configured by the use of the feature of an A/D converter circuit. An A/D converter circuit 93 is one of the A/D converter circuits described above or to be described below.

Figure 21:
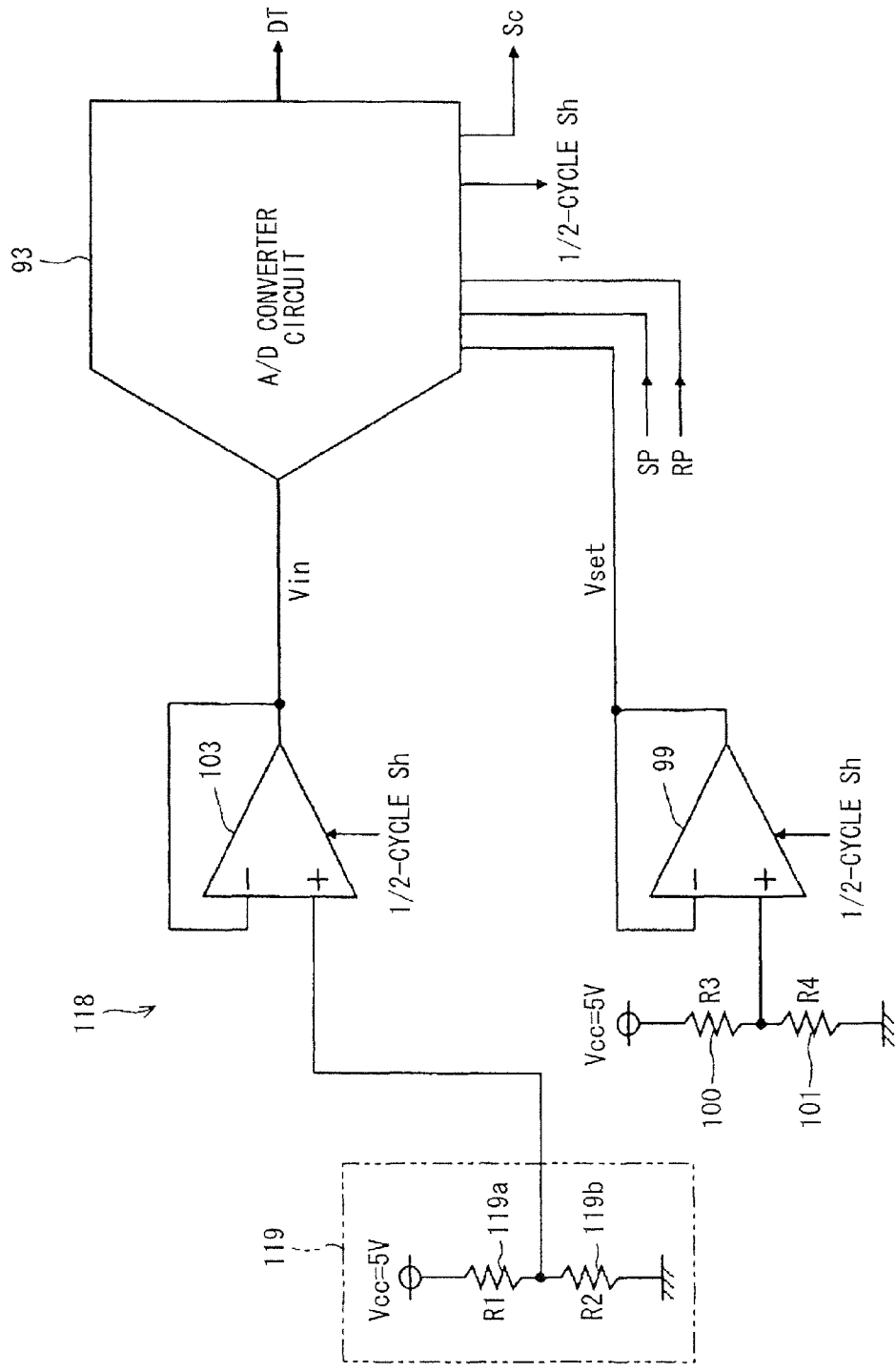
FIG. 21 illustrates a circuit diagram of a ratiometric A/D conversion system according to Embodiment 10.

An input interface 118 illustrated in FIG. 21 inputs a voltage to be converted (a sub-divided voltage of the specified voltage Vcc corresponding to detected physical quantity) from strain gage resistors 119a and 119b (the values of resistance are R1 and R2) of a pressure sensor 119 with a half-bridge configuration, for example, and output it as an analog input voltage Vin through an operational amplifier 103 as a buffer. The strain gage resistors 119a and 119b sub-divide the specified voltage Vcc, and the analog input voltage Vin becomes a ratiometric voltage R2/(R1+R2)×Vcc, proportional to the specified voltage Vcc. On the other hand, in the input interface 118, the specified voltage Vcc is sub-divided by resistors 100 and 101 (the values of resistance are R3, R4), and the set voltage Vset is given by a ratiometric voltage R4/(R3+R4)×Vcc, proportional to the specified voltage Vcc.

Consequently, in the A/D converter circuit 93, Δx shown in Equation (10) is a difference voltage of the set voltage Vset and the reference voltage xref (for example, Vcc/2) in the systems C and D and becomes a ratiometric voltage. Moreover, ΔxAB is a difference voltage of the analog input voltage Vin and the reference voltage xref in the systems A and B and becomes a ratiometric voltage similarly. Therefore, as clearly seen from Equation (10), in the A/D converter circuit 93, when in performing A/D conversion of the output voltage of the sensor 119, which utilizes the resistors 119a and 119b etc. as a sensing element, it is possible to perform the A/D conversion, which is not influenced by variation of the power supply voltage (the specified voltage Vcc), by counterbalancing the ratiometric characteristics of the sensor 119.

Embodiment 11

Embodiment 11 is described with reference to FIG. 22 to FIG. 25(a), FIG. 25(b). The present embodiment relates to technology for reducing influence on A/D conversion data, which originates in a characteristic variation between ring delay lines used as a pulse circulation circuit, in each embodiment described above.

In each of the embodiments, including the present embodiment and embodiments concerning variation reduction to be described later, the first pulse circulation circuit 2 to the fourth pulse circulation circuit 5 are functional elements, which have fixed coupling with the specified voltage line 6, the signal input line 7, the set voltage line 9, the first counter 20 and the second counter 21, etc., as described above. On the other hand, the first ring delay line a to the fourth ring delay line d are substantial elements, which are configured with the inverter circuits Na to Nx, arranged in a ring shape and formed on a chip (a semiconductor substrate) of a semiconductor integrated circuit device.

The first ring delay line a to the fourth ring delay line d are configured so as to be able to change coupling state with the neighboring circuits, so that they can operate as any of the first pulse circulation circuit 2 to the fourth pulse circulation circuit 5. In the present embodiment, the first pulse circulation circuit 2 and the second pulse circulation circuit 3 (systems A and B), which make a pair, are collectively called a first converter, the third pulse circulation circuit 4 and the fourth pulse circulation circuit 5 (systems C and D), which make another pair, are collectively called a second converter.

Figure 23:
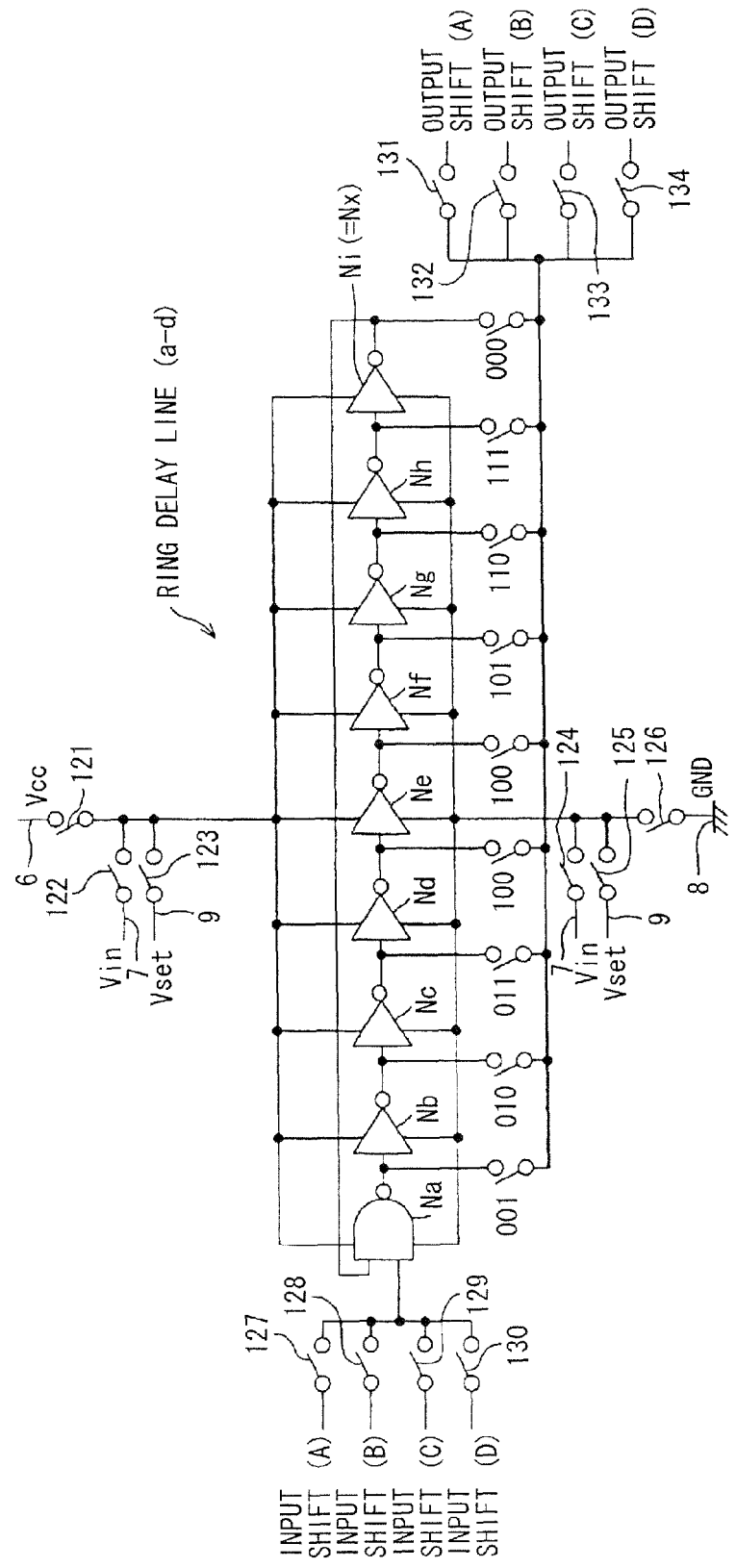
FIG. 23 illustrates a circuit diagram of a ring delay line with the addition of a switching circuit.
Figure 25B:
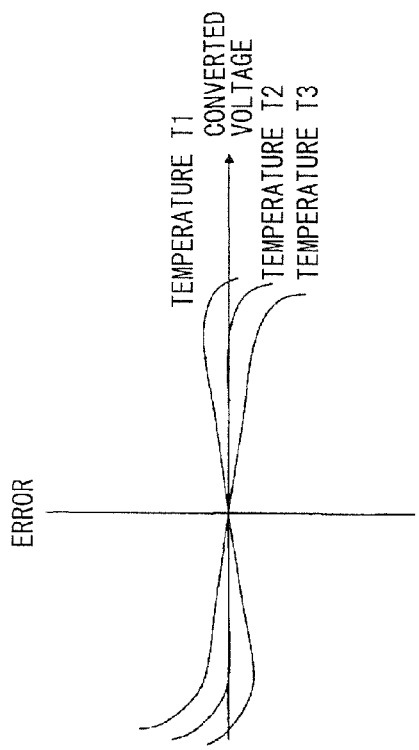
FIG. 25($a$), and FIG. 25($b$) illustrate offset temperature characteristics and sensitivity temperature characteristics, respectively.
Figure 25A:
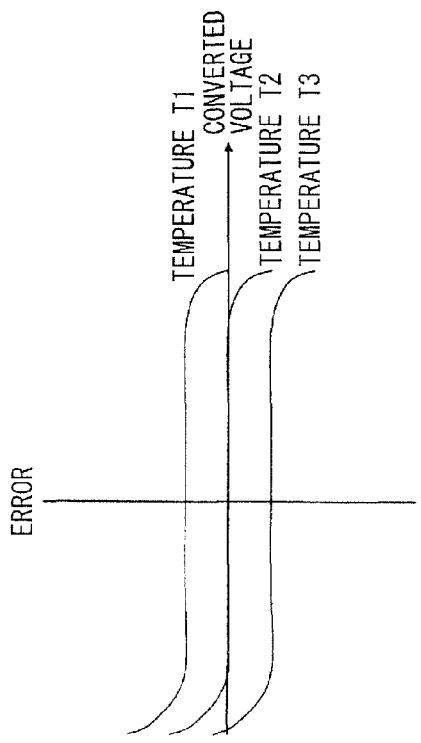

FIG. 23 illustrates a circuit diagram of ring delay lines a to d with the addition of a switching circuit. This switching circuit switches a position of the ring delay lines a to d, namely, the arrangement of the first ring delay line a to the fourth ring delay line d, with respect to the first pulse circulation circuit 2 to the fourth pulse circulation circuit 5. Switches 121, 122, and 123 switch a high-potential-side power source line of the ring delay lines a to d to one of the specified voltage line 6, the signal input line 7, and the set voltage line 9. Switches 124, 125, and 126 switch a low-potential-side power source line of the ring delay lines a to d to one of the signal input line 7, the set voltage line 9, and the ground line 8.

Switches 127 to 130 switch one input terminal of the inverter circuit (NAND gate) Na located at the top of the ring, to one of the input level shift circuits 10 and 11 of the systems A to D. Switches 131-134 switch an output terminal of the inverter circuit (inverter) Ni (=Nx) located at the end of the ring, to one of the output level shift circuits 12 and 13 of the systems A to D.

These switches 121 to 134 are analog switches formed of MOS transistors formed on the same chip with the ring delay lines a to d. It is desirable to optimize the size of the analog switches, because a value of resistance, variation of the value of resistance, and parasitic capacitance will affect delay etc.

As described in Embodiment 1, the ring delay lines a to d used as the pulse circulation circuits 2 to 5 can reduce mutual characteristic variations by schemes such as close arrangement, arrangement with identical shape and an identical size, arrangement in the same direction, adoption of large size, etc. However, it is difficult to reduce completely to zero a variation in composing transistors, and a variation of parasitic elements (including resistance of wiring and parasitic capacitance) on a layout. Therefore, a variation occurs in the delay characteristics of each of ring delay lines a to d.

FIG. 25($a$) and FIG. 25($b$) illustrate an A/D conversion value error originating in the variation. FIG. 25($a$) shows offset temperature characteristics in which an A/D conversion value error increases and decreases as a whole to a temperature change. FIG. 25($b$) shows sensitivity temperature characteristics, in which gradient of an A/D conversion value error changes to a temperature change. Generally, the offset temperature characteristics and the sensitivity temperature characteristics exist at the same time. Even if the offset temperature characteristics and the sensitivity temperature characteristics are made zero, an error due to deviation of the voltage-delay characteristics of the ring delay lines a–d from a quadratic function may be produced (refer to FIG. 8).

Figure 22:
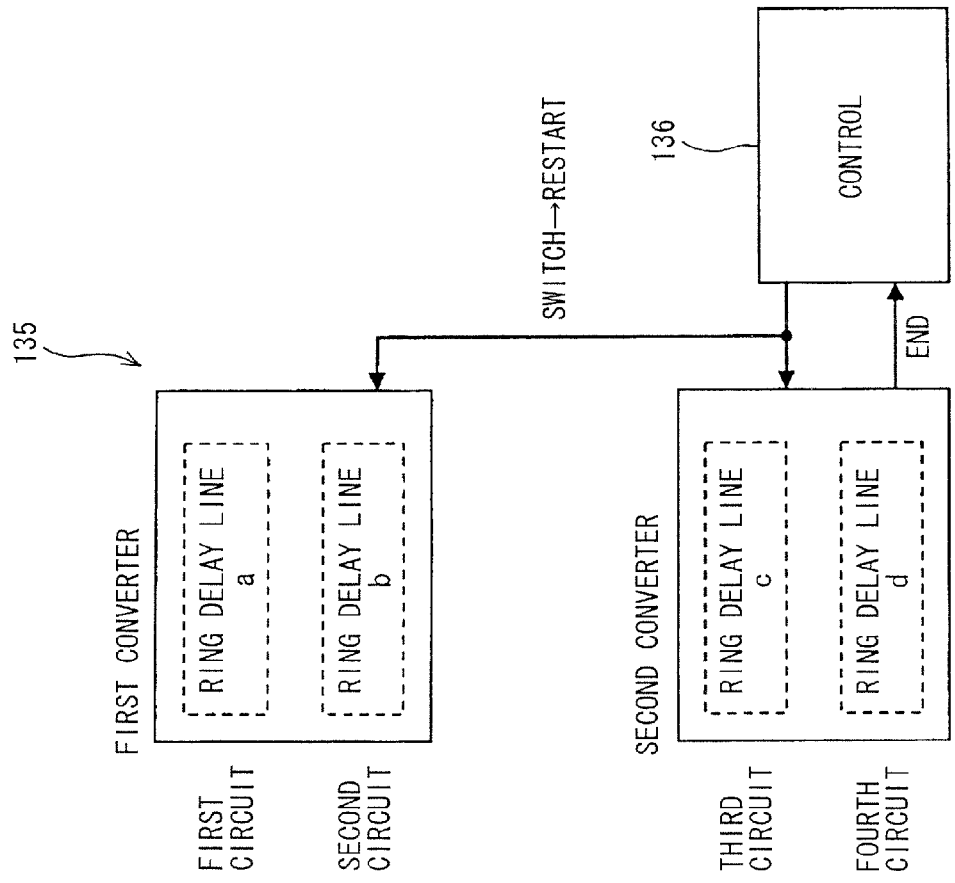
FIG. 22 illustrates an outline configuration of an A/D converter circuit according to Embodiment 11.

FIG. 22 illustrates an outline configuration of the A/D converter circuit 135, and FIG. 24 illustrates a method of changing arrangement of the ring delay lines a to d. It is assumed that a period after a start pulse SP is supplied until the second counter 21 etc. completes count of the specified value Y is one cycle, and that time produced by dividing one cycle by the number of ring delay lines, namely, an interval for every ¼ cycle is the first interval to the fourth interval. When switching is not performed, one cycle of the A/D conversion is equal to the A/D conversion time TAD. However, when switching is performed, excessive time, such as stoppage of count and switching operation, occurs, and one cycle of the A/D conversion becomes longer than the A/D conversion time TAD by that much.

A conversion control circuit 136 switches the coupling state of the first ring delay line a to the fourth ring delay line d every ¼ cycle, so that the first ring delay line a to the fourth ring delay line d operate for an equal period of time (=TAD/4) as the first pulse circulation circuit 2 to the fourth pulse circulation circuit 5, respectively. Here, as illustrated in FIG. 24, the ring delay lines a to d are switched in rotation sequentially to the pulse circulation circuits 2 to 5. However, as long as the position of the ring delay lines a to d is switched sequentially so that the ring delay lines a to d may operate as a different pulse circulation circuit every ¼ cycle, other arrangement change methods than rotation are also practicable.

Specifically, the conversion control circuit 136 outputs a position switching signal after stopping the count of the counters 20, 21, etc., switches the switches 121 to 134, and shifts the position of the ring delay lines a to d one by one relative to the pulse circulation circuits 2 to 5. After that, the conversion control circuit 136 outputs a count resume signal after the stabilization time. When an interval of ¼ cycle ends, an interval end signal is outputted from the second converter, and the conversion control circuit 136 stops the count again and outputs the position switching signal. This process is repeated from the first interval to the fourth interval. In the present example, the counting is stopped. However, a pulse circulating operation may be stopped instead.

Next, an operation of position switching is described with reference to FIG. 7 illustrated in Embodiment 1. A power supply voltage x (=the set voltage Vset) is applied to a ring delay line which operates as the fourth pulse circulation circuit 5, and a power supply voltage x' (=Vcc−Vset) is applied to a ring delay line, which operates as the third pulse circulation circuit 4. Consequently, Equation (1) and Equation (2) hold always to the reference voltage xref.

$$x = xref + \Delta x \quad (1: \text{rewritten})$$

$$x' = xref - \Delta x \quad (2: \text{rewritten})$$

That is, when the power supply voltage of the ring delay line which operates as the fourth pulse circulation circuit 5 of the system D increases by $\Delta x$, the power supply voltage of the ring delay line, which operates as the third pulse circulation circuit 4 of the system C decreases by $\Delta x$. When the power supply voltages to the ring delay lines of the system C and the system D become equal, the power supply voltage is given by the reference voltage xref.

When assuming that the characteristics of four ring delay lines a to d are slightly different, and operating the ring delay lines a to d as the fourth pulse circulation circuit 5 for a ¼ unit time during one cycle of the A/D conversion, the characteristics of the ring delay line can be approximated by a quadratic function expressed by Equation (13). y is the circulation number per unit time when the power supply voltage x is applied to the fourth pulse circulation circuit 5 of the system D.

$$y = (1/4) \cdot \quad (13)$$
$$(A1 \cdot (\Delta x)^2 + B1 \cdot (\Delta x) + yref + A2 \cdot (\Delta x)^2 + B2 \cdot (\Delta x) + yref +$$
$$A3 \cdot (\Delta x)^2 + B3 \cdot (\Delta x) + yref + A4 \cdot (\Delta x)^2 + B4 \cdot (\Delta x) + yref)$$

Here, coefficients A1 to A4 are second-order coefficients to $\Delta x$, and coefficients B1 to B4 are first-order coefficients to $\Delta x$.

The coefficients A1 to A4 and the coefficients B1 to B4 are expressed by Equations (14a) to (14d) and Equations (15a) to (15d), respectively. The subscript "1" of A1 and B1 means the ring delay line a, the subscript "2" of A2 and B2 means the ring delay line b, similarly in the following, the subscripts "3" and "4" mean the ring delay lines c and d. $\alpha 21$ to $\alpha 24$, $\beta 21$ to $\beta 24$ are second-order coefficients to temperature t° C., $\alpha 11$ to $\alpha 14$, $\beta 11$ to $\beta 14$ are first-order coefficients to temperature t° C. Third-order and higher-order terms are assumed to be negligibly small. a1 to a4, b1 to b4 are coefficients to $\Delta x$ at 25° C. In the present case, the reference temperature is set to 25° C., however, it can be changed to any reference temperature.

$$A1 = a1 \cdot (1 + \alpha 11 \cdot (t-25) + \alpha 21 \cdot (t-25)^2) \quad (14a)$$

$$A2 = a2 \cdot (1 + \alpha 12 \cdot (t-25) + \alpha 22 \cdot (t-25)^2) \quad (14b)$$

$$A3 = a3 \cdot (1 + \alpha 13 \cdot (t-25) + \alpha 23 \cdot (t-25)^2) \quad (14c)$$

$$A4 = a4 \cdot (1 + \alpha 14 \cdot (t-25) + \oplus 24 \cdot (t-25)^2) \quad (14d)$$

$$B1 = a1 \cdot (1 + \beta 11 \cdot (t-25) + \beta 21 \cdot (t-25)^2) \quad (15a)$$

$$B2 = a2 \cdot (1 + \beta 12 \cdot (t-25) + \beta 22 \cdot (t-25)^2) \quad (15b)$$

$$B3 = a3 \cdot (1 + \beta 13 \cdot (t-25) + \beta 23 \cdot (t-25)^2) \quad (15c)$$

$$B4 = a4 \cdot (1 + \beta 14 \cdot (t-25) + \beta 24 \cdot (t-25)^2) \quad (15d)$$

Similarly, when the ring delay line a to d are operated as the third pulse circulation circuit for a ¼ unit time, the characteristics of the ring delay line can be approximated by a quadratic function expressed by Equation (16). y' is the circulation number per unit time when the power supply voltage x' is applied to the third pulse circulation circuit 4 of the system C.

$$\begin{aligned} y' = \quad & (16) \\ (1/4) \cdot (A1 \cdot (-\Delta x)^2 + B1 \cdot (-\Delta x) + yref + A2 \cdot (-\Delta x)^2 + B2 \cdot (-\Delta x) + \\ & yref + A3 \cdot (-\Delta x)^2 + B3 \cdot (-\Delta x) + yref + \\ & A4 \cdot (-\Delta x)^2 + B4 \cdot (-\Delta x) + yref) \end{aligned}$$

From Equation (13) and Equation (16), Equation (17) holds true.

$$y - y' = (½) \cdot (B1 + B2 + B3 + B4) \cdot \Delta x \quad (17)$$

According to Equation (17), the term of the second-order coefficients A1 to A4 which are a nonlinear component to the voltage change $\Delta x$ have disappeared from y–y' which is the difference of circulation numbers per unit time of the system D and the system C. This fact means that an excellent linearity is ensured. It becomes irrelevant also to the circulation number y0 at the point γ (previously described). The first pulse circulation circuit 2 of the system A and the second pulse circulation circuit 3 of the system B also have the same configuration as the system C and the system D. Accordingly, the linearity of the A/D conversion data becomes favorable in the same manner.

TAD (A/D conversion time), which is a time, at which a difference of the circulation numbers of the ring delay lines operating as the third pulse circulation circuit 4 and the fourth pulse circulation circuit 5 becomes Y, can be expressed by Equation (18).

$$\begin{aligned} TAD &= Y/(y - y') \quad (18) \\ &= Y/((1/2) \cdot (B1 + B2 + B3 + B4) \cdot \Delta x) \end{aligned}$$

Also in ring delay lines which operate as the first pulse circulation circuit 2 and the second pulse circulation circuit 3, when the power supply voltage of the ring delay line which operates as the second pulse circulation circuit 3 of the system B increases by $\Delta x AB$, the power supply voltage of the ring delay line, which operates as the first pulse circulation circuit 2 of the system A decreases by $\Delta x AB$. When the power supply voltages to the pulse circulation circuits 2 and 3 of the system A and the system B become equal, the power supply voltage is given by the reference voltage xref. Therefore, as is the case with the systems C and D, Equation (17) holds true except that the analog input voltage Vin is used in lieu of the set voltage Vset.

When the ring delay lines a to d are made to start a pulse circulating operation at the same time, difference of the circulation number YAB of the ring delay lines, which operate as the first pulse circulation circuit 2 and the second pulse circulation circuit 3 at the time TAD elapsed, can be expressed by Equation (19). $\Delta x AB$ is a difference voltage Vin–xref of the analog input voltage Vin and the reference voltage xref in the systems A and B.

$$\begin{aligned} YAB &= (1/2) \cdot (B1 + B2 + B3 + B4) \cdot \Delta xAB \cdot TAD \quad (19) \\ &= (\Delta xAB / \Delta x) \cdot Y \end{aligned}$$

Equation (19) indicates that the coefficients A1 to A4, B1 to B4, which have temperature characteristics, have disappeared, and that there is no temperature characteristics in the produced A/D conversion data YAB. That is, Equation (19) means that the A/D conversion data without temperature dependence can be produced, by detecting a point of time when a difference of the circulation number y–y' per unit time of the ring delay lines, which operate as the third pulse circulation circuit 4 and the fourth pulse circulation circuit 5, becomes equal to the specified value Y, and by acquiring the difference of the circulation number YAB of the ring delay lines, which operate as the first and the second pulse circulation circuit at that time.

According to the present embodiment, in one cycle of the A/D conversion, the first ring delay line a to the fourth ring delay line d operate in each position of the first pulse circulation circuit 2 to the fourth pulse circulation circuit 5 for the equal time, respectively. Therefore, even when variations exist in the characteristics of the ring delay lines a to d, the characteristics in each arrangement are equalized and the offset temperature characteristics and the sensitivity temperature characteristics can be reduced. As an alternative, one cycle may be divided by (number of ring delay lines×M), namely, into intervals of every 1/(4M) cycle, and the above-described rotation (four switching operations) may be repeated M times (M=1, 2- - - ) in one A/D conversion period. In this way, a still higher equalization effect is produced by increasing the number of intervals.

Embodiment 12

Embodiment 12 is described with reference to FIG. 26 to FIG. 31. In the present application, as seen from FIG. 28, an A/D conversion time and a sampling period are matched. Accordingly, a reciprocal of the A/D conversion time becomes a sampling frequency. The same applies to other embodiments.

Figure 31A:
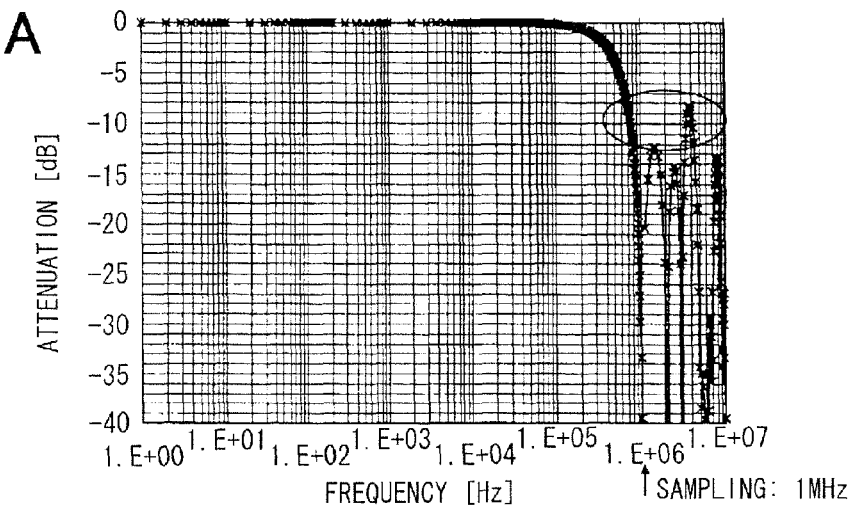
FIG. 31($a$), FIG. 31($b$), and FIG. 31($c$) illustrate filter characteristics of an A/D converter circuit.
Figure 31B:
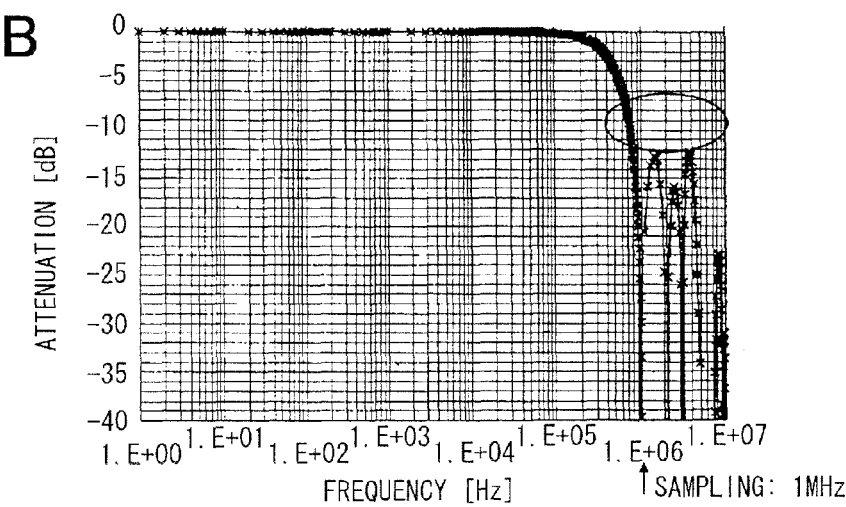
Figure 31C:
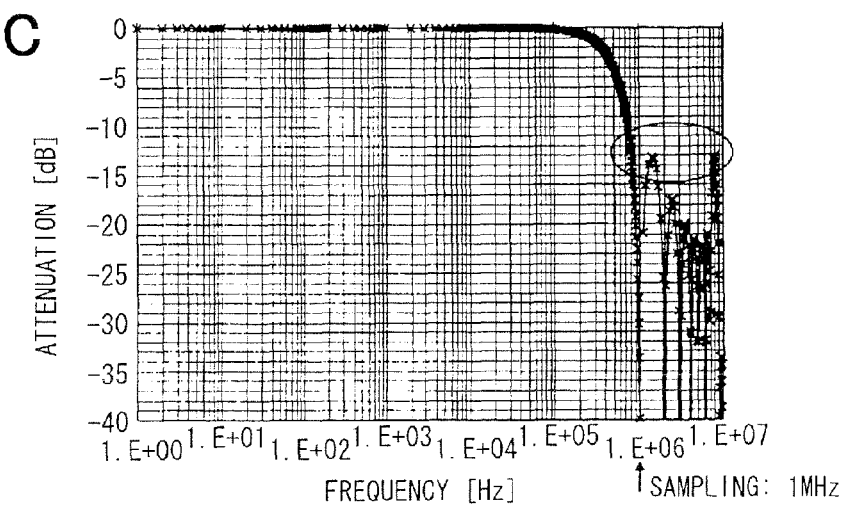

The A/D converter circuit of the TAD system described above has an integration effect in conversion time, namely, a filter effect through moving average. Therefore, when A/D conversion of an analog input voltage Vin is repeated at a predetermined sampling frequency (for example, 1 MHz), a tendency of attenuation (filter effect) is seen at frequencies of one-tenth or more of the sampling frequency (refer to FIG. 31(a)). It is expected that this filter effect contributes to removal or simplification of an anti-aliasing filter. FIG. 31(a), FIG. 31(b), and FIG. 31(c) illustrate estimation of the filter effect.

On the other hand, in order to reduce a conversion error due to a temperature change, instead of performing the circulation operation only for a fixed time as in the previously existing technology, each of the A/D converter circuits described above performs the circulation operation, with the set voltage Vset supplied to the systems C and D, until a difference of the pulse circulation numbers of the third pulse circulation circuit 4 and the fourth pulse circulation circuit 5 reaches the specified value Y. Therefore, an A/D conversion time changes with temperature. Accordingly, when A/D conversion is performed repeatedly at a constant frequency, the longest A/D conversion time is predicted based on the range of an analog input voltage Vin, a set voltage Vset, and the range of temperature change, and the conversion cycle longer than the predicted longest A/D conversion time is set up.

However, when A/D conversion is performed at a fixed sampling frequency in this way, a period when A/D conversion is not performed will occur in each conversion cycle, producing a latency time (break) between one A/D conversion process and next A/D conversion process. Even in cases where one cycle of A/D conversion is divided into from the first interval to the fourth interval and where arrangement of the first ring delay line a to the fourth ring delay line d relative to the first pulse circulation circuit 2 to the fourth pulse circulation circuit 5 is switched for every interval, a latency time (break) longer than a mere switching time of the arrangement occurs between intervals.

Since a moving average operation in the A/D conversion process is suspended by this break, deterioration of the filter effect by the A/D converter circuit occurs. In FIG. 31(a), the amount of attenuation (absolute value) is reduced in a portion enclosed with an ellipse. A/D conversion circuits 141 and 142 according to the present embodiment have two sets of the first counter 20 and the second counter 21 so that a break does not occur in each conversion cycle (that is, a moving average operation is performed continuously), and perform two A/D conversion in parallel to mutually shifted timing in each conversion cycle. Alternatively, as described in Embodiment 11, one cycle of the A/D conversion is divided into from the first interval to the fourth interval and the arrangement of the first ring delay line a to the fourth ring delay line d is switched. After the elapse of a stabilization time after the switching, the A/D conversion shifts to the next operation.

Figure 26:
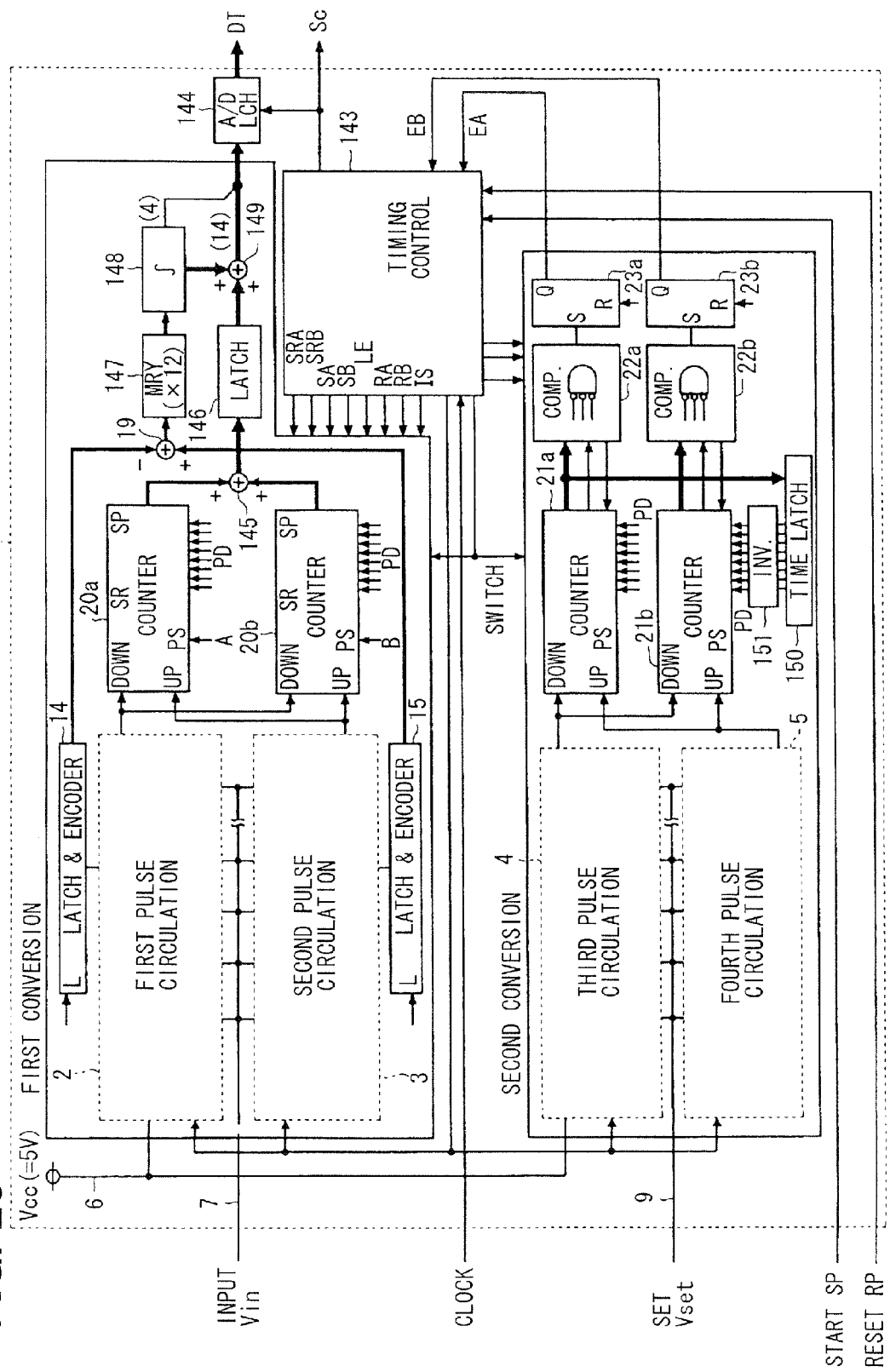
FIG. 26 is a circuit diagram illustrating Embodiment 12 in a similar manner as FIG. 1.
Figure 27:
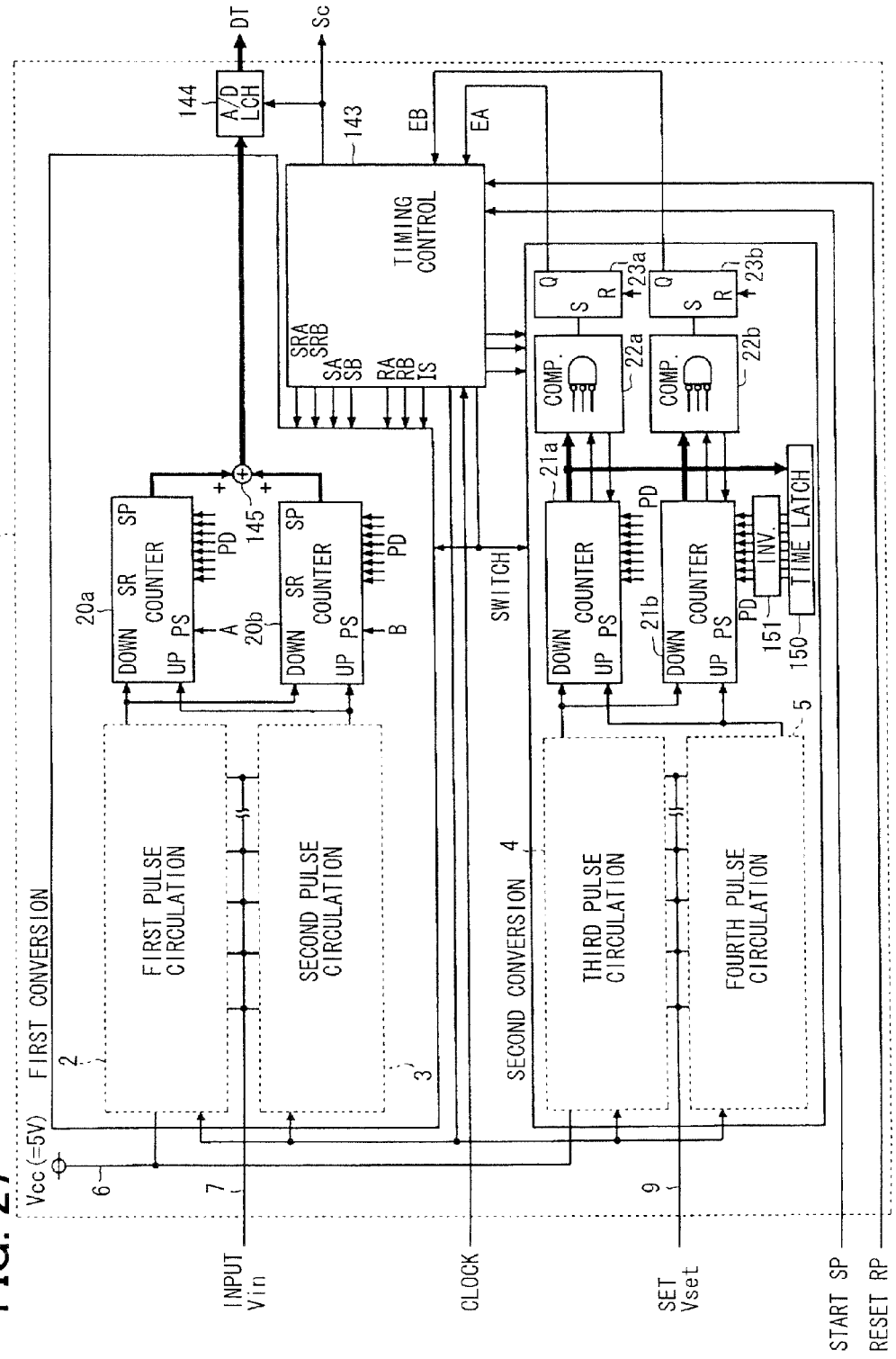
FIG. 27 illustrates an entire configuration of an A/D converter circuit without a latch and encoder.

FIG. 26 and FIG. 27 illustrate entire configuration of the A/D converter circuits 141 and 142. A difference between both configurations is existence or non-existence of the latch and encoders 14 and 15 and the pertaining elements thereof. The A/D converter circuit 142 performs operation without the position data of a circulating pulse, compared with the A/D converter circuit 141. Accordingly, the following explains the configuration illustrated in FIG. 26.

The A/D converter circuit 141 is configured with a first converter including the first pulse circulation circuit 2 and the second pulse circulation circuit 3 (systems A and B), a second converter including the third pulse circulation circuit 4 and the fourth pulse circulation circuit 5 (systems C and D), a timing control circuit 143, and an A/D value latch 144. Signals inputted to the A/D converter circuit 141 from the exterior are a reset pulse RP, a start pulse SP, and an external clock. In the interior of the first converter and the second converter illustrated in FIG. 26, a specific configuration of the pulse circulation circuits 2 to 5, the level shift circuits 10 to 13, 16, and 17, and various signal lines from the timing control circuit 143 are omitted.

The first converter and the second converter are provided with two first counters 20a and 20b and two second counters 21a and 21b, respectively, so that A/D conversion can be performed in parallel. The configuration of these counters 20a, 20b, 21a, and 21b is the same as the configuration illustrated in FIG. 4. In the following description, the first counter 20a and the second counter 21a, which operate in a pair, may be called a counter A collectively, and the first counter 20b and the second counter 21b may be called a counter B collectively.

In the first converter, an output signal of the second pulse circulation circuit 3 is inputted to a count-up input terminal of each of the first counters 20a and 20b via an output level shift circuit (not shown), and an output signal of the first pulse circulation circuit 2 is inputted to a count-down input terminal via an output level shift circuit (not shown). Stop signals SA and SB, stop release signals SRA and SRB, reset signals RA and RB, outputted from the timing control circuit 143, are inputted to a stop terminal SP, a stop release terminal SR, and a preset terminal PS of each of the first counters 20a and 20b, respectively.

When a latch signal for the latch and encoders is outputted from the timing control circuit 143, the subtractor 19 subtracts the position data outputted by the latch and encoder 14 from the position data outputted by the latch and encoder 15, and stores the subtraction value in a memory 147, which is a storage means. The number of the data stored in the memory 147 is 12 pieces when one cycle of A/D conversion is formed of four intervals (refer to FIG. 28) and 24 pieces when one cycle of A/D conversion is formed of eight intervals (refer to FIG. 30). The memory 147 may be replaced with a latch or other storage circuits.

When an integration start signal IS is outputted from the timing control circuit 143, an adder 145 adds count values outputted by the counters 20a and 20b, and outputs the result to a higher-order bit latch 146. A fraction integrating circuit 148 performs an integration operation based the position data stored in the memory 147, and calculates a carry (positive value) or a borrow (negative value) to the higher-order bits (data of the circulation number), and the lower-order bits. An adder 149 adds the data of the circulation number from the higher-order bit latch 146 and a carry (positive value) or a borrow (negative value) from the fraction integrating circuit 148, and sets the result as the higher-order 14 bits of the A/D conversion data, and also sets the lower-order bits from the fraction integrating circuit 148 as the lower-order 4 bits of the A/D conversion data. The present 18-bit A/D conversion data is held at the A/D value latch 144 in response to a conversion completion signal.

On the other hand, in the second converter, comparators 22a and 22b and RS flip-flops 23a and 23b are provided, corresponding to the second counters 21a and 21b. When a comparison result signal of an H level indicating all bits zero is outputted from the comparators 22a and 22b, the RS flip-flops 23a and 23b are set and output H-level interval end signals A and B, which correspond to a conversion data output process signal, from the Q outputs thereof. Preset/reset signals A and B outputted from the timing control circuit 143 are inputted to a preset terminal of each of the second counters 21a and 21b, and a reset terminal of each of the RS flip-flops 23a and 23, respectively.

When a wait time latch signal is outputted from the timing control circuit 143, a wait time latch 150 holds an output value of the second counter 21a at that time. In response to the preset/reset signal PRB, the second counter 21b presets all the bits of the count value held at the wait time latch 150, after reversing them by an inversion circuit 151. On the other hand, in response to the preset/reset signal PRA, the second counter 21a presets a value (¼ of the specified value Y) set in a ROM (not shown), or data of all bits one.

Next, operation of the present embodiment is described with reference to FIG. 28 to FIGS. 31(a), 31(b) and 31(c).

Figure 28:
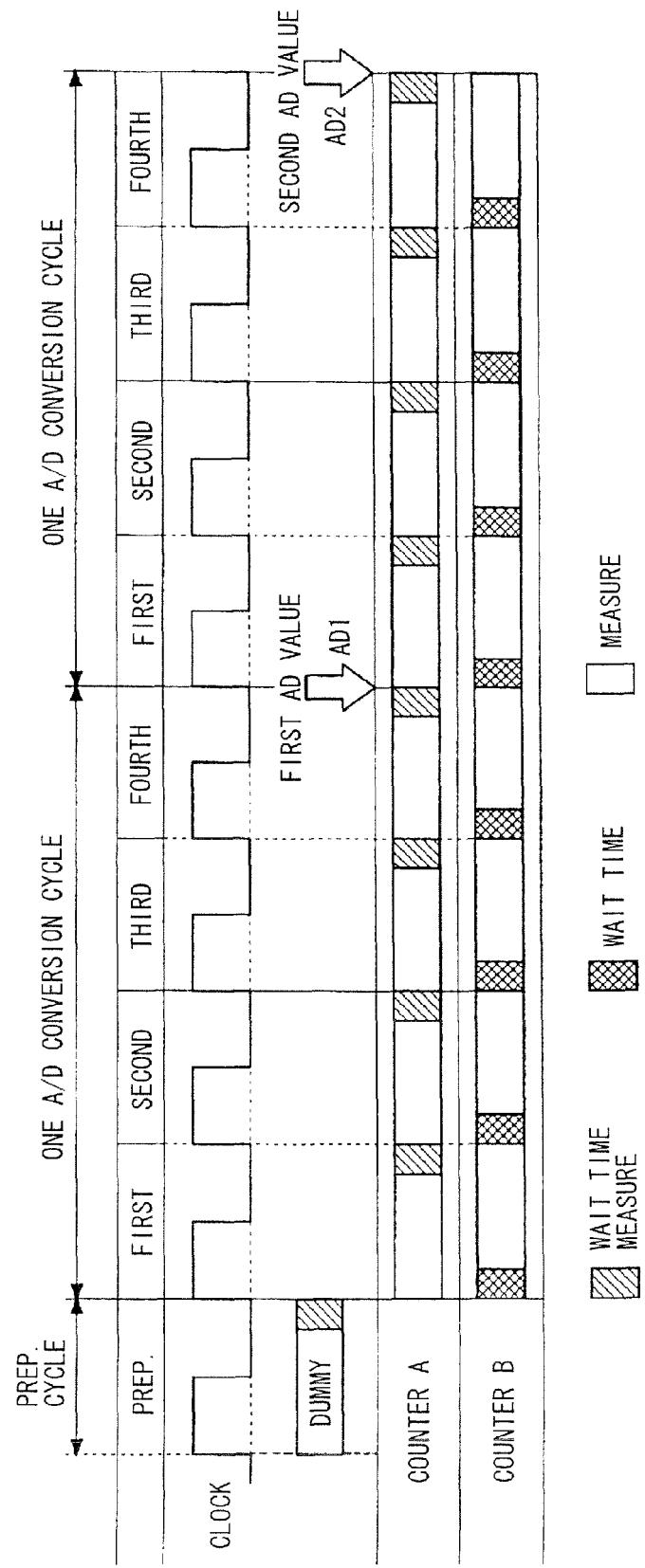
FIG. 28 illustrates a schematic timing chart of A/D conversion in the case of dividing one cycle into four intervals.

FIG. 28 illustrates a schematic timing chart of the A/D conversion. One cycle of the A/D conversion is divided into four intervals, that is, from the first interval to the fourth interval, each having a ¼-cycle width. As is the case with Embodiment 11, each interval differs in arrangement of the first ring delay line a to the fourth ring delay line d relative to the first pulse circulation circuit 2 to the fourth pulse circulation circuit 5. The ring delay lines a to d operate for an equal period of time as the pulse circulation circuits 2 to 5, respectively. Switching of the interval is performed in synchronization with a rising of an external clock with a constant period.

As described above, width of each interval, namely, the cycle of the external clock, is set so as to be longer than ¼ of a conversion cycle which is set longer than the longest A/D conversion time assumed, that is, a time TAD/4 that the second counter 21a counts actually the specified value Y/4 in one A/D conversion. Therefore, one interval has a time width of TAD/4, and is given by the sum of the measuring time and the remaining wait time, the measuring time being a time required for the counter 21a to perform up/down-count of a circulating pulse from the systems C and D by the specified value Y/4.

The second counter 21a performs the up/down-count of the circulating pulse from the systems C and D even in a wait time, and measures the wait time. Since a wait time varies due to a temperature change, the wait time is measured for every interval in the present embodiment. However, a wait time, which is required at a start of the first interval is measured using one cycle of the external clock prior to the start of A/D conversion (prior interval).

In each interval, by shifted execution of the count operation of the specified value Y/4 using the counter A and the count operation of the specified value Y/4 using the counter B, a break (a suspended period of a moving average operation in the A/D conversion process) is prevented from taking place. That is, the count operation ("measurement" in the figure) of the specified value Y/4 using the counter A related to the A/D conversion process is started at the start time of an interval, which is a rising time of the external clock, and the count operation ("measurement" in the figure) of the specified value Y/4 using the counter B related to the A/D conversion process is started at a time when a wait time has elapsed since the start time of the interval. The count operation using the counter B ends at the start time of the next interval.

The counter A performs the up/down-count of a circulating pulse from the systems C and D from an end time of the count operation of the specified value Y/4 before a start time of the next interval, and holds temporarily the count value in the wait time latch 150 as a wait time count value. The counter B starts the count operation of the specified value Y/4 related to an A/D conversion process in the next interval concerned, from a time when the counter B has counted a circulating pulse from the systems C and D by the wait time count value. However, in the prior interval before the A/D conversion starts, the count operation of the specified value Y/4 using the counter A is performed as a dummy operation for producing a measurement start time of the wait time.

A/D conversion data DT is produced by adding A/D conversion data based on the count value of the counter A and a difference of the values of the latch and encoders 14 and 15, and A/D conversion data based on the count value of the counter B and a difference of the values of the latch and encoders 14 and 15. Accordingly, compared with each of the embodiments described above, a valid bit will increase by one bit as a matter of fact. It is also preferable to calculate a mean value by halving the added data.

Figure 30:
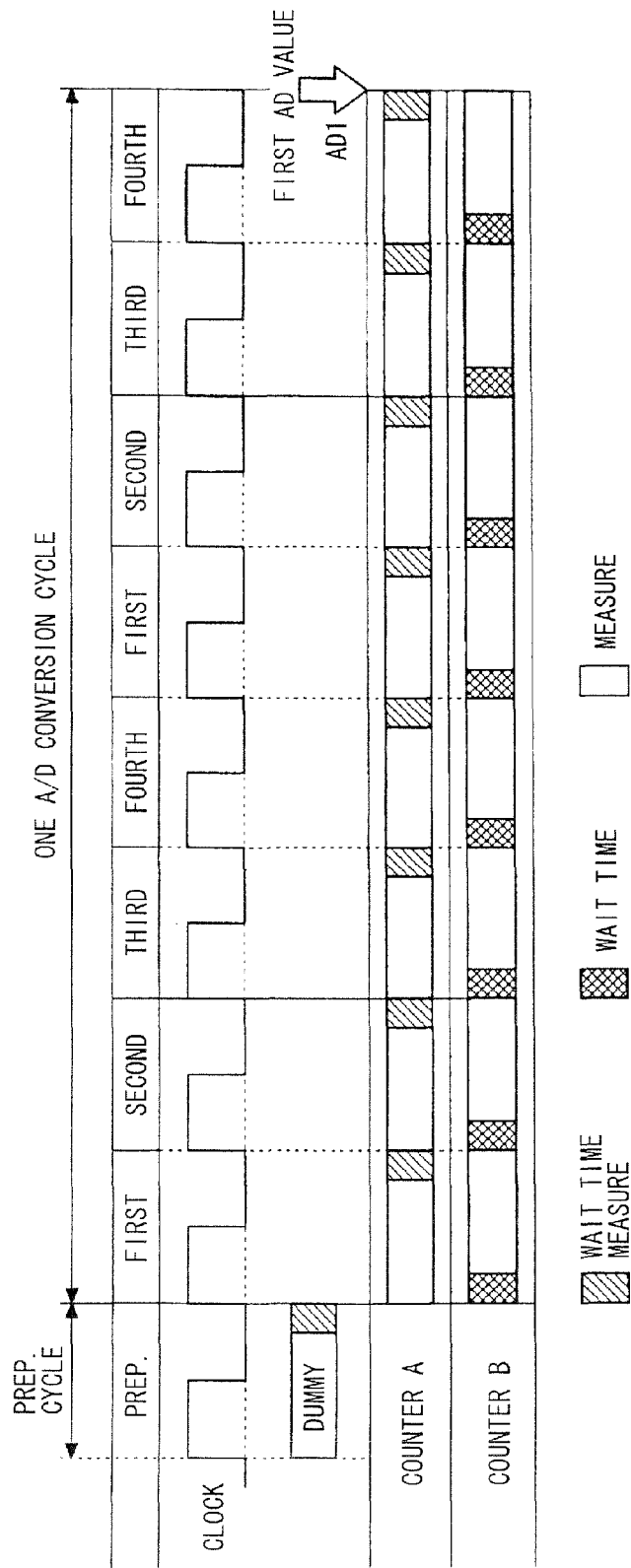
FIG. 30 illustrates a schematic timing chart of A/D conversion in the case of dividing one cycle into eight intervals.

FIG. 30 illustrates also a schematic timing chart of A/D conversion. In this case, in one cycle of the A/D conversion, from a first interval to a fourth interval each having a ⅛-cycle width are repeated twice. In the following, the A/D conversion based on the system illustrated in FIG. 28 is described in detail.

Figure 29:
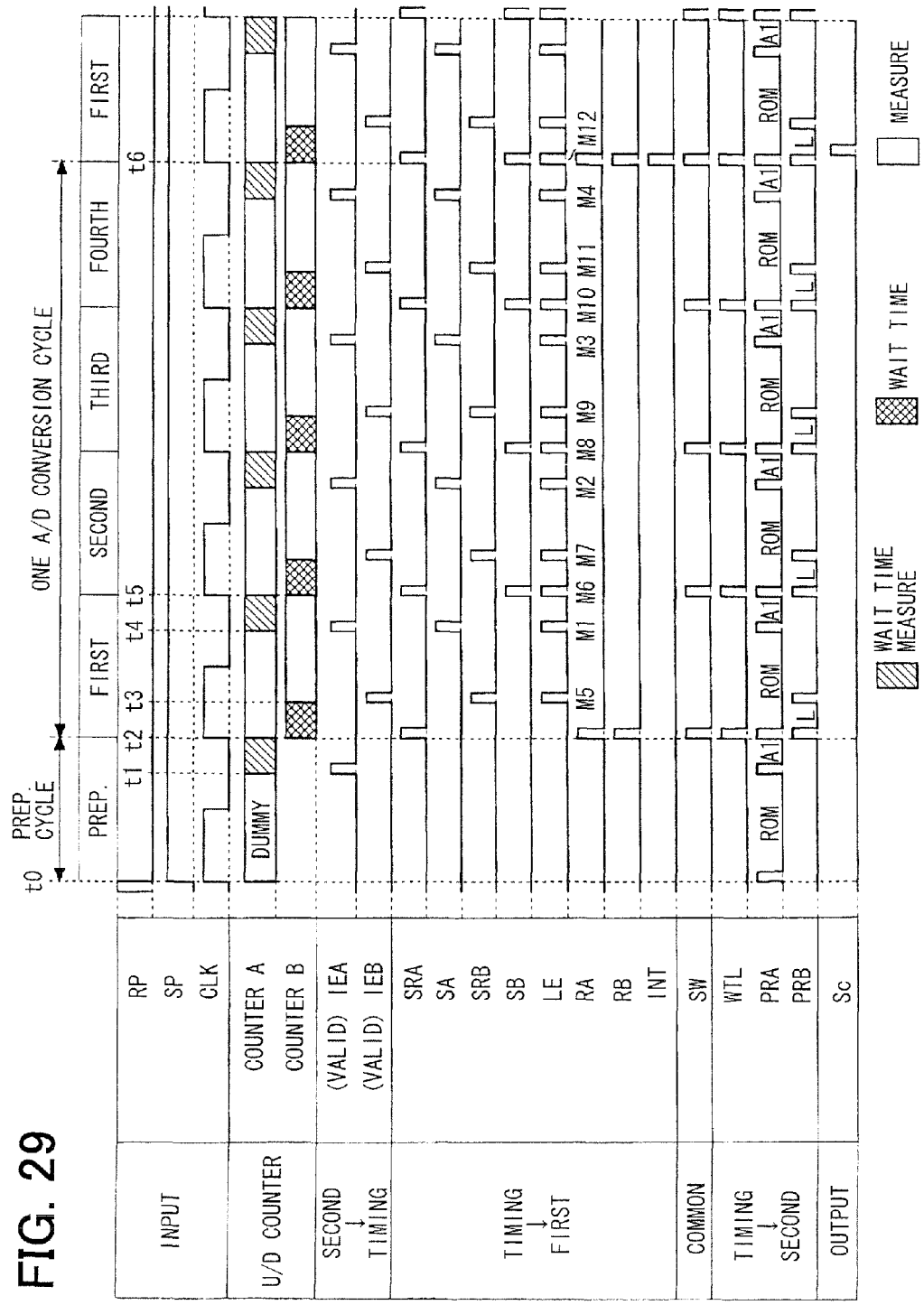
FIG. 29 illustrates a detailed timing chart of A/D conversion in the case of dividing one cycle into four intervals.

FIG. 29 illustrates a detailed timing chart of the A/D conversion. The A/D conversion is started at time t0 by an input of a reset pulse RP and an input of a start pulse SP following it. In one cycle of the A/D conversion, the counters 20a and 20b of the first converter respectively stop a count in response to stop signals SA and SB, and start a count in response to stop release signals SRA and SRB. In both of the counters 20a and 20b, after the count value is preset to zero at time t2, the count value is not preset nor reset until time t6 at which the A/D conversion ends. Presetting of the count value to zero is performed in response to reset signals RA and RB.

Since a stop signal SP and a stop release signal SR are not inputted, the second counters 21a and 21b continue a count operation through the whole period. When an output value of the second counters 21a and 21b becomes all bits zero, the RS flip-flops 23a and 23b are set and output interval end signals IEA and IEB of an H level (a signal equivalent to the conversion data output process signal Sa described in each of the embodiments described above). However, it is assumed that the timing control circuit 143 considers that the interval end signals EA and EB for the first time are valid, during a period from a rising of the external clock to the next rising. The external clock and the valid (the first time) interval end signal serve as a trigger of each operation.

(1) Time t0 (Prior Wait Time Measurement)

After the reset pulse RP is inputted, the start pulse SP and a rising of the external clock are inputted at the same time. The timing control circuit 143 generates a preset/reset signal PRA, PRB for the second converter in response to the rising of the external clock. Accordingly a value set in a ROM (not shown) is preset to the counter 21a of the second converter, and the counter 21a starts a dummy up/down-count. The RS flip-flop 23a is also reset at this time. A value of ¼ of the specified value Y is stored in the ROM in advance.

(2) Time t1 (Prior Wait Time Measurement)

When the counter 21a of the second converter reaches zero, the RS flip-flop 23a outputs the interval end signal IEA. The timing control circuit 143 outputs the preset/reset signal PRA for the second converter in response to the interval end signal IEA. The second counter 21a performs succeedingly an up/down-count for the measurement of the wait time. The RS flip-flop 23a is reset at this time.

The preset value according to the preset/reset signal PRA is set as all bits one (A1) in preparation for use of the count value concerned in the next first interval. That is, the count value concerned of the second counter 21a is counted by the counter 21b as the wait time from the start time in the next first interval, and when all the bits of counter 21b are set to zero, the interval end signal IEB is outputted. For that purpose, it is necessary to preset a two's complement of the count value concerned at the counter 21b at the start time of the first interval.

What is necessary to make a two's complement is to set the preset value according to the preset/reset signal PRA as all bits one (i.e. −1), and to preset the count value concerned to the second counter 21b, after reversing all the bits by the inversion circuit 151 in the next first interval. However, when the present embodiment is applied to Embodiment 3 or Embodiment 6, since it is not necessary to convert into a two's complement, the preset value according to the preset/reset signal PRA is set to zero, and disables operation of the inversion circuit 151.

(3) Time t2 (Start of A/D Conversion)

The timing control circuit 143 outputs a wait time latch signal to the second converter first in response to a rising of the external clock. Accordingly, the count value of the counter 21a of the second converter is held at the wait time latch 150. Next, the timing control circuit 143 outputs a position switching signal and performs rotation of the ring delay lines a to d relative to the pulse circulation circuits 2 to 5.

The timing control circuit 143 outputs further a stop release signal SRA, a reset signal RA, and a reset signal RB for the first converter, and a preset/reset signal PRA and a preset/reset signal PRB for the second converter. The counter 21a of the second converter presets a value (a value of ¼ of the specified value Y) set at the ROM in response to the preset/reset signal PRA, and continues the count. The counter 20a of the first converter presets the count value to zero in response to the reset signal RA, and starts an up/down-count of a circulating pulse related to the A/D conversion process, in response to the stop release signal SRA.

On the other hand, the counter 21b of the second converter presets a whole-bit-reversed value of a value held in the wait time latch 150, in response to the preset/reset signal PRB, and starts a count. The counter 20b of the first converter resets the count value in response to the reset signal RB, but the counting is kept stopped. The RS flip-flops 23a and 23b are also reset in response to the preset/reset signals PRA and PRB.

(4) Time t3 (End of Wait Time)

When an output value of the counter 21b of the second converter becomes all bits zero, an interval end signal IEB is outputted. The timing control circuit 143 outputs a latch signal L for latch and encoders in response to the interval end signal IEB, and stores a difference of values of the latch and encoders 14 and 15 to the memory 147 as a memory value 5 (M5). The timing control circuit 143 outputs also a stop release signal SRB for the first converter and a preset/reset signal PRB for the second converter.

The counter 20b of the first converter starts an up/down-count of a circulating pulse related to the A/D conversion process in response to the stop release signal SRB. This count continues up to the next rising of the external clock. The counter 21b of the second converter presets a whole-bit-reversed value of a value held in the wait time latch 150 in response to the preset/reset signal PRB, and continues the count.

However, the first counter 20b continues performing count not until the occurrence of the interval end signal IEB but until the start of the next second interval (this period is equal to a period when the second counter 21b counts the specified value Y/4). Accordingly the preset value becomes as dummy data. Since the difference of the preset value and zero is small, another interval end signal IEB is generated in a period from the present time till time t5 (not shown). However, the another interval end signal IEB is ignored by the arrangement of the valid interval end signal IEA described above. The RS flip-flop 23b is also reset in response to the preset/reset signal PRB.

(5) Time t4 (End of Measurement by Counter A)

When an output value of the counter 21a of the second converter becomes all bits zero, an interval end signal IEA is outputted. The timing control circuit 143 outputs a stop signal SA for the first converter in response to the interval end signal IEA, and stops a count of the counter 20a of the first converter. The timing control circuit 143 outputs also a latch signal L for latch and encoders, and stores a difference of values of the latch and encoders 14 and 15 to the memory 147 as a memory value 1 (M1).

The timing control circuit 143 outputs also the preset/reset signal PRA for the second converter. The second counter 21a performs an up/down-count for the measurement of the wait time, until the next rising of the external clock. The preset value at this time is all bits one, as described in (2). Since the difference of the preset value and zero is small, another interval end signal IEA is generated in a period from the present time till time t5 (not shown). However, the interval end signal IEA is ignored by the arrangement of the valid interval end signal IEAs described above. The RS flip-flop 23a is also reset in response to the preset/reset signal PRA.

(6) Time t5 (End of Measurement by Counter B)

The timing control circuit 143 outputs a stop signal SB for the first converter in response to a rising of the external clock, and stops the count of the counter 20b of the first converter. The timing control circuit 143 outputs also a latch signal L for latch and encoders, and stores a difference of values of the latch and encoders 14 and 15 to the memory 147 as a memory value (M6). The timing control circuit 143 outputs further a wait time latch signal to the second converter, and the count value of the counter 21a of the second converter is held in the wait time latch 150. Next, the timing control circuit 143 outputs a position switching signal and performs rotation of the ring delay lines a to d relative to the pulse circulation circuits 2 to 5.

The timing control circuit 143 outputs a stop release signal SRA for the first converter and a preset/reset signal PRA and a preset/reset signal PRB for the second converter. The counter 21a of the second converter presets a value (a value of ¼ of the specified value Y) set at the ROM in response to the preset/reset signal PRA, and continues the count. The counter 20a of the first converter starts an up/down-count of a circulating pulse related to the A/D conversion process in response to the stop release signal SRA. The counting of the counter 20b of the first converter is kept stopped.

On the other hand, the counter 21b of the second converter presets a whole-bit-reversed value of a value held in the wait time latch 150, in response to the preset/reset signal PRB, and continues the count. The RS flip-flops 23a and 23b are also reset in response to the preset/reset signals A and B. Subsequently, switching of the arrangement is repeated until the end of the A/D conversion (time t6). Since the similar operations are repeated, the description thereof is omitted.

(7) Time t6 (End of A/D Conversion)

The timing control circuit 143 outputs a stop signal SB for the first converter in response to a rising of the external clock, and stops a count of the counter 20b of the first converter. The timing control circuit 143 outputs also a latch signal for latch and encoders, and stores a difference of values of the latch and encoders 14 and 15 to the memory 147 as a memory value 12.

The timing control circuit 143 outputs further a wait time latch signal to the second converter, and the count value of the counter 21a of the second converter is held in the wait time latch 150. In preparation for a start of the next A/D conversion, the timing control circuit 143 outputs a position switching signal to perform rotation of the ring delay lines a to d relative to the pulse circulation circuits 2 to 5.

As described in (3), the timing control circuit 143 outputs a stop release signal SRA, a reset signal RA, and a reset signal RB for the first converter, and a preset/reset signal PRA and a preset/reset signal PRB for the second converter. Accordingly, the counter 20a of the first converter starts a count operation. The counters 21a and 21b of the second converter continue the count always as described above.

The timing control circuit 143 outputs an integration start signal. At this time, the sum of the counters 20a and 20b of the first converter is held in the higher-order bit latch 146. On the other hand, as for the lower-order bits, a difference of values of the latch and encoders 14 and 15 (difference data; a difference of position data) is stored in the memory 147 at the start time and the end time of an up/down-count of a circulating pulse related to the A/D conversion process by the counters 20a and 20b of the first converter (that is, the count of the specified value Y/4 by the counters 21a and 21b of the second converter; described as "measurement" in FIG. 29). However, since the pulse position of each of the ring delay lines a to d immediately after the switching of arrangement is set as an initial position, it is not necessary to store the difference data at the start time of the measurement by the counter 20a.

Memory value 1: Difference data at the end of the measurement by the counter 20a in the first interval
Memory value 2: Difference data at the end of the measurement by the counter 20a in the second interval
Memory value 3: Difference data at the end of the measurement by the counter 20a in the third interval
Memory value 4: Difference data at the end of the measurement by the counter 20a in the fourth interval
Memory value 5: Difference data at the start of the measurement by the counter 20b in the first interval
Memory value 6: Difference data at the end of the measurement by the counter 20b in the first interval
Memory value 7: Difference data at the start of the measurement by the counter 20b in the second interval
Memory value 8: Difference data at the end of the measurement by the counter 20b in the second interval
Memory value 9: Difference data at the start of the measurement by the counter 20b in the third interval
Memory value 10: Difference data at the end of the measurement by the counter 20b in the third interval
Memory value 11: Difference data at the start of the measurement by the counter 20b in the fourth interval
Memory value 12: Difference data at the end of the measurement by the counter 20b in the fourth interval In response to the integration start signal, the fraction integrating circuit 148 calculates total difference data by performing operation of (memory value 1+memory value 2+memory value 3+memory value 4)+(memory value 6−memory value 5)+(memory value 8−memory value 7)+(memory value 10−memory value 9)+(memory value 12−memory value 11), that is, operation of (summation of memory values at the stop)−(summation of memory values at the start), and calculates a carry (positive value) or a borrow (negative value) to the higher-order bits and the lower-order bits.

The adder 149 adds the higher-order data from the higher-order bit latch 146 and a carry (positive value) or a borrow (negative value) from the fraction integrating circuit 148 to the higher-order bits, and sets the result as the higher-order 14 bits of the A/D conversion data. The lower-order bits of the fraction integrating circuit 148 are set as the lower-order 4 bits of the A/D conversion data. When the operation is completed, the timing control circuit 143 outputs a conversion completion signal, and holds the final 18-bit A/D conversion data DT in the A/D value latch 144. This operation can be performed in parallel to other processing, for example, the next A/D conversion process.

The above description is made for a case where one cycle of the A/D conversion is divided into intervals with a ¼-cycle width and the position of the ring delay lines a to d is switched (M=1). As an alternative, one cycle may be divided by (number of ring delay lines×M), namely, into intervals of every 1/(4M) cycle, and the above-described rotation (four switching operations) may be repeated M times (M=2, 3- - - ) in one A/D conversion period. FIG. 30 illustrates a schematic timing chart of A/D conversion in the case of M=2, namely, of dividing one cycle into eight intervals. The operation is the same as that of the case of M=1. When the latch and encoders 14 and 15 are provided, the number of data stored in the memory 147 is 24, as described above.

FIGS. 31(*a*), 31(*b*), and 31(*c*) illustrate filter characteristics with the integration effect of the A/D converter circuit. FIG. 31(*a*) illustrates filter characteristics of an A/D converter circuit, of which one cycle is divided into four intervals in Embodiment 11. FIG. 31(*b*) illustrates filter characteristics of the A/D converter circuit 141, of which one cycle is divided into four intervals in the present embodiment. FIG. 31(*c*) illustrates filter characteristics of the A/D converter circuit 141, of which one cycle is divided into eight intervals in the present embodiment. The repetition frequency (sampling frequency fs) of the A/D conversion is 1 MHz, and the percentage of the measuring time related to the A/D conversion occupied in one cycle of the A/D conversion is 70%.

In the case of FIG. 31(*a*), in which the wait time when the moving average operation is suspended exists 30% of one cycle, the attenuation (absolute value) near 4 MHz is reduced to 8 dB (a portion enclosed with an ellipse in the figure). In the case of FIG. 31(*b*), on the other hand, the attenuation (absolute value) near 4 MHz is improved to 13 dB (a portion enclosed with an ellipse in the figure), in addition, the attenuation (absolute value) is improved also at higher frequencies as a whole. In the case of FIG. 31(*c*), frequency, at which the attenuation (absolute value) of 13 dB is produced, is improved to two times higher (8 MHz) as compared with FIG. 31(*b*). Accordingly, it is understood that a design of an anti-aliasing filter becomes simpler correspondingly. When generalized, if one cycle of the A/D conversion is divided into intervals for every 1/(4M) cycle, frequency at which an attenuation (absolute value) becomes small (−13 dB) will appear at 4M·fs.

As described in the above, the A/D converter circuits 141 and 142 according to the present embodiment are provided with two systems of counters A and B for counting a pulse outputted from the first pulse circulation circuit 2 to the fourth pulse circulation circuit 5. When A/D conversion is repeatedly performed in a constant period, a count operation of a circulating pulse is continued without a break (except for the time of an arrangement change) at least by one of the counters A and B (counters 20a and 20b). Accordingly, the integration effect of the A/D converter circuit of the TAD system, that is, the low pass filter effect produced by the moving average, can be enhanced. Consequently, it is possible to remove or simplify an anti-aliasing filter, and it is possible to reduce a layout area required for the filter in the semiconductor integrated circuit device.

Embodiment 13

Embodiment 13 is described with reference to FIG. 32 to FIG. 37. The present embodiment is a modification of Embodiment 12. Two counters 21a and 21b are provided as the second counter, however, only one counter 163 is provided as the first counter. In order to enhance the low pass filter effect produced by the moving average of the A/D converter circuit with only one first counter, the first counter 163 performs an up/down-count without a break in each interval with a ¼-cycle width, and stops the count temporarily only at the time of switching of intervals.

In a period when only one of the first counters 20a and 20b is performing a count operation in Embodiment 12 (for example, a period of time t2 to time t3 and a period of time t4 to time t5 in FIG. 29), the first counter 163 performs an up-count or a down-count by one when a circulating pulse is inputted (normal counting mode). On the other hand, in a period when both of the first counters 20a and 20b are performing a count operation in Embodiment 12 (for example, a period of time t3 to time t4 in FIG. 29), the first counter 163 performs an up-count or a down-count by two when a circulating pulse is inputted (double counting mode).

Figure 32:
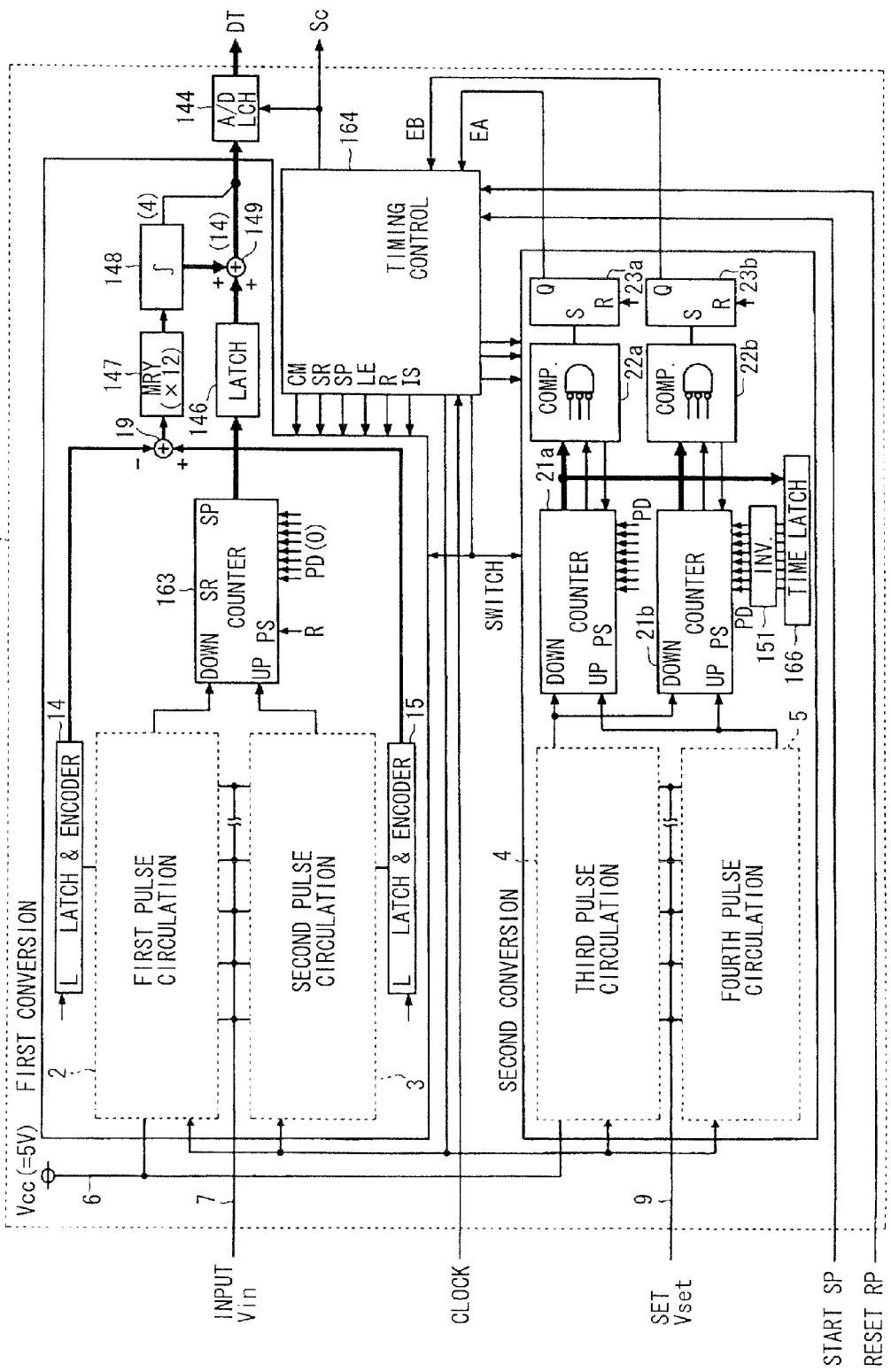
FIG. 32 is a circuit diagram illustrating Embodiment 13 in a similar manner as FIG. 1.
Figure 33:
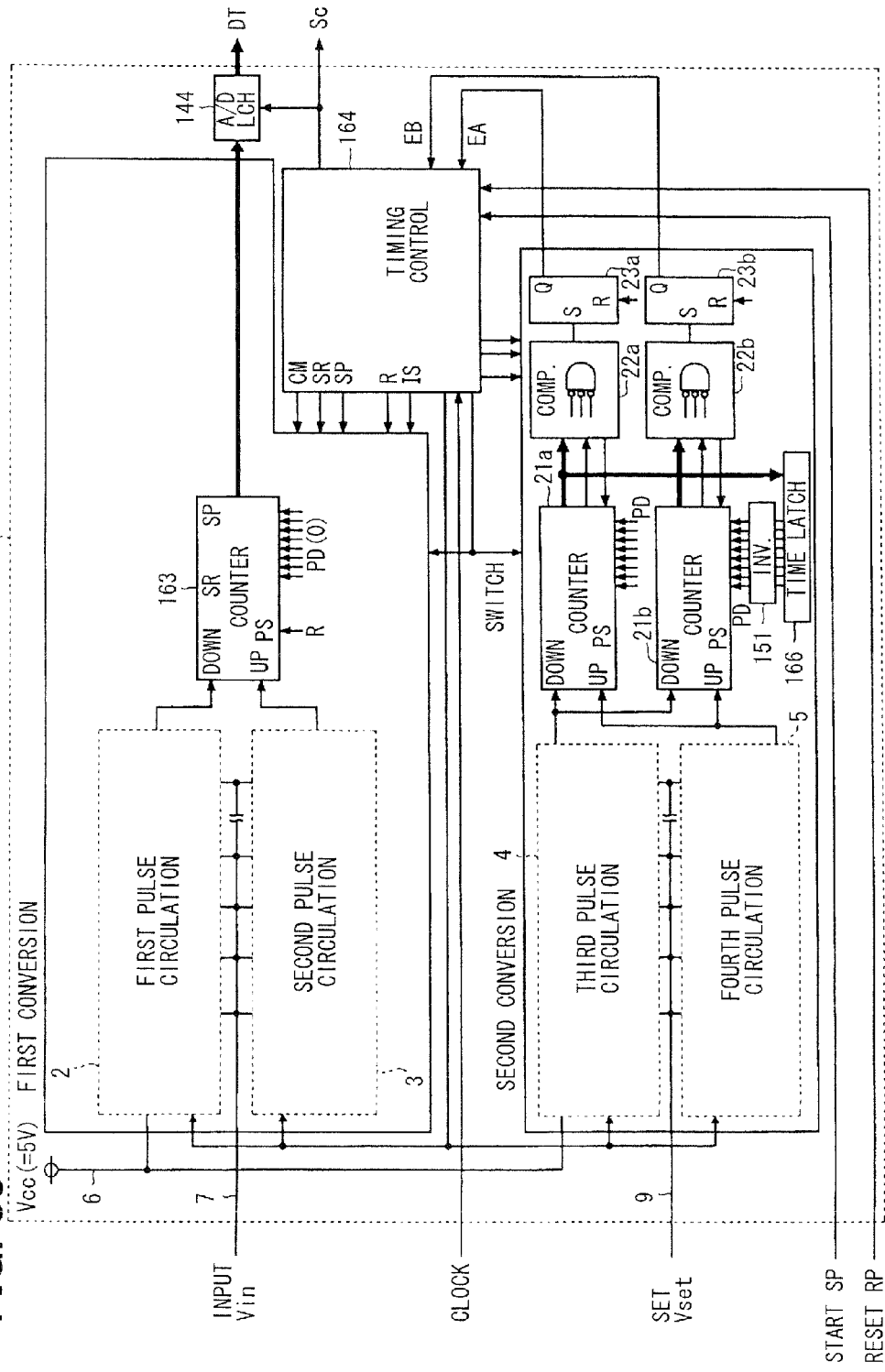
FIG. 33 is a circuit diagram in a similar manner as FIG. 27.

FIG. 32 and FIG. 33 illustrate entire configuration of A/D converter circuits 161 and 162. A difference between both configurations is existence or nonexistence of the latch and encoders 14 and 15 and the pertaining elements thereof. These configurations are different from the A/D converter circuits 141 and 142 illustrated in FIG. 26 and FIG. 27 in the following points: that is, a counter of the first converter is changed to one and an output signal of the timing control circuit 164 is changed correspondingly, and the wait time latch 150 of the second converter is changed to a normal measuring time latch 166.

Figure 34:
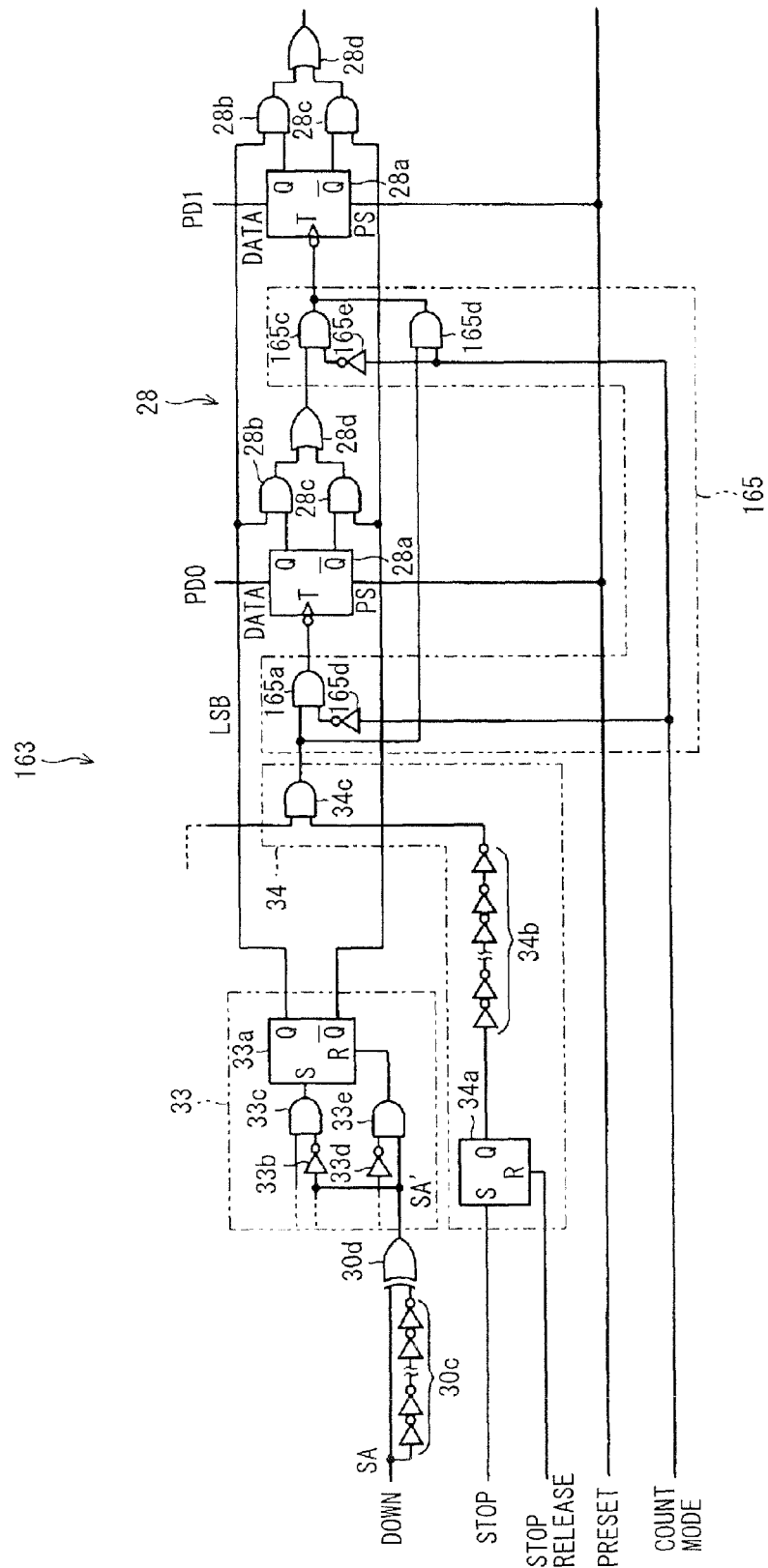
FIG. 34 illustrates a different part from FIG. 4 in the configuration of the first counter.

FIG. 34 illustrates a partial configuration of a first counter 163, with regard to the part which is different from the counter illustrated in FIG. 4. A counting mode switching circuit 165 switches whether a count signal outputted from an AND gate 34c is inputted to a T flip-flop 28a of the first stage (LSB) of a counter unit 28 or to a T flip-flop 28a of the second stage.

An AND gate 165a is provided between the AND gate 34c and the T flip-flop 28a of the first stage. The AND gate 165a is controlled by a counting mode signal, which is reversed by an inverter 165b. A T input terminal of the T flip-flop 28a of the second stage is coupled to an AND gate 165c which inputs a carry signal from the T flip-flop 28a of the first stage, and to an AND gate 165d which inputs a count signal from the AND gate 34c. The AND gate 165c is controlled by the counting mode signal reversed by an inverter 165e, and the AND gate 165d are controlled by the counting mode signal.

When the counting mode signal is at an L level, the AND gates 165a and 165c are set in a through state, and the normal counting mode becomes effective. On the other hand, when the counting mode signal is at an H level, the AND gates 165a and 165c are set in a cut-off state and the AND gate 165d is set in a through state, and the double counting mode becomes effective.

Next, operation of the present embodiment is described with reference to FIG. 35 to FIG. 37.

Figure 35:
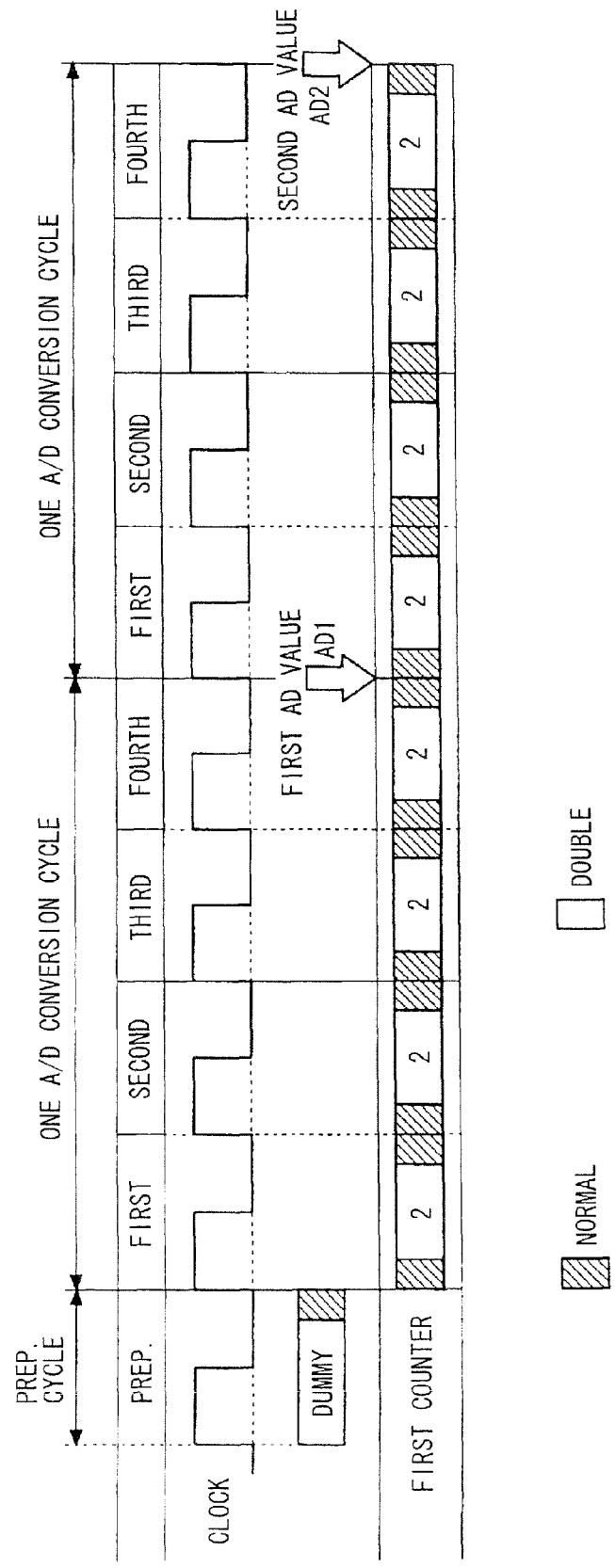
FIG. 35 is a schematic timing chart in a similar manner as FIG. 28.

FIG. 35 illustrates a schematic timing chart of the A/D conversion. One cycle of the A/D conversion is divided into four intervals, that is, from the first interval to the fourth interval, with a ¼-cycle width. As is the case with Embodiment 11, each interval differs in arrangement of the first ring delay line a to the fourth ring delay line d relative to the first pulse circulation circuit 2 to the fourth pulse circulation circuit 5. The ring delay lines a to d operate for an equal period of time as the pulse circulation circuits 2 to 5, respectively. Switching of the interval is performed in synchronization with a rising of an external clock with a constant period.

The width of each interval, namely, the cycle of the external clock, is set longer than ¼ of a conversion cycle which is set longer than the longest A/D conversion time assumed, that is, a time TAD/4 that the second counter 21a counts actually the specified value Y/4 in one A/D conversion. The width of (conversion cycle/4−TAD/4) at the beginning and the end of each interval is a normal measuring time when the first counter 163 operates in the normal counting mode, and the width of (TAD/2−conversion cycle/4) of a central part sandwiched by these two normal measuring times is the double measuring time when the first counter 163 operates in the double counting mode.

The second counter 21a counts a circulating pulse of the systems C and D from the beginning of each interval by the specified value Y/4, and subsequently performs measurement of a normal measuring time (=conversion cycle/4−TAD/4) by performing a count until a start time of the next interval. The count value is held temporarily at the normal measuring time latch 166. Since the normal measuring time is varied by a temperature change, the normal measuring time is measured for every interval in the present embodiment. However, the normal measuring time which is necessary at the start time of the first interval is measured using one cycle of the external clock prior to the start of the A/D conversion (prior interval).

In each interval, the first counter 163 performs an up/down-count without a break in either of the normal counting mode or the double counting mode. Accordingly, a break (a period of a suspended moving average operation in the A/D conversion process) is prevented from taking place. That is, the count operation in the normal counting mode is started from the start time of an interval, which is the rising time of the external clock, and the count operation shifts to the double counting mode from a time when the normal measuring time (=conversion cycle/4−TAD/4) measured in the previous interval has elapsed. When the count operation of the specified value Y/4 by the second counter 21a from a start time of an interval is ended, the count operation shifts to the normal counting mode again.

A/D conversion data DT is data based on a count value of the first counter 163 at the end time of one cycle of the A/D conversion and a difference of values of the latch and encoders 14 and 15. Accordingly, compared with each of the embodiments described above, a valid bit will increase by one bit as a matter of fact. It is also preferable to produce a mean value by halving the count value of the first counter 163.

Figure 37:
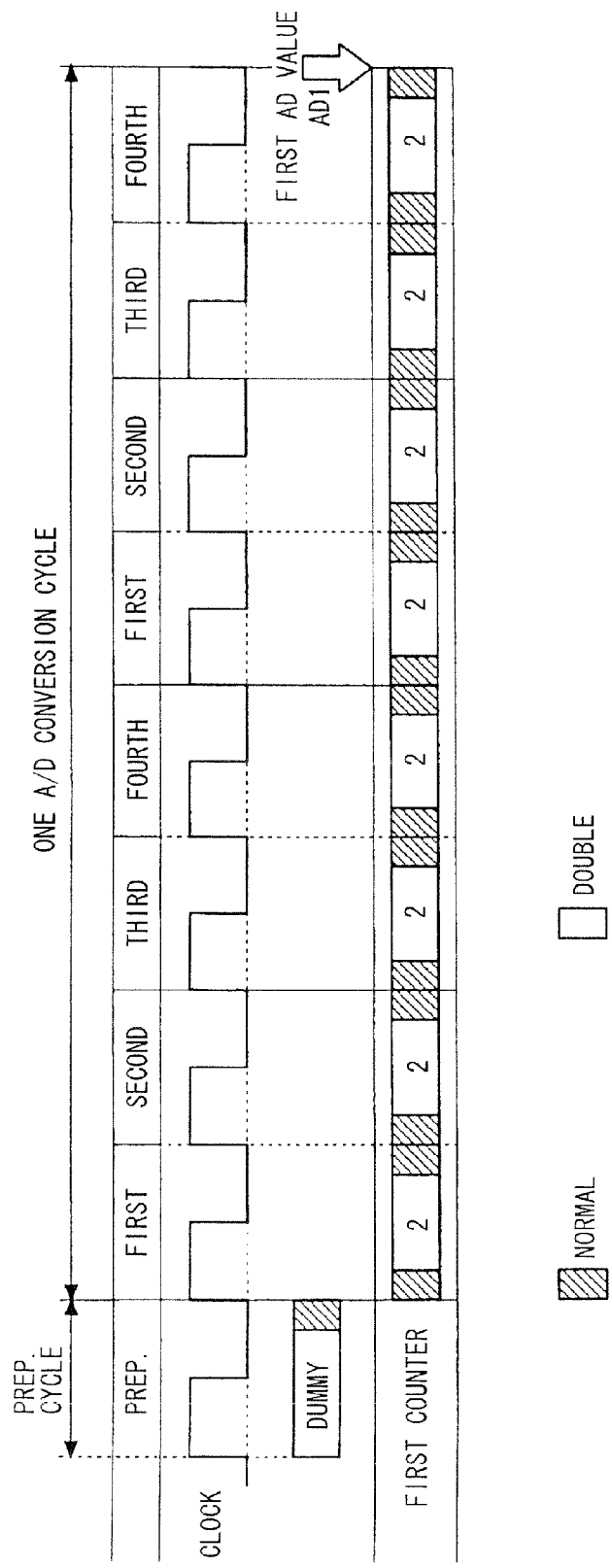
FIG. 37 is a schematic timing chart in a similar manner as FIG. 30.

FIG. 37 illustrates also a schematic timing chart of A/D conversion. In this case, in one cycle of the A/D conversion, from the first interval to the fourth interval each having a ⅛-cycle width are repeated twice. In the following, the A/D conversion based on the system illustrated in FIG. 35 is described in detail.

Figure 36:
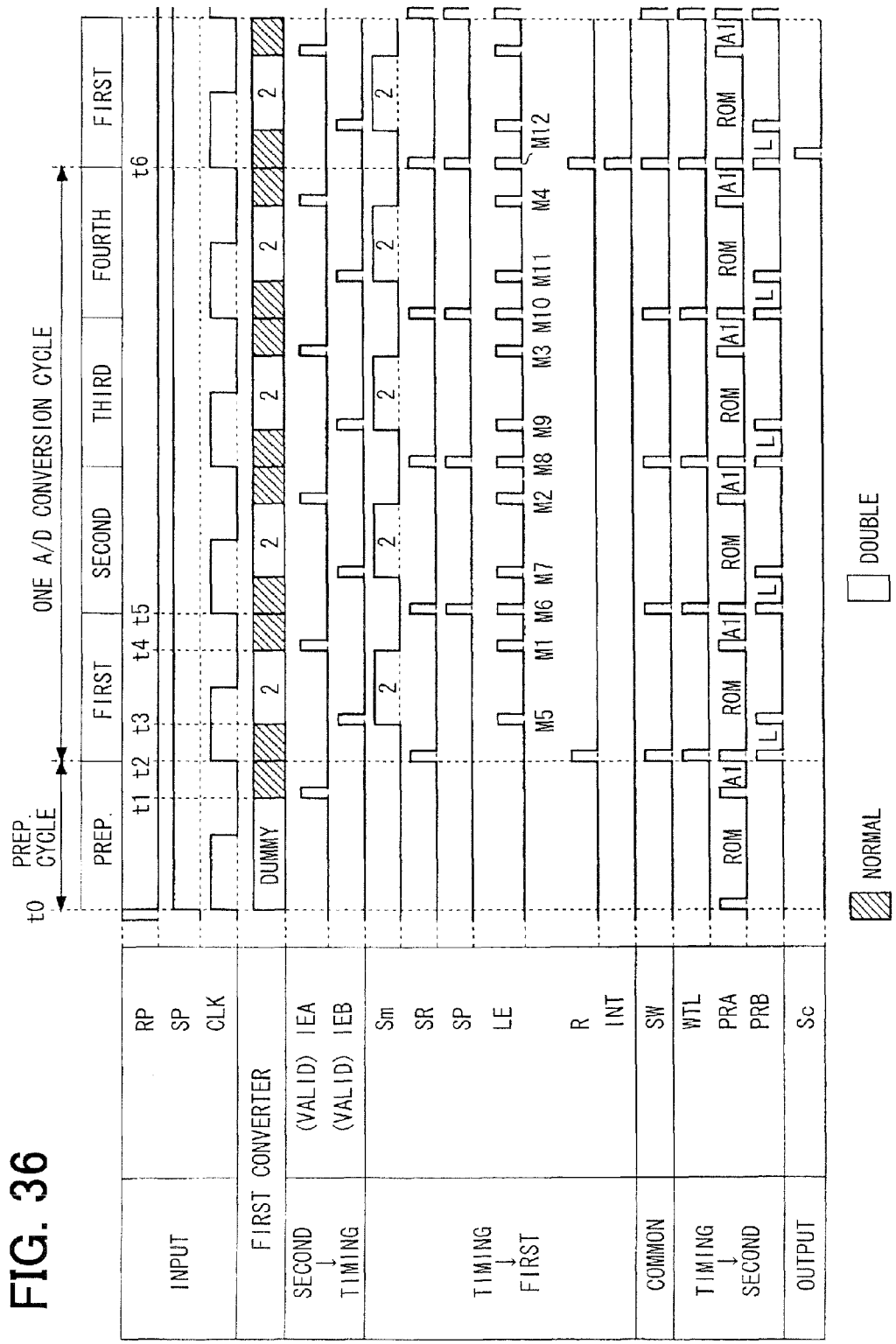
FIG. 36 is a detailed timing chart in a similar manner as FIG. 29.

FIG. 36 illustrates a detailed timing chart of the A/D conversion. The A/D conversion is started at time t0 by an input of a reset pulse RP and an input of a start pulse SP following it. In one cycle of the A/D conversion, the counter 163 of the first converter stops a count in response to a stop signal SP and starts a count in response to a stop release signal SR at the time of changing intervals. After the count value is preset to zero at time t2, the count value is not preset nor reset until time t6 when the A/D conversion ends. Presetting of the count value to zero is performed in response to a reset signal.

Since a stop signal SP and a stop release signal SR are not inputted, the second counters 21a and 21b continue a count operation through the whole period. When the output value of the second counters 21a and 21b becomes all bits zero, the RS flip-flops 23a and 23b are set to output interval end signals A and B of an H level, respectively. However, it is assumed that the timing control circuit 164 considers that the interval end signals IEA and IEB for the first time are effective, during a period from a rising of the external clock to the next rising. The external clock and the effective (the first time) interval end signal serve as a trigger of each operation.

(1) Time t0 (Prior Normal Measuring Time Measurement)

After the reset pulse RP is inputted, the start pulse SP and a rising of the external clock are inputted at the same time. The timing control circuit 164 generates a preset/reset signal PR for the second converter in response to the rising of the external clock. Accordingly a value set in a ROM (not shown) is preset to the counter 21a of the second converter, and the counter 21a starts a dummy up/down-count. The RS flip-flop 23a is also reset at this time. A value of ¼ of the specified value Y is stored in the ROM in advance.

(2) Time t1 (Prior Normal Measuring Time Measurement)

When the counter 21a of the second converter reaches zero, the RS flip-flop 23a outputs the interval end signal IEA. The timing control circuit 164 outputs the preset/reset signal PRA for the second converter in response to the interval end signal IEA. The second counter 21a performs succeedingly an up/down-count for the measurement of the normal measuring time. The RS flip-flop 23a is reset at this time.

The preset value according to the preset/reset signal PRA is set as all bits one in preparation for use of the count value concerned in the next first interval. That is, the count value concerned of the second counter 21a is counted by the counter 21b as the first normal measuring time in the next first interval, and when all the bits of the counter 21b are set to zero, the interval end signal IEB is outputted. For that purpose, it is necessary to preset a two's complement of the count value concerned at the counter 21b at the start time of the first interval.

What is necessary to make a two's complement is to set the preset value according to the preset/reset signal PRA as all bits one (i.e. −1), and to preset the count value concerned to the second counter 21b, after reversing all the bits by the inversion circuit 151 in the next first interval. However, when the present embodiment is applied to Embodiment 3 or Embodiment 6, since it is not necessary to convert into a two's complement, the preset value according to the preset/reset signal PRA is set to 0, and disables operation of the inversion circuit 151.

(3) Time t2 (Start of A/D Conversion)

The timing control circuit 164 outputs a normal measuring time latch signal to the second converter at first in response to a rising of the external clock. Accordingly, the count value of the counter 21a of the second converter is held at the normal measuring time latch 166. Next, the timing control circuit 143 outputs a position switching signal and performs rotation of the ring delay lines a to d relative to the pulse circulation circuits 2 to 5.

The timing control circuit 164 outputs further a stop release signal SRA reset signal R and a counting mode signal Sm of an L level for the first converter, and a preset/reset signal PRA and a preset/reset signal PRB for the second converter. The counter 21a of the second converter presets a value (a value of ¼ of the specified value Y) set at the ROM in response to the preset/reset signal PRA, and continues the count. The counter 163 of the first converter presets the count value to zero in response to the reset signal R and starts an up/down-count of a circulating pulse related to the A/D conversion process in response to a stop release signal in the normal counting mode.

On the other hand, the counter 21b of the second converter presets a whole-bit-reversed value of a value held in the normal measuring time latch 166 in response to the preset/reset signal PRB, and starts a count. The RS flip-flops 23a and 23b are also reset in response to the preset/reset signals A and B.

(4) Time t3 (End of Normal Measuring Time)

When an output value of the counter 21b of the second converter becomes all bits zero, an interval end signal IEB is outputted. The timing control circuit 164 outputs a latch signal for latch and encoders in response to the present interval end signal IEB, and stores a difference of values of the latch and encoders 14 and 15 to the memory 147 as a memory value 5. The timing control circuit 164 outputs also a counting mode signal of an H level and a preset/reset signal PRB for the second converter.

The counter 163 of the first converter switches the up/down-count of a circulating pulse related to the A/D conversion process from the normal counting mode to the double counting mode according to the counting mode signal Sm. The counter 21b of the second converter presets a whole-bit-reversed value of a value held in the normal measuring time latch 166 in response to the preset/reset signal PRB, and continues the count. This preset value is dummy data. Since the difference of the preset value and zero is small, another interval end signal IEB is generated in a period from the present time till time t5 (not shown). However, another interval end signal IEB is ignored by the arrangement of the valid interval end signal IEA described above. The RS flip-flop 23b is also reset in response to the preset/reset signal PRB.

(5) Time t4 (End of Measurement by Counter 163)

When an output value of the counter 21a of the second converter becomes all bits zero, an interval end signal IEA is outputted. The timing control circuit 164 changes the counting mode signal from an H level to an L level, in response to the interval end signal IEA, and returns the counter 163 of the first converter from the double counting mode to the normal counting mode. The timing control circuit 143 outputs also a latch signal for latch and encoders, and stores a difference of values of the latch and encoders 14 and 15 to the memory 147 as a memory value 1.

The timing control circuit 164 outputs also the preset/reset signal PRA for the second converter. The second counter 21a performs an up/down-count for the measurement of the normal measuring time, until the next rising of the external clock. A preset value at this time is all bits one, as described in (2). Since the difference of the preset value and zero is small, another interval end signal IEA is generated in a period from the present time till time t5 (not shown). However, another interval end signal IEA is ignored by the arrangement of the valid interval end signals IEA described above. The RS flip-flop 23a is also reset in response to the preset/reset signal PRA.

(6) Time t5 (End of Measurement by Counter 163)

The timing control circuit 164 outputs a stop signal for the first converter in response to a rising of the external clock, and stops the count of the counter 163 of the first converter. The timing control circuit 164 outputs also a latch signal for latch and encoders, and stores a difference of values of the latch and encoders 14 and 15 to the memory 147 as a memory value 6. The timing control circuit 164 outputs further a normal measuring time latch signal to the second converter, and the count value of the counter 21a of the second converter is held in the normal measuring time latch 166. Next, the timing control circuit 164 outputs a position switching signal and performs rotation of the ring delay lines a to d relative to the pulse circulation circuits 2 to 5.

The timing control circuit 164 outputs a stop release signal for the first converter, and a preset/reset signal PRA and a preset/reset signal PRB for the second converter. The counter 21*a* of the second converter presets a value (a value of ¼ of the specified value Y) set at the ROM in response to the preset/reset signal PRA, and continues the count. The counter 163 of the first converter starts an up/down-count of a circulating pulse related to the A/D conversion process in response to the stop release signal in the normal counting mode.

On the other hand, the counter 21*b* of the second converter presets a whole-bit-reversed value of a value held in the normal measuring time latch 166 in response to the preset/reset signal PRB, and continues the count. The RS flip-flops 23*a* and 23*b* are also reset in response to the preset/reset signals A and B. Subsequently, switching of the arrangement is repeated until the end of the A/D conversion (time t6). Since the similar operations are repeated, the description thereof is omitted.

(7) Time t6 (End of A/D Conversion)

The timing control circuit 164 outputs a stop signal for the first converter in response to a rising of the external clock, and stops the count of the counter 163 of the first converter. The timing control circuit 164 outputs also a latch signal for latch and encoders, and stores a difference of values of the latch and encoders 14 and 15 to the memory 147 as a memory value 12. The timing control circuit 164 outputs further a normal measuring time latch signal to the second converter, and the count value of the counter 21*a* of the second converter is held in the normal measuring time latch 166. In preparation for a start of the next A/D conversion, the timing control circuit 143 outputs a position switching signal to perform rotation of the ring delay lines a to d relative to the pulse circulation circuits 2 to 5.

As described in (3), the timing control circuit 164 outputs a stop release signal SR and a reset signal RA for the first converter, and a preset/reset signal PRA and a preset/reset signal PRB for the second converter. Accordingly, the counter 163 of the first converter starts a count operation in the normal counting mode. As described above, the counters 21*a* and 21*b* of the second converter continue the count always.

The timing control circuit 164 outputs an integration start signal. At this time, the count value of the counter 163 of the first converter is held in the higher-order bit latch 146. On the other hand, as for the lower-order bits, a difference of values of the latch and encoders 14 and 15 (difference data; a difference of position data) is stored in the memory 147, at the time of alteration from the normal counting mode to the double counting mode (for example, time t3), at the time of alteration from the double counting mode to the normal counting mode (for example, time t4), and at the end time of an interval (for example, time t5). However, since the pulse position of each of the ring delay lines a to d immediately after the switching of the arrangement is set as an initial position, it is not necessary to store the difference data at the start time of an interval.

Memory value 1: Difference data at the time of alteration to the normal counting mode in the first interval Memory value 2: Difference data at the time of alteration to the normal counting mode in the second interval Memory value 3: Difference data at the time of alteration to the normal counting mode in the third interval Memory value 4: Difference data at the time of alteration to the normal counting mode in the fourth interval Memory value 5: Difference data at the time of alteration to the double counting mode in the first interval Memory value 6: Difference data at the end time of the first interval Memory value 7: Difference data at the time of alteration to the double counting mode in the second interval Memory value 8: Difference data at the end time of the second interval Memory value 9: Difference data at the time of alteration to the double counting mode in the third interval Memory value 10: Difference data at the end time of the third interval Memory value 11: Difference data at the time of alteration to the double counting mode in the fourth interval Memory value 12: Difference data at the end time of the fourth interval In response to the integration start signal, the fraction integrating circuit 148 produces the total difference data by calculating (memory value 1+memory value 2+memory value 3+memory value 4)+(memory value 6−memory value 5)+(memory value 8−memory value 7)+(memory value 10−memory value 9)+(memory value 12−memory value 11). The fraction integrating circuit 148 produces a carry (positive value) or a borrow (negative value) to the higher-order bits and the lower-order bits.

The adder 149 adds the higher-order data from the higher-order bit latch 146 and a carry (positive value) or a borrow (negative value) from the fraction integrating circuit 148 to the higher-order bits, and sets the result as the higher-order 14 bits of the A/D conversion data. The lower-order bits of the fraction integrating circuit 148 are set as the lower-order 4 bits of the A/D conversion data. When the operation is completed, the timing control circuit 164 outputs a conversion completion signal, and holds the final 18-bit A/D conversion data DT in the A/D value latch 144. This operation can be performed in parallel to other process, for example, the next A/D conversion process.

As is the case with Embodiment 12, one cycle may be divided into intervals for every 1/(4M) cycle, and the rotation may be repeated M times (M=2, 3, - - - ) in one A/D conversion period. FIG. 37 illustrates a schematic timing chart of A/D conversion in the case of M=2, namely, of dividing one cycle into eight intervals. The operation is the same as that of the case of M=1. When the latch and encoders 14 and 15 are provided, the number of data stored in the memory 147 is 24, as described above.

As described in the above, the A/D converter circuits 161 and 162 of the present embodiment count a pulse outputted from the first pulse circulation circuit 2 to the fourth pulse circulation circuit 5 without a break (except for the time of an arrangement change) by the first counter 163. In order to produce the same A/D conversion data DT as in the case of counting with two counters as described in Embodiment 12, the first counter 163 performs counting by switching the normal counting mode and the double counting mode.

As is the case with Embodiment 12, according to this configuration, it is possible to improve the integration effect of the A/D converter circuit, that is, the low pass filter effect produced by the moving average. Consequently, it is possible to remove or simplify an anti-aliasing filter, and it is possible to reduce a layout area required for the filter in the semiconductor integrated circuit device. Compared with Embodiment 12, since it is possible to reduce the number of counters of the first converter, it is possible to reduce the layout area correspondingly.

Embodiment 14

Figure 38:
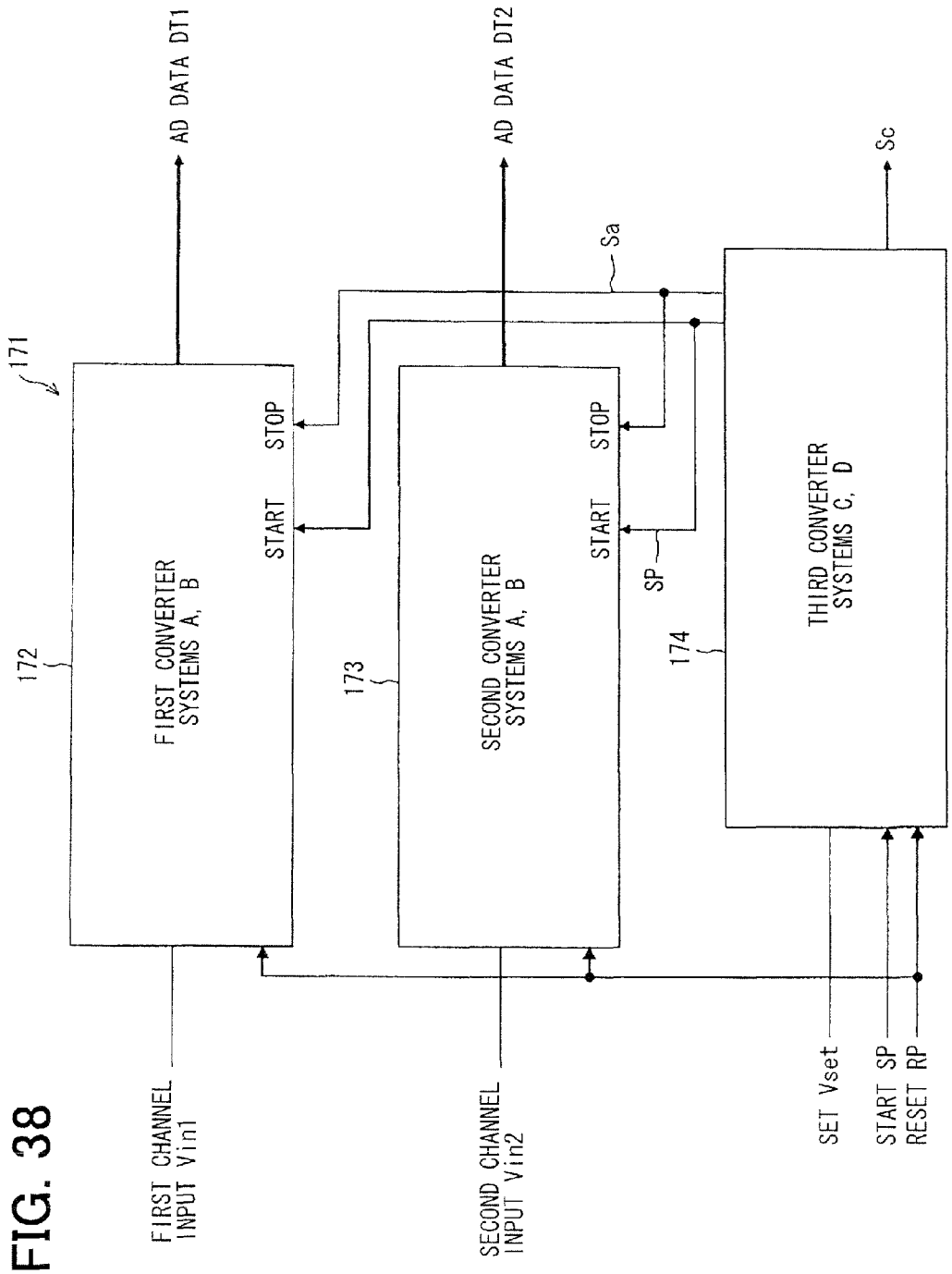
FIG. 38 illustrates a block diagram of a two-channel A/D converter circuit according to Embodiment 14.
Figure 39:
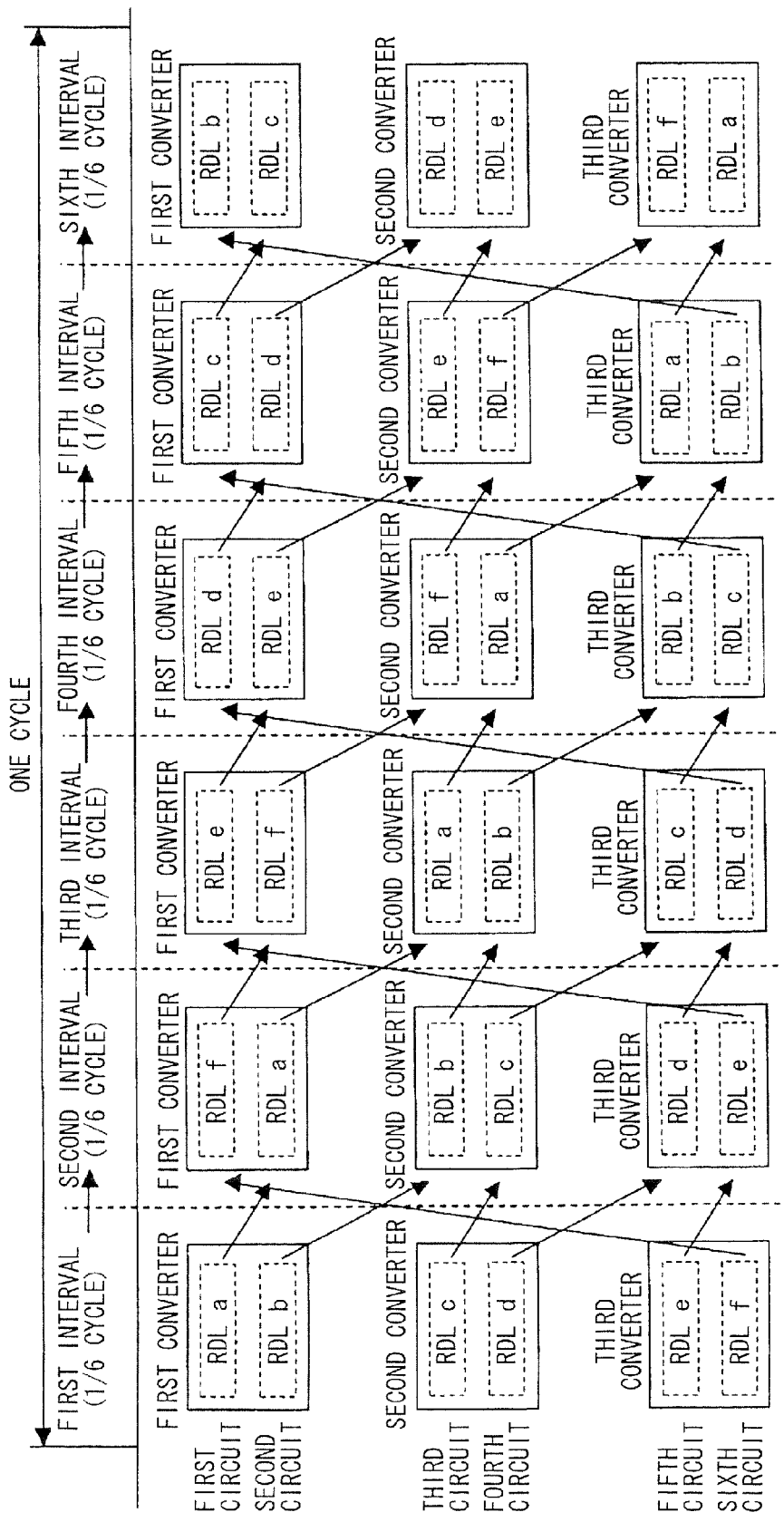
FIG. 39 is a schematic diagram in a similar manner as FIG. 24.

Embodiment 14 is related to an A/D converter circuit of plural channels as described with reference to FIG. 38 and FIG. 39. An A/D converter circuit 171 illustrated in FIG. 38 is a two-channelized modification of one of the A/D converter circuits described above.

The A/D converter circuit 171 is configured with a block related to systems A and B for the first channel (a first converter 172), a block related to systems A and B for the second channel (a second converter 173), and a block related to systems C and D common to the first and the second channel (a third converter 174).

The first converter 172 and the second converter 173 which are provided independently for each channel are configured respectively with a first pulse circulation circuit, a second pulse circulation circuit, a first counter, a level shift circuit, and, if needed, a first circulating position detecting circuit and a second circulating position detecting circuit. The third converter 174 provided common to each channel is configured with a third pulse circulation circuit, a fourth pulse circulation circuit, a second counter, a level shift circuit, and a determination circuit.

A reset pulse RP is inputted to the first converter 172 to the third converter 174. The counters of the first converter 172 to the third converter 174 are reset (preset to zero) all at once by the reset pulse RP. When a start pulse SP of an H level is inputted to the third converter 174, the start pulse SP is also supplied to the first converter 172 and the second converter 173 via the third converter 174, and all the pulse circulation circuits start a pulse circulating operation at the same time.

The first counter of the first converter 172 and the second converter 173 counts the circulation number of a pulse signal in the first pulse circulation circuit, and the circulation number of a pulse signal in the second pulse circulation circuit, respectively, and sets a difference of the circulation numbers as higher-order data of the A/D conversion data. In cases where the first circulating position detecting circuit and the second circulating position detecting circuit are provided, a difference of the pulse position in the first pulse circulation circuit and the pulse position in the second pulse circulation circuit is set as lower-order data of the A/D conversion data, corresponding to a predetermined number of bits. The third converter 174 outputs a conversion data output process signal Sa, when the difference outputted by the second counter reaches the specified value Y. At this time, the first converter 172 and the second converter 173 respectively stop the circulation operation of the first counter and output A/D conversion data DT1 and DT2 corresponding to analog input voltages Vin1 and Vin2.

The A/D converter circuit with one-channel configuration described in each embodiment requires four pulse circulation circuits. However, when it is designed so as to support N channels (N=1, 2, - - -), the number of pulse circulation circuits required becomes not 4N but 2N+2. Therefore, as the number of channels increases, it becomes possible to make an area-efficient layout in a semiconductor integrated circuit device.

As is the case with Embodiment 11, in the present embodiment, it is possible to improve the offset temperature characteristics and the sensitivity temperature characteristics by switching the arrangement of the first ring delay line a to the sixth ring delay line f. FIG. 39 illustrates an arrangement change method of the ring delay lines a to f. The first ring delay line a to the sixth ring delay line f are configured so as to change the coupling state with the neighboring circuits so that the first ring delay line a to the sixth ring delay line f can operate as any one of the first and the second pulse circulation circuit of the first converter 172 and the second converter 173, and any one of the third and the fourth pulse circulation circuit of the third converter 174.

It is assumed that a period after a start pulse SP is supplied until the second counter of the third converter 174 completes counting of the specified value Y is one cycle, and that time produced by dividing one cycle by the number of ring delay lines, that is, an interval for every ⅙ cycle is allotted as the first interval to the sixth interval. The conversion control circuit switches the coupling state every ⅙ cycle so that the first ring delay line a to the sixth ring delay line f may operate respectively as each of the pulse circulation circuits described above for an equal period of time (=TAD/6). Here, the ring delay lines a to f are switched in rotation sequentially to each of the pulse circulation circuits. However, as long as the position of the ring delay lines a to f is switched sequentially so that the ring delay lines a to f may operate as a different pulse circulation circuit every ⅙ cycle, other arrangement change methods than the rotation are also practicable.

When generalized, in the case of N channels (N=1, 2, - - -), one cycle is divided into a time produced by dividing by (number of a ring delay line×M), that is, into every interval with a $1/((2N+2) \cdot M)$ period, and the rotation of (2N+2) times in one A/D conversion period may be repeated M times (M=1, 2, - - -). In this way, a still higher equalization effect is produced by increasing the number of intervals.

Embodiment 15

When there is no alternative other than to couple the back gate to the substrate potential (ground), in each Embodiment (except for Embodiment 2) described above, potential differences between the back gate and other electrodes than the back gate (a source, a drain, a gate) will differ in the N-channel MOS transistors 2c and 3c illustrated in FIG. 2, for example. Therefore, the substrate bias effect influences characteristics. For this reason, in cases where N-channel MOS transistors, which form the A/D converter circuit including the pulse circulation circuits 2 to 5, are formed on the same semiconductor substrate, it is necessary to separate electrically the back gate of the N-channel MOS transistors, which form the pulse circulation circuits 2 and 4, the input level shift circuit 10, etc., from the substrate potential (ground potential) of the semiconductor substrate.

Figure 40A:
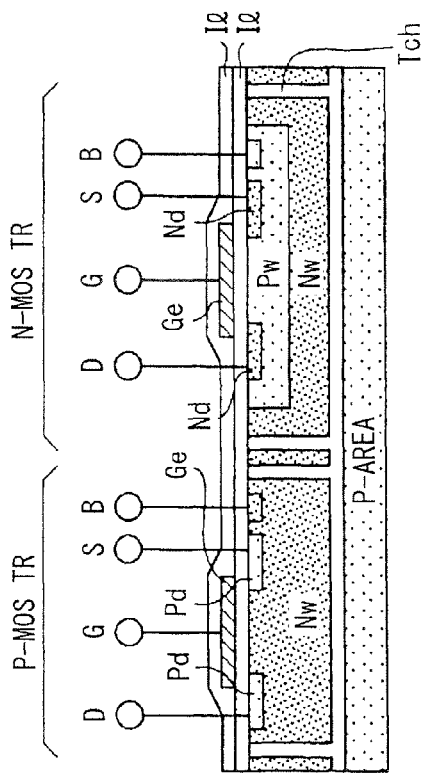
FIG. 40($a$) and FIG. 40($b$) illustrate schematic sectional views of a MOS transistor according to Embodiment 15.
Figure 40B:
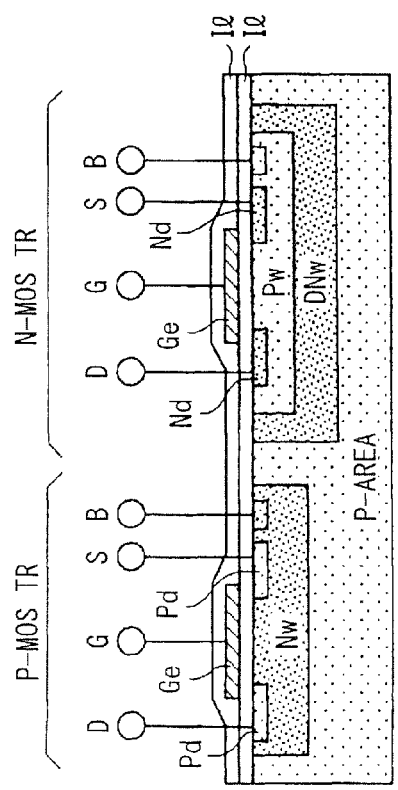

Accordingly, in the case of a P-type semiconductor substrate as illustrated in FIG. 40(a), a P-well Pw surrounded by a deep N-well DNw is formed on a P-type semiconductor substrate Ps to realize a double well structure, and an N-channel MOS transistor is formed there. According to the structure, a substrate potential different from the ground potential can be given. As another means, as illustrated in FIG. 40(b), a SOI (Silicon on Insulator) layer of an SOI substrate which has an embedded oxide film is divided into plural areas surrounded by an insulation separation trench Tch, which reaches the embedded oxide film, and a MOS transistor is formed in each of the divided areas. According to the structure, a mutually different substrate potential can be given. In FIG. 40(a) and FIG. 40B, Pd, Ge, Nd, Nw, Il indicate a P-diffusion layer, a gate electrode, a N-diffusion layer, a N-well and an insulator layer, respectively.

Embodiment 16

An A/D converter circuit 181 illustrated in FIG. 41 has a configuration, in which the amplifier circuits 42 and 43 according to Embodiment 2 (refer to FIG. 9), are modified to the first full-differential amplifier circuit 182 and the second full-differential amplifier circuit 183, respectively. The latch and encoders 14 and 15 are not provided although they may be provided. Bypass capacitors Cp are provided between the non-inverted-side output line of the full-differential amplifier circuits 182 and 183 and the ground line 8, and between the inverted-side output line thereof and the ground line 8, in preparation for the momentary voltage reduction due to a flow-through current at the time of reversal of the inverter circuits Na to Nx.

Generally, a full-differential amplifier circuit is provided with a common mode feedback circuit so that a mean value of a non-inverted output voltage and an inverted output voltage may become a constant value. Therefore, the mean value (an output common mode voltage Vcom) of the full-differential amplifier circuits 182 and 183 becomes equal to the reference voltage Vref (for example, Vcc/2).

In the full-differential amplifier circuit 182, the non-inverted output side operates as a voltage follower of the ordinary operational amplifier, and the non-inverted output voltage becomes equal to the analog input voltage Vin. The inverted output voltage is given by 2·Vref−Vin as in Equation (11). That is, the full-differential amplifier circuit 182 outputs a difference voltage produced by subtracting the reference voltage Vref from the analog input voltage Vin and a polarity-inverted voltage of the difference voltage, from the non-inverted output terminal and the inverted output terminal, respectively, with a positive and negative symmetry with respect to the reference voltage Vref. The inverter circuits Na to Nx of the first pulse circulation circuit 2 are supplied with the power supply voltage from the inverted output terminal of the full-differential amplifier circuit 182, and the ground line 8. The inverter circuits Na to Nx of the second pulse circulation circuit 3 are supplied with the power supply voltage from the non-inverted output terminal of the full-differential amplifier circuit 182, and the ground line 8.

In the full-differential amplifier circuit 183, the non-inverted output voltage becomes equal to the set voltage Vset in the same manner. The inverted output voltage is given by 2·Vref−Vset as in Equation (12). That is, the full-differential amplifier circuit 183 outputs a difference voltage produced by subtracting the reference voltage Vref from the set voltage Vset and a polarity-inverted voltage of the difference voltage, from the non-inverted output terminal and the inverted output terminal, respectively, with a positive and negative symmetry with respect to the reference voltage Vref. The inverter circuits Na to Nx of the third pulse circulation circuit 4 are supplied with the power supply voltage from the inverted output terminal of the full-differential amplifier circuit 183, and the ground line 8. The inverter circuits Na to Nx of the fourth pulse circulation circuit 5 are supplied with the power supply voltage from the non-inverted output terminal of the full-differential amplifier circuit 183, and the ground line 8.

According to the present embodiment, all of sources and back gates of the N-channel MOS transistors located in the low potential side of the pulse circulation circuits 2 to 5 are coupled to the ground potential. Accordingly, the same operation-effect as in Embodiment 2 is produced. The reference voltage xref is not restricted to Vcc/2. Since the full-differential amplifier circuits 182 and 183 intervene to the input of the systems A and B, and the input of the systems C and D, respectively, a delay in the input of the systems A and B and a delay in the input of the systems C and D become substantially equal with each other. Consequently, since it becomes easy to match the phase of the differential output voltages even to an analog input voltage at high frequencies, it is possible to expect that an A/D conversion accuracy increases further.

Embodiment 17

Embodiment 17 is described with reference to FIG. 42 to FIG. 47. As is the case with Embodiment 8, the present embodiment relates to technology, in which an offset voltage of a full-differential operational amplifier included in an input interface is canceled, through the use of the feature of an A/D converter circuit of a TAD system.

Figure 42:
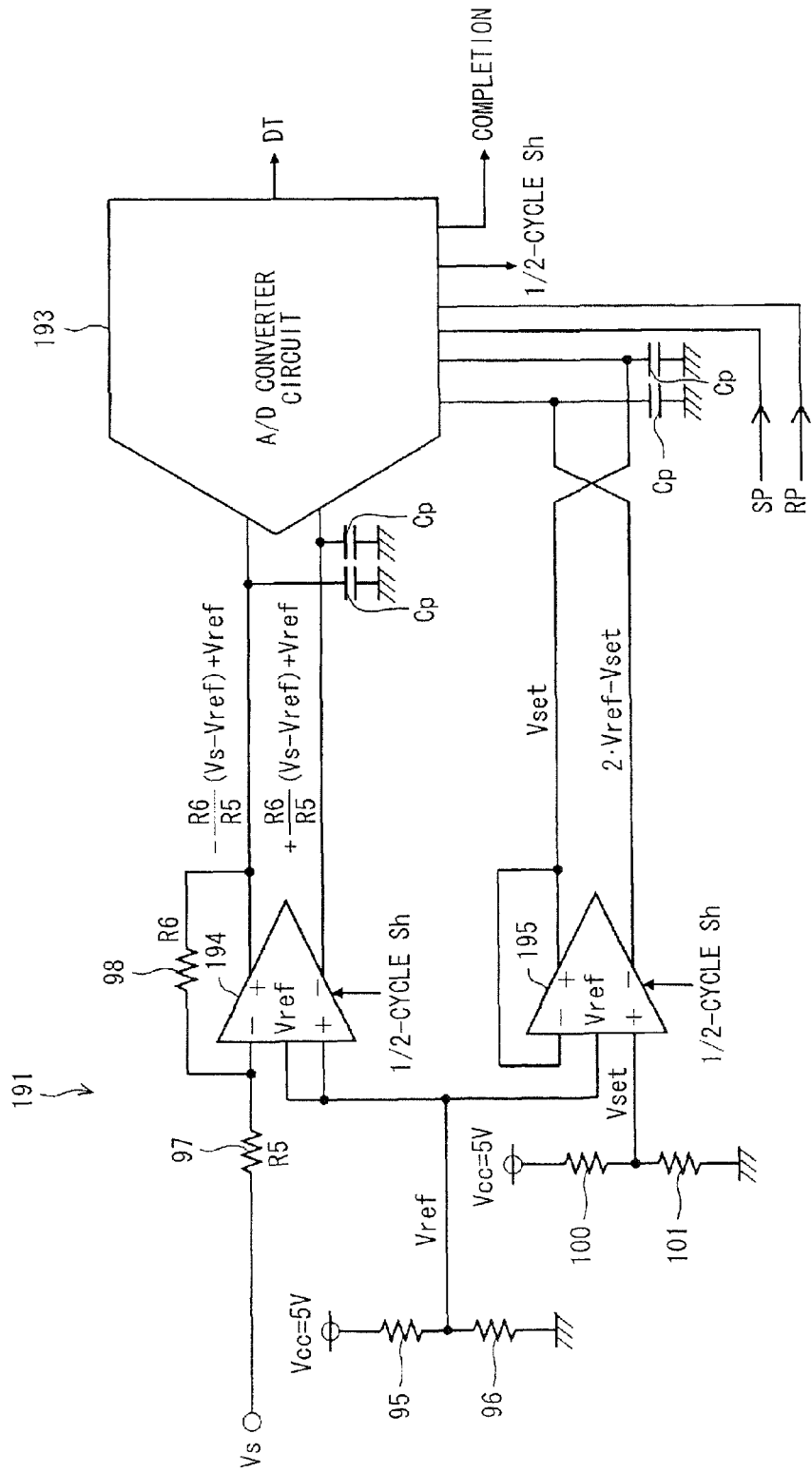
FIG. 42 is a circuit diagram illustrating Embodiment 17 in a similar manner as FIG. 17.
Figure 43:
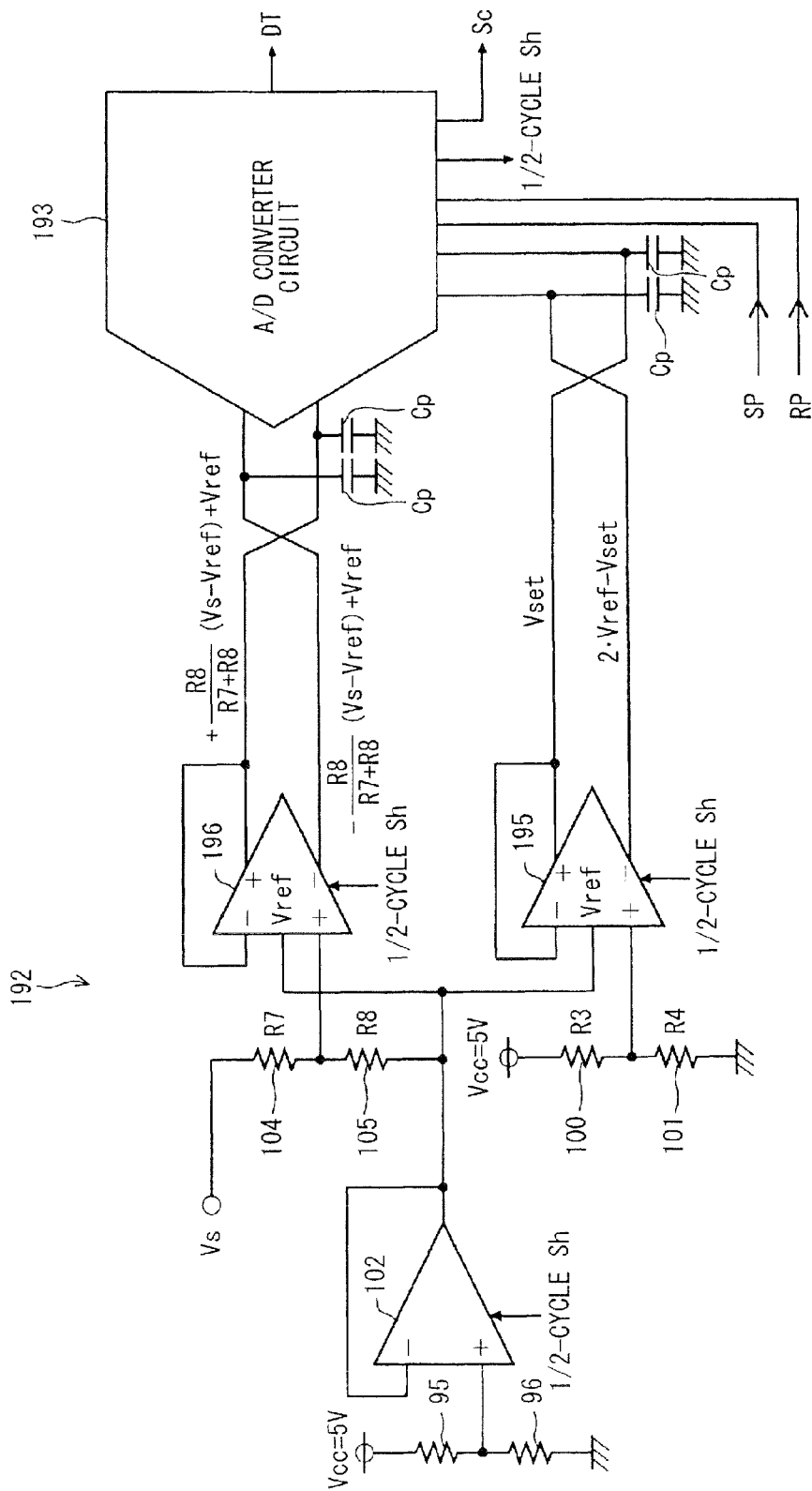
FIG. 43 is a circuit diagram in a similar manner as FIG. 18.

FIG. 42 and FIG. 43 illustrate input interfaces 191 and 192 which output 2·Vref−Vin, Vin, 2·Vref−Vset, and Vset to an A/D converter circuit 193. That is, it is only necessary to think that the full-differential amplifier circuits 182 and 183 illustrated in FIG. 41 are replaced with full-differential amplifier circuits 194, 195, and 196 illustrated in FIG. 42 and FIG. 43. It should be noted that any amplifier circuit is not included in the A/D converter circuit 193. Same applies also to FIG. 48 of Embodiment 18 and FIG. 49 of Embodiment 19, to be described later. Correspondingly, treatment of the input voltage Vin also differs, such that the input voltage is set as Vs, for example. These input interfaces 191 and 192 are formed in the same semiconductor integrated circuit device as the A/D converter circuit 193. The A/D converter circuit 193 is configured with pulse circulation circuits 2 to 5 to which the four voltage is applied with a reference potential of the ground line 8, and outputs a ½-cycle signal Sh described already.

In FIG. 42, gain of the full-differential operational amplifier 194 is determined by resistors 97 and 98. When values of resistance R5 and R6 of the resistors 97 and 98 satisfy a relation of R5>R6, the gain becomes −k3 times (0<k3<1). At this time, voltages 2·Vref−Vin and Vin, which are inputted to the A/D converter circuit 193 respectively from a non-inverted output terminal and an inverted output terminal of the full-differential operational amplifier 194, are given by Equation (20) and Equation (21). Here, the voltage Vs is an input voltage from a sensor etc.

$$2 \cdot Vref - Vin = -(R6/R5) \cdot (Vs - Vref) + Vref \quad (20)$$

$$Vin = +(R6/R5) \cdot (Vs - Vref) + Vref \quad (21)$$

In the full-differential operational amplifier 195, the non-inverted output side operates as a voltage follower, and the non-inverted output voltage becomes the set voltage Vset, and the inverted output voltage becomes 2 Vref-Vset.

Referring to FIG. 43, in the full-differential operational amplifier 196, the non-inverted output side operates as a voltage follower. Voltages Vin and 2·Vref−Vin, which are inputted to the A/D converter circuit 193 respectively from a non-inverted output terminal and an inverted output terminal of the full-differential operational amplifier 196, are given by Equation (22) and Equation (23). That is, the gain becomes +k4 times (0<k4<1).

$$Vin = +(R8/(R7+R8)) \cdot (Vs - Vref) + Vref \quad (22)$$

$$2 \cdot Vref - Vin = -(R8/(R7+R8)) \cdot (Vs - Vref) + Vref \quad (23)$$

Figure 44:
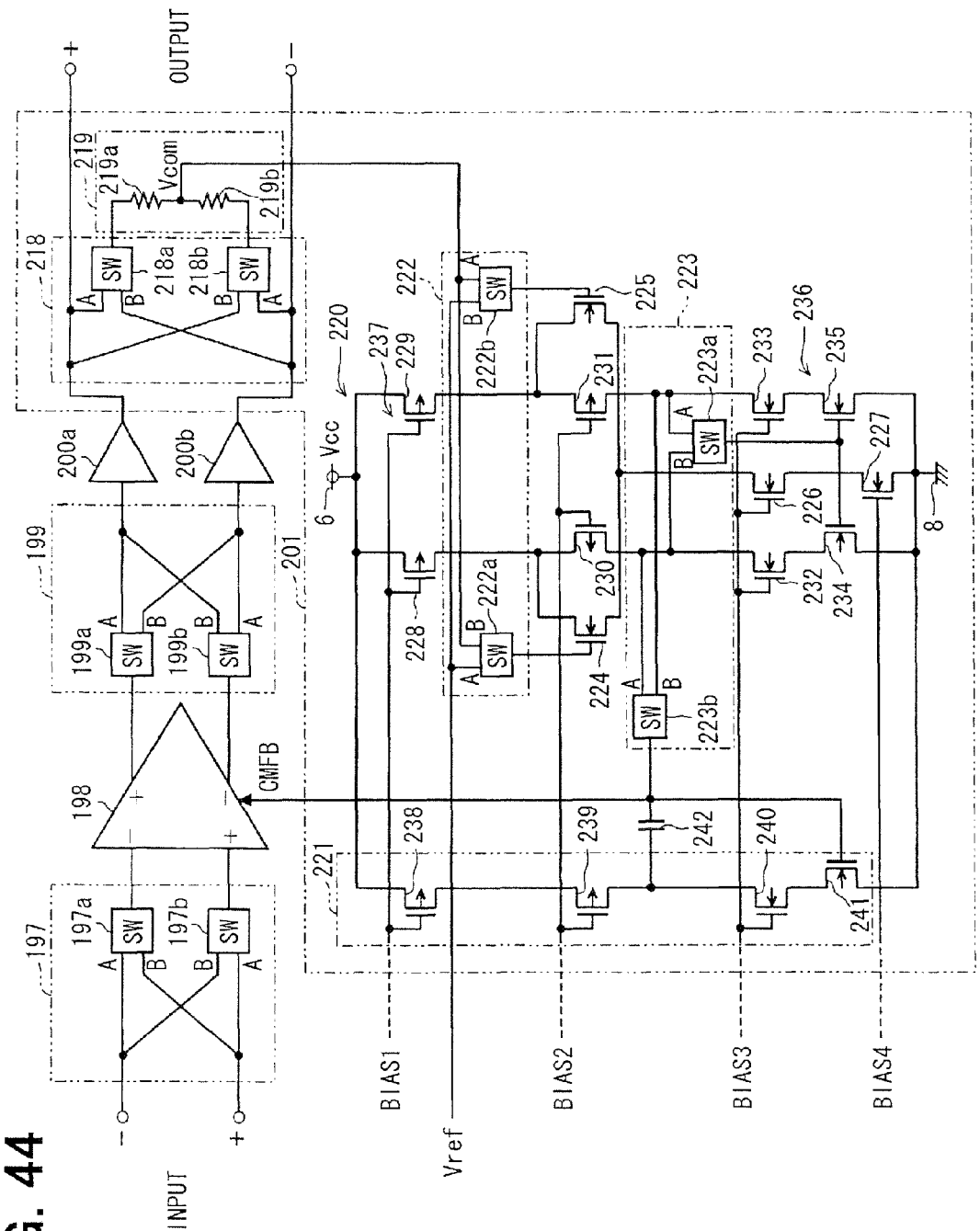
FIG. 44 illustrates a circuit diagram of a full-differential operational amplifier.

FIG. 44 illustrates a configuration of the full-differential operational amplifiers 194, 195, and 196 described above. The full-differential operational amplifiers 194, 195, and 196 are provided with a first switching circuit 197, a first differential pair sub-circuit 198, a second switching circuit 199, first output sub-circuits 200a and 200b, and a common mode feedback circuit 201.

Figure 46:
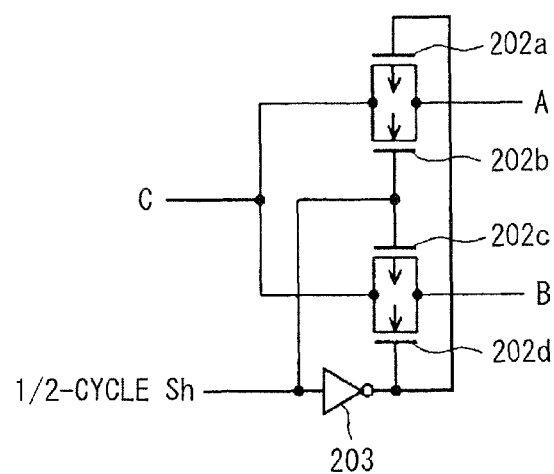
FIG. 46 illustrates a circuit diagram of a change-over switch.

Change-over switches 197a, 197b, 199a, and 199b which form the switching circuits 197 and 199 are configured with four analog switches 202a to 202d, as illustrated in FIG. 46, and render conductive one of between a terminal C and a terminal A and between the terminal C and a terminal B, in response to a ½-cycle signal Sh and an inverted signal of the signal Sh by an inverter 203. The first switching circuit 197 transposes two connecting lines between the inverting input terminal and the non-inverting input terminal of the full-differential operational amplifier, and the inverting input terminal and the non-inverting input terminal of the first differential pair sub-circuit 198. The second switching circuit 199 transposes two connecting lines between the non-inverted output terminal and the inverted output terminal of the first differential pair sub-circuit 198, and the first output sub-circuits 200a and 200b.

Figure 45:
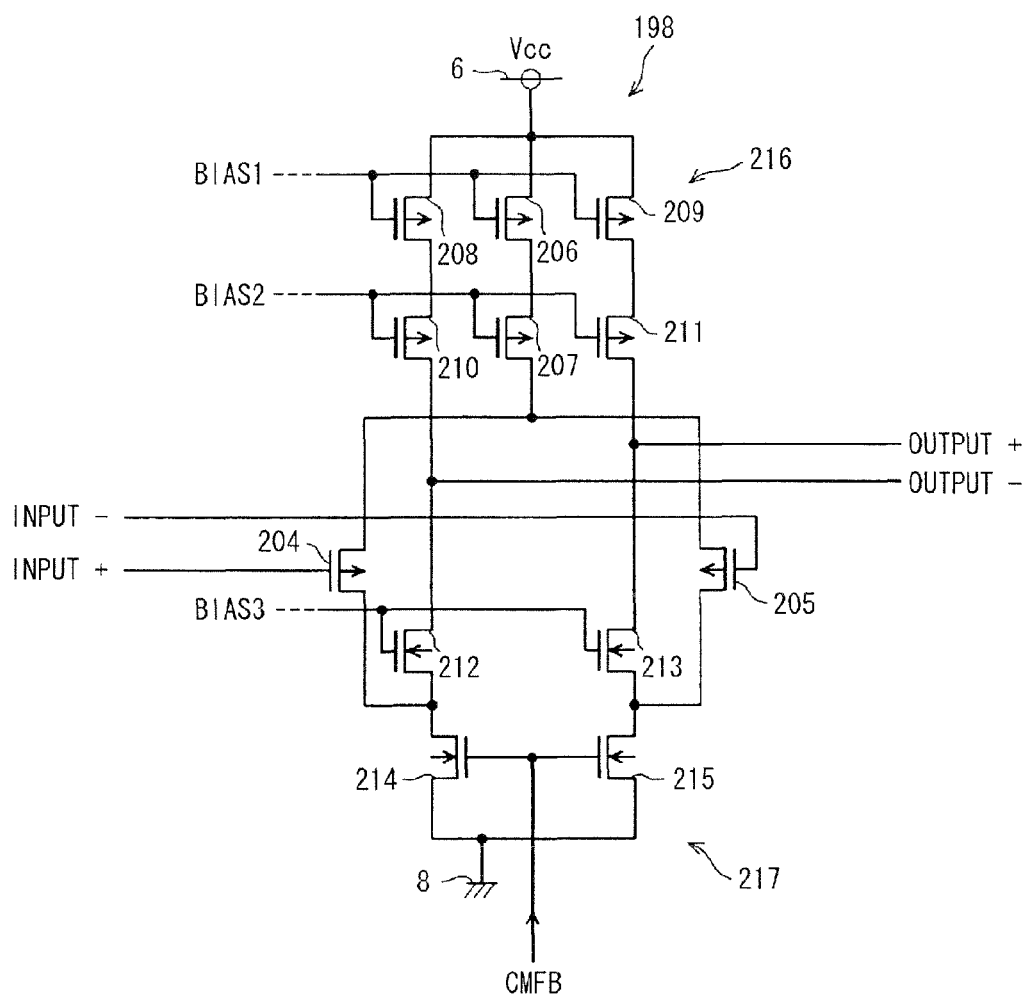
FIG. 45 illustrates a circuit diagram of a first differential pair sub-circuit.

The first differential pair sub-circuit 198 is configured with transistors 204 to 215 which are arranged in a mode of folded cascode connection, as illustrated in FIG. 45. The transistors 204 and 205 form a differential pair, and between the source thereof and the specified voltage line 6, the transistors 206 and 207 operating as a constant current circuit are cascode-connected. Between the specified voltage line 6 and the ground line 8, transistors 208 and 209, transistors 210 and 211, transistors 212 and 213, and transistors 214 and 215, respectively in a pair, are coupled in series. The transistors 208 and 210 and the transistors 209 and 211 are cascode-connected, respectively, and serve as an active load 216 to the differential pair.

The transistors 214 and 215 form a constant current circuit 217 in order to fold up the output current of the differential pair and to input it to the active load 216. A common mode feedback signal CMFB is inputted to the common gate line of the transistors 214 and 215. The transistors 212 and 213 coupled between the active load 216 and the constant current circuit 217 are provided in order to suppress occurrence of a mirror effect in the transistors 204 and 205. The sources of the transistors 212 and 213 (i.e., drains of the transistors 214 and 215) are coupled to the drains of the transistors 204 and 205, respectively. Each of the drains of the transistors 210 and 211 serves as an output terminal of the first differential pair sub-circuit 198.

In a full-differential amplifier circuit, a common mode feedback as a negative feedback is applied usually so that a mean value of two output voltages (+, −) may become equal to the reference voltage Vref. In the present embodiment, in order to prevent an oscillation by a negative feedback, a phase compensation capacitor by the ordinary operational amplifier format is used. Due to the configuration, a mirror effect is produced and a small capacitor can be used, allowing easy mounting to an integrated circuit.

The common mode feedback circuit 201 illustrated in FIG. 44 is configured with a third switching circuit 218, a common mode voltage detection unit 219, a second differential pair sub-circuit 220, a second output sub-circuit 221, a fourth switching circuit 222, and a fifth switching circuit 223. Change-over switches 218a, 218b, 222a, 222b, 223a, and 223b which form the switching circuits 218, 222, and 223 have a configuration illustrated in FIG. 46.

The common mode voltage detection unit 219 is a series circuit of resistors 219a and 219b with the mutually same value of resistance. The common mode voltage detection unit 219 inputs an output voltage of the first output sub-circuits 200a and 200b, and detects a common mode voltage Vcom as a middle voltage. The third switching circuit 218 transposes two connecting lines between the first output sub-circuits 200a and 200b (a non-inverted output terminal and an inverted output terminal of the full-differential operational amplifier), and the common mode voltage detection unit 219.

The second differential pair sub-circuit 220 is configured with transistors 224 to 235 which are arranged in a mode of folded cascode connection, as is the case with the first differential pair sub-circuit 198. The transistors 224 and 225 form a differential pair and the transistors 226 and 227 form a constant current circuit. The transistors 232 and 234 and the transistors 233 and 235 form an active load 236 to the differential pair. The transistors 228 and 229 form a constant current circuit 237.

The second output sub-circuit 221 is configured with transistors 238 to 241 which are coupled in series between the specified voltage line 6 and the ground line 8. Two output terminals of the second differential pair sub-circuit 220 are coupled to drains of the transistors 239 and 240 via a change-over switch 223b and a capacitor 242 for phase compensation, and to a gate of the transistor 241 via the change-over switch 223b. The output voltage of the second differential pair sub-circuit 220 selected by the change-over switch 223b serves as the common mode feedback signal CMFB.

The fourth switching circuit 222 transposes input lines of the reference voltage Vref and the common mode voltage Vcom to the second differential pair sub-circuit 220 with each other. The change-over switch 223b of the fifth switching circuit 223 selects one of output terminals of the second differential pair sub-circuit 220, and couples it to the second output sub-circuit 221. Herewith, a change-over switch 223a selects an output terminal which is not selected by the change-over switch 223b, and couples it to gates of the transistors 234 and 235.

Figure 47:
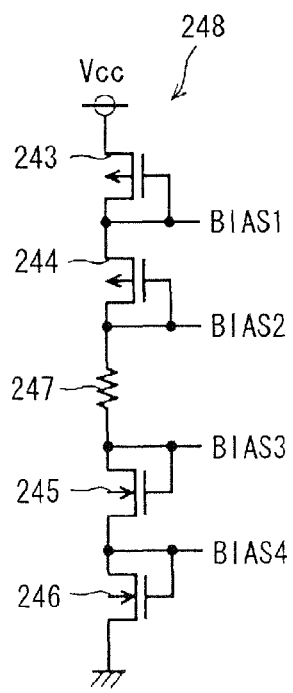
FIG. 47 illustrates a circuit diagram of a bias voltage generating circuit.

Four bias voltages BIAS1 to BIAS4 used by the full-differential operational amplifier are generated by a bias voltage generating circuit 248, which is configured with transistors 243 to 246 and a resistor 247 as illustrated in FIG. 47.

According to the present embodiment, when the ½-cycle signal Sh is at an H level, an analog switch going through a terminal A side of each change-over switch is set to ON, and when the ½-cycle signal Sh is at an L level, an analog switch going through a terminal B side of each change-over switch is set to ON. A level of the ½-cycle signal Sh is reversed in a first half period and a second half period of one cycle of the A/D conversion, and the direction of an offset voltage of the full-differential operational amplifiers 194, 195, and 196 is reversed. According to the scheme, the mean value of the offset voltage included in the analog input voltage Vin and the set voltage Vset over one cycle of the A/D conversion becomes zero, and it is possible to produce A/D conversion data of high accuracy in which an offset voltage of a full-differential operational amplifier is canceled.

Since the full-differential operational amplifiers 194, 196, or 195 intervene to an input of the systems A and B, and an input of the systems C and D, respectively, a delay in the input of the systems A and B and a delay in the input of the systems C and D become substantially equal with each other, and it become easy to match the phase of the differential outputs even to a high-frequency signal. Consequently, it is possible to expect that an A/D conversion accuracy increases further.

Embodiment 18

Figure 48:
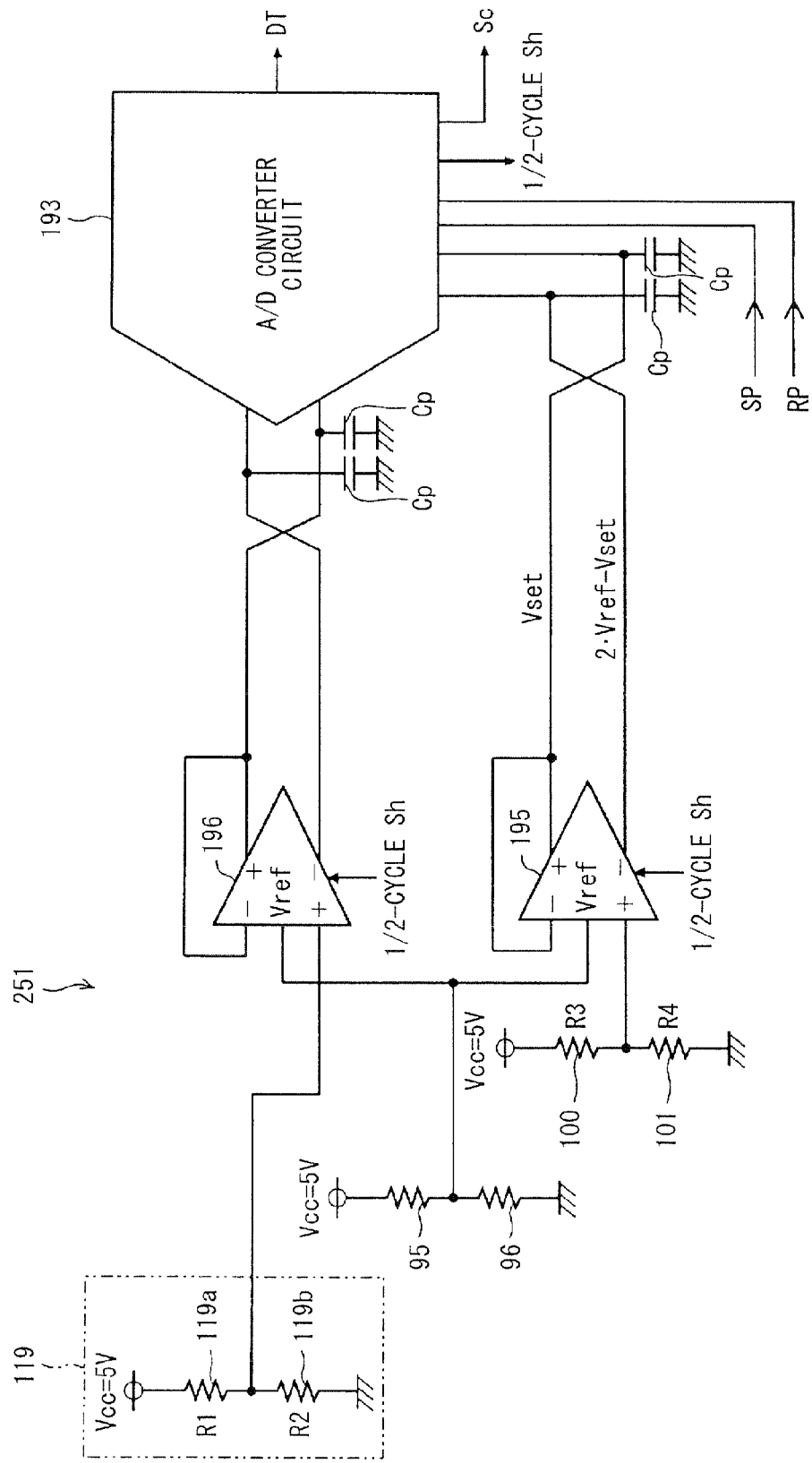
FIG. 48 is a circuit diagram illustrating Embodiment 18 in a similar manner as FIG. 21.

An input interface 251 illustrated in FIG. 48 forms a ratiometric A/D conversion system in the case of using full-differential operational amplifiers 195 and 196. According to the present embodiment, as described in Embodiment 10, in performing A/D conversion of the output voltage of a sensor 119, it is possible to perform the A/D conversion, which is not influenced by variation of the power supply voltage (the specified voltage Vcc), by counterbalancing the ratiometric characteristics of the sensor 119.

Embodiment 19

Figure 49:
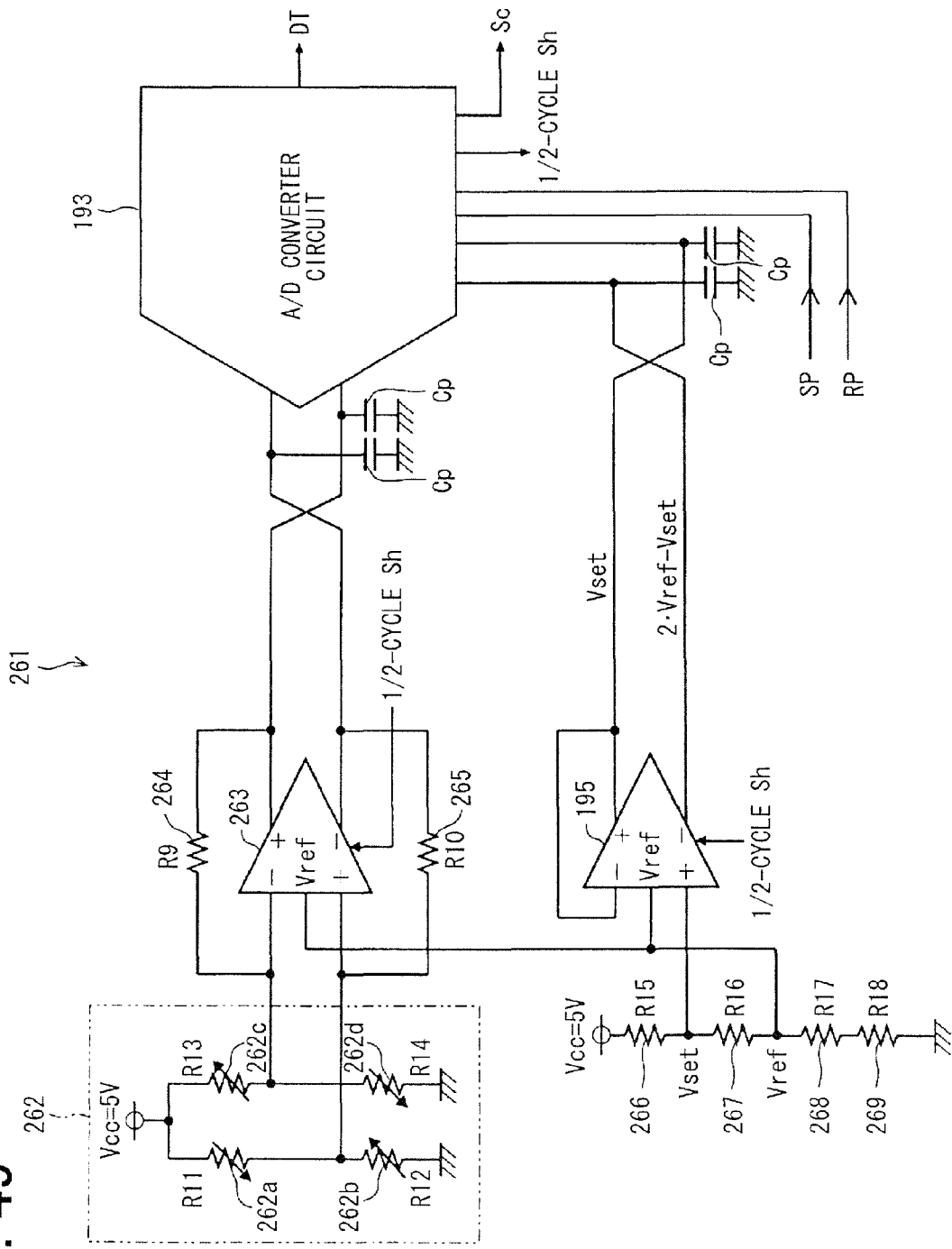
FIG. 49 illustrates a circuit diagram of an exemplified application of Embodiment 19 to a pressure sensor.

FIG. 49 illustrates Embodiment 19, in which the A/D converter circuit is applied to process an output voltage of a pressure sensor. An input interface 261 transforms into a voltage a current inputted from the pressure sensor 262, amplifies the voltage, and outputs it to the A/D converter circuit 193. In addition, the input interface 261 generates a set voltage Vset and a voltage of 2·Vref−Vset, and outputs them to the A/D converter circuit 193.

The pressure sensor 262 is provided with a full bridge circuit configured with four strain gages 262a, 262b, 262c, and 262d (resistors R11, R12, R13, and R14), which possess the piezo-resistive effect. The strain gages 262a and 262b and the strain gages 262c and 262d are formed such that the direction of change of the value of resistance as a function of distortion amount are opposite, respectively, and the strain gages 262a and 262d and the strain gages 262b and 262c are formed such that the direction of change of the value of resistance as a function of distortion amount are the same, respectively.

The configuration of the part of the amplifier circuit is conventional (for example, JP 2002-148131A). Unlike the ordinary amplifier circuit, the present amplifier circuit produces an output voltage by making a current, which changes with the change of the value of resistance as a function of the distortion amount of the strain gage, flow through resistors 264 and 265. A non-inverted output side of the full-differential operational amplifier 263 is fed back to an inverting input terminal via the resistor 264, and an inverted output side is fed back to a non-inverting input terminal via the resistor 265. Usually, the value of resistance R9 of the resistor 264 and the value of resistance R10 of the resistor 265 are set to an equal value.

An output sensitivity (corresponding to the ordinary amplification degree) can be adjusted by enlarging the value of resistance of the resistors 264 and 265. The strain gages 262a to 262d and the resistors 264 and 265 are formed by diffusion resistance of a different impurity concentration, and are configured so as to suppress the temperature characteristics of sensitivity, by adjusting each impurity concentration appropriately. The full-differential operational amplifier 263 of the present embodiment corresponds to the full-differential operational amplifier 196 illustrated in FIG. 48.

The resistors 266 to 269 coupled in series, on the other hand, sub-divide the specified voltage Vcc to generate the reference voltage Vref and the set voltage Vset. In the present embodiment, the values of resistance R15 to R18 of the resistors 266 to 269 hold a relation that R15+R16=R17+R18. Accordingly, the reference voltage Vref is equal to Vcc/2, and the set voltage Vset is higher than the reference voltage Vref.

In many of the embodiments described above, the amplifier circuit is formed in a form of a voltage follower. However, it is not always to be a voltage follower, as exemplified in FIG. 49. That is, since no operational amplifier is included in the A/D converter circuit 193 illustrated in FIG. 49, the present embodiment indicates the fact that the analog circuit of a sensor which requires an A/D converter circuit can be configured with two full-differential operational amplifiers. This fact indicates that decrease of the analog parts is possible, leading to an advantage in cost, because the analog parts are not easy to undergo finer geometry manufacturing, restricted by characteristics such as an offset voltage, compared with a digital part which can be miniaturized through increasingly finer geometries of a semiconductor process. Also in FIG. 49, it is possible to perform the A/D conversion which is not influenced by variation of the power supply voltage (the specified voltage Vcc), by counterbalancing the ratiometric characteristics of the pressure sensor 262.

In the present embodiment, various characteristic compensations are performed as described above. It is only necessary to perform a minor operational correction to such an extent that an offset correction and a sensitivity correction of the bridge circuit unit are performed after the A/D conversion. Therefore, the A/D converter circuit according to the present embodiment is suitable to be applied to a sensor which requires a high speed response.

Other Embodiments

As described above, the preferred embodiments of the present invention have been described. However, the present invention is not restricted to the embodiments described above. It can be changed, modified, or expanded variously in the range which does not deviate from the gist of the invention.

The pulse circulation circuit (ring delay line) described above is configured with a series coupling of odd-numbered elements including a NAND gate and inverters, from the viewpoint of realizing reliable oscillation. However, the pulse circulation circuit may be configured with the even-numbered inverters (for example, JP 2010-148005A, etc.) and others, which realize reliable oscillation. Since the circulating pulse position and the encoded data correspond with each other on one-on-one level by the adoption of the even number, linearity in lower-order bits is improved.

The NAND gate and the inverters, which form the ring delay line, may be configured with circuits different from the circuit illustrated in FIG. 2. Furthermore, the detection of a circulating pulse position is performed from all the outputs of the inverters, however, the detection may be performed skipping one for every two, for example.

The input level shift circuits 10 and 11 and the output level shift circuits 12 and 13 as illustrated in FIG. 2 are necessary in each embodiment, however, it is not restricted to the circuit configuration illustrated in FIG. 2. An example of the up/down-counter and the overlap detector 31 are illustrated in FIG. 4. However, it is not restricted to the circuit configuration illustrated in FIG. 4.

Inverters are used at various places to generate a delay time in each embodiment. The continuation number may be changed according to a necessary delay time, provided that consideration is given to whether the continuation number is odd or even. As a delay element for generating a delay time, capacitors or parasitic capacitance of wiring in a chip or an element, other than an inverter, may be utilized.

In the embodiments of the present application, an A/D conversion value for the reference voltage Vref is set as all bits zero by setting all bits zero as the preset value of the up/down-counter of the first kind like the first counter 20 illustrated in FIG. 1 etc. On the other hand, when an arbitrary value is preset, it can be added to the A/D conversion value. The present scheme can be utilized for offset correction in application to a sensor etc.

In each embodiment, in which the latch and encoders 14 and 15 are provided, it is possible to omit the latch and encoders 14 and 15. Also in each embodiment except Embodiment 2, it is preferable to adopt a configuration as illustrated in Embodiment 2, in which the first amplifier circuit 42 and the second amplifier circuit 43 are provided, and all of sources and back gates of N-channel MOS transistors located in the low potential side of the pulse circulation circuits 2 to 5 are coupled to the ground potential.

Also in each embodiment except Embodiment 16, it is preferable to adopt a configuration as illustrated in Embodiment 16, in which the first full-differential amplifier circuit 182 and the second full-differential amplifier circuit 183 are provided, and sources and back gates of N-channel MOS transistors located in the low potential side of the pulse circulation circuits 2 to 5 are coupled to the ground potential.

Also in each embodiment except Embodiment 7, as illustrated in Embodiment 7, in the third and the fourth pulse circulation circuit, a pulse signal may be fetched from inverter circuits Na, Nb, - - - , and Nx−1, located in the same position with each other, in addition to the inverter circuit Nx, and the pulse signal may be outputted to the second counter. Furthermore, with or instead of the present configuration, the inverter 84 (delay circuit) may be provided for delaying the start of a circulation operation of the first and the second pulse circulation circuit.

Also in each embodiment except Embodiment 3 to Embodiment 6, as illustrated in Embodiment 3 to Embodiment 6, it is preferable to adopt a configuration in which the counters 64 and 65 are provided in lieu of the first counter 20, the counters 69 and 70 are provided in lieu of the second counter 21, and the comparator 52 is provided in lieu of the comparator 22.

The comparators 22, 22a, and 22b detect the fact that the output values of the second counters 21, 21a, and 21b have reached all bits zero. However, the comparators 22, 22a, and 22b may detect the fact that the output values of the second counters 21, 21a, and 21b have reached all bits one. The present case adopts a configuration in which a difference of the value of all bits one and the specified value Y (or Y/4, etc.) is preset as the higher-order preset value in the second counters 21 and 21a, and when a difference outputted by the second counters 21 and 21a reaches all bits one, the conversion data output process signal Sa and the interval end signal IEA are outputted.

In Embodiment 16, Embodiment 17, and Embodiment 18, the bypass capacitor Cp is provided in preparation for the momentary voltage reduction due to a flow-through current at the time of reversal of the inverter circuits Na to Nx. However, in each of the other embodiments, the bypass capacitor Cp may be provided in the same manner.

The magnetic sensor using a Hall element and the pressure sensor is exemplified as an application of the A/D converter circuit to sensor products. However, the A/D converter circuit according to the present invention can be used in other sensors, such as a temperature sensor. Not restricted to the application to sensors, it is possible to mount the A/D converter circuit as a peripheral circuit of a digital signal processing device, such as a micro-processor (micro controller), a DSP (Digital Signal Processor), etc.

What is claimed is:

1. An A/D converter circuit comprising:
a first pulse circulation circuit configured with a plurality of delay units coupled together in a ring shape and operable to circulate a pulse signal around the delay units, the plural delay units using a difference voltage of a specified voltage and an analog input voltage as a first power supply voltage and outputting an input signal after a delay of a delay time defined in accordance with the first power supply voltage;
a second pulse circulation circuit configured with a plurality of delay units coupled together in a ring shape and operable to circulate a pulse signal around the delay units, the plural delay units using the analog input voltage as a second power supply voltage and outputting an input signal after a delay of a delay time defined in accordance with the second power supply voltage;
a first counter operable to count a circulation number of the pulse signal in the first pulse circulation circuit and a circulation number of the pulse signal in the second pulse circulation circuit, and operable to output a difference of the circulation numbers;
a third pulse circulation circuit configured with a plurality of delay units coupled together in a ring shape and operable to circulate a pulse signal around the delay units, the delay units being supplied with a set voltage different from a reference voltage and using a difference voltage of the specified voltage and the set voltage as a third power supply voltage, and outputting an input signal after a delay of a delay time defined in accordance with the third power supply voltage;
a fourth pulse circulation circuit configured with a plurality of delay units coupled together in a ring shape and operable to circulate a pulse signal around the delay units, the delay units operating with the use of the set voltage as a fourth power supply voltage and outputting an input signal after a delay of a delay time defined in accordance with the fourth power supply voltage;
a second counter operable to count the circulation number of the pulse signal in the third pulse circulation circuit and the circulation number of the pulse signal in the fourth pulse circulation circuit, and operable to output a difference of the circulation numbers; and
a conversion control circuit operable to make the first to the fourth pulse circulation circuits start respective circulation operation of the pulse signals concurrently, operable to output a conversion data output process signal when the difference outputted by the second counter reaches a predetermined specified value, and operable to output the difference outputted by the first counter at a time as A/D conversion data corresponding to the analog input voltage,
wherein the delay units provided in each of the first to the fourth pulse circulation circuits are in the same number and formed in a thermally coupled state with each other.

2. The A/D converter circuit of claim 1, wherein:
the reference voltage has a voltage value of ½ times as large as the specified voltage;
the set voltage is set up differently from the reference voltage;
the delay units of the first pulse circulation circuit are supplied with the first power supply voltage from a specified voltage line of the specified voltage and a signal input line of the analog input voltage;
the delay units of the second pulse circulation circuit are supplied with the second power supply voltage from the signal input line and a ground line;
the delay units of the third pulse circulation circuit are supplied with the power supply voltage from the specified voltage line and a set voltage line of the set voltage; and
the delay units of the fourth pulse circulation circuit is supplied with the fourth power supply voltage from the set voltage line and the ground line.

3. The A/D converter circuit of claim 1, further comprising:
a first amplifier circuit operable to input the analog input voltage and the reference voltage, and to output a difference voltage between the analog input voltage and a voltage of two times as large as the reference voltage; and
a second amplifier circuit operable to input the set voltage and the reference voltage, and to output a difference voltage between the set voltage and the voltage of two times as large as the reference voltage, wherein the delay units of the first pulse circulation circuit are supplied with the first power supply voltage from an output line of the first amplifier circuit and the ground line, wherein the delay units of the second pulse circulation circuit are supplied with the power supply voltage from the signal input line and the ground line, wherein the delay units of the third pulse circulation circuit are supplied with the power supply voltage from an output line of the second amplifier circuit and the ground line, and wherein the delay units of the fourth pulse circulation circuit are supplied with the power supply voltage from the set voltage line and the ground line.

4. The A/D converter circuit of claim 1, further comprising:

a first full-differential amplifier circuit operable to output a difference voltage produced by subtracting the reference voltage from the analog input voltage and a polarity-inverted voltage thereof, from a non-inverted output terminal and an inverted output terminal respectively, with a positive and negative symmetry with respect to the reference voltage; and a second full-differential amplifier circuit operable to output a difference voltage produced by subtracting the reference voltage from the set voltage and a polarity-inverted voltage thereof, from a non-inverted output terminal and an inverted output terminal respectively, with a positive and negative symmetry with respect to the reference voltage, wherein the delay units of the first pulse circulation circuit are supplied with the first power supply voltage from the inverted output terminal of the first full-differential amplifier circuit and a ground line, wherein the delay units of the second pulse circulation circuit are supplied with the second power supply voltage from the non-inverted output terminal of the first full-differential amplifier circuit and the ground line, wherein the delay units of the third pulse circulation circuit are supplied with the third power supply voltage from the inverted output terminal of the second full-differential amplifier circuit and the ground line, and wherein the delay units of the fourth pulse circulation circuit are supplied with the fourth power supply voltage from the non-inverted output terminal of the second full-differential amplifier circuit and the ground line.

5. The A/D converter circuit of claim 1, further comprising:

a first circulating position detecting circuit operable to detect a pulse position in the first pulse circulation circuit at a time of output of the conversion data output process signal; and a second circulating position detecting circuit operable to detect a pulse position in the second pulse circulation circuit, at the time of output of the conversion data output process signal, wherein, at the time of output of the conversion data output process signal, the conversion control circuit sets a difference between the pulse position in the first pulse circulation circuit and the pulse position in the second pulse circulation circuit as lower-order data of an A/D conversion data in conformity with a predetermined number of bits, and sets a sum of a difference outputted by the first counter and a carry or a borrow from the lower-order data as higher-order data of the A/D conversion data.

6. The A/D converter circuit of claim 1, wherein:

the first counter performs a down-count and an up-count, when the pulse signal is outputted from the delay units arranged in the same position mutually in the first and the second pulse circulation circuit, respectively; and the second counter performs a down-count and an up-count, when the pulse signal is outputted from the delay units arranged in the same position mutually in the third and the fourth pulse circulation circuits, respectively.

7. The A/D converter circuit of claim 6, wherein:

the first and the second counters include, respectively, a count-stop terminal, a count-up input terminal, and a count-down input terminal, and are configured with either one kind of an up/down-counter of a first kind and an up/down-counter of a second kind, the up/down-counter of the first kind changing a count-up mode and a count-down mode according to which the count-up input terminal and the count-down input terminal inputs the pulse signal, and stopping the count operation on condition that the conversion data output process signal is inputted to the count-stop terminal, and the up/down-counter of the second kind being provided with two pairs of a counter for producing an up-count value and a down-count value and a latch for latching the count value in synchronization with a clock, and outputting difference of the count values latched by the two latches.

8. The A/D converter circuit of claim 7, wherein:

the up/down-counter of the first kind includes an input unit operable to generate a count signal and a mode signal for instructing count-up and count-down according to an inputted pulse signal, and a counter unit operable to perform count-up or count-down of the count signal according to the mode signal;

the input unit includes an overlap detector and a count signal output unit;

the overlap detector monitors occurrence or non-occurrence of an overlapping state, in which the pulse signal is concurrently inputted to the count-up input terminal and the count-down input terminal, outputs an overlap detection signal when occurrence of the overlapping state is detected, and stops to output the overlap detection signal after at least a delay time from input to output in the count signal output unit has elapsed from a time when the two overlapping pulse signals have ended; and the count signal output unit outputs a count signal to the counter unit on condition that the pulse signal inputted to the count-up input terminal or the count-down input terminal has ended, when the overlap detection signal is not inputted from the overlap detector, and does not output the count signal to the counter unit, when the overlap detection signal is inputted.

9. The A/D converter circuit of claim 6, further comprising:

at least one of a multiplexer and a delay circuit, wherein the delay circuit is operable to delay a start of a circulation operation of the first and the second pulse circulation circuits with respect to a start of a circulation operation of the third and the fourth pulse circulation circuits, by a delay time from a time when a difference of the circulation number of a pulse signal in the third pulse circulation circuit and the circulation number of a pulse signal in the fourth pulse circulation circuit reaches the specified value to a time when the conversion control circuit outputs the conversion data output process signal; and wherein the multiplexer is operable to extract a pulse signal from the delay units located in the same position with each other and specified by a lower-order preset value in the third and the fourth pulse circulation circuits, and operable to output the extracted pulse signal to the second counter.

10. The A/D converter circuit of claim 6, wherein:
the second counter is operable to set up a higher-order preset value to a difference to be output; and
the conversion control circuit includes a determination circuit operable to detect that the count value of the second counter has reached all bits zero or all bits one, presets to the second counter a difference of a value of all bits zero or all bits one and the specified value as the higher-order preset value, before making the first to the fourth pulse circulation circuit start the circulation operation of the pulse signal concurrently, and outputs the conversion data output process signal when the difference outputted by the second counter reaches all bits zero or all bits one.

11. The A/D converter circuit of claim 6, wherein:
the conversion control circuit includes a comparator operable to compare a difference outputted by the second counter with a comparison reference value as the higher-order preset value, supplies the specified value to the comparator as the comparison reference value before making the first to the fourth pulse circulation circuit start the circulation operation of the pulse signal concurrently, and outputs the conversion data output process signal when an output of the comparator is reversed.

12. The A/D converter circuit of claim 1, wherein:
the plurality of delay units coupled together in the ring shape as each of a first to a fourth ring delay lines are formed on a semiconductor substrate;
the first to the fourth ring delay lines are capable of switching a respective coupling state so as to operate as any of the first to the fourth pulse circulation circuits; and
the conversion control circuit switches the coupling state for every period of 1/(4M) of one A/D conversion time so that the first to the fourth ring delay lines operate for an equal period of time as the first to the fourth pulse circulation circuits, respectively, and the switching operation concerned is repeated M (M=1, 2, - - - ) times in one A/D conversion period.

13. The A/D converter circuit of claim 1, wherein:
the plurality of delay units coupled together in the ring shape as a first to a fourth ring delay lines are formed on a semiconductor substrate;
the first to the fourth ring delay lines are operable to switch a respective coupling state to operate as any one of the first to the fourth pulse circulation circuits;
the first counter includes a 1a-th counter and a 1b-th counter capable of stopping counting and operable to count the circulation number of the pulse signal in the first pulse circulation circuit and the circulation number of the pulse signal in the second pulse circulation circuit and operable to output the difference of the circulation numbers;
the second counter includes a 2a-th counter and a 2b-th counter operable to count the circulation number of a pulse signal in the third pulse circulation circuit and the circulation number of a pulse signal in the fourth pulse circulation circuit and operable to output the difference of the circulation numbers;
the conversion control circuit makes the first to the fourth pulse circulation circuits start a circulation operation of the pulse signal concurrently, switches the coupling state for every cycle of a reference clock signal with a constant period set up longer than 1/(4M) of the A/D conversion time, so as to repeat a switching operation M times in one A/D conversion period, the switching operation being an operation in which the first to the fourth ring delay lines operate for an equal period of time as the first to the fourth pulse circulation circuits respectively, starts counting by the 1a-th counter at a start time of each cycle of the reference clock signal, outputs the conversion data output process signal when an output value of the 2a-th counter from the start time of the cycle concerned reaches 1/(4M) of the specified value, stops the 1a-th counter and resets the 2a-th counter to continue counting, and holds the output value of the 2a-th counter as a wait time count value at a start time of the following cycle of the reference clock signal, and
in parallel with the operation of the 1a-th counter and the 2a-th counter, when an output value of the 2b-th counter from a start time of each cycle of the reference clock signal reaches the wait time count value produced in the preceding period of the reference clock signal, the conversion control circuit outputs the conversion data output process signal, starts counting by the 1b-th counter, stops counting by the 1b-th counter at a start time of the following cycle of the reference clock signal, and outputs the sum of the differences outputted respectively by the 1a-th counter and the 1b-th counter at the time of ending of 4M cycles of the reference clock signal, as the A/D conversion data to the analog input voltage.

14. The A/D converter circuit of claim 13, further comprising:
a first circulating position detecting circuit operable to detect a pulse position in the first pulse circulation circuit; and
a second circulating position detecting circuit operable to detect a pulse position in the second pulse circulation circuit,
wherein the conversion control circuit stores difference data of the pulse position in the first pulse circulation circuit and the pulse position in the second pulse circulation circuit at the time of the count start and the count stop of each of the 1a-th counter and the 1b-th counter, in each period of 4M cycles of the reference clock signal, calculates total difference data for generation of the A/D conversion data, by adding over 4M cycles a value produced after subtracting the difference data at the time of the count start from the difference data at the time of the count stop of the 1a-th counter, and a value produced after subtracting the difference data at the time of the count start from the difference data at the time of the count stop of the 1b-th counter, sets the lower-order bits of the total difference data as lower-order data of the A/D conversion data in conformity with the predetermined number of bits, and sets the sum of the differences outputted by the 1a-th counter and the 1b-th counter and the higher-order bits of the total difference data as higher-order data of the A/D conversion data.

15. The A/D converter circuit of claim 1, wherein:
the plurality of delay units coupled together in the ring shape as each of a first to a fourth ring delay lines are formed on a semiconductor substrate;
the first to the fourth ring delay lines are operable to switch a respective coupling state so as to operate as any one of the first to the fourth pulse circulation circuits;
the first counter has a normal counting mode in which the circulation number of the pulse signal in the first pulse circulation circuit and the circulation number of the pulse signal in the second pulse circulation circuit are counted by one for every circulation and the difference of the circulation numbers is outputted, and a double counting mode in which the circulation number is counted by two for every circulation and the difference of the circulation numbers is outputted;

the second counter includes a 2a-th counter and a 2b-th counter operable to count the circulation number of the pulse signal in the third pulse circulation circuit and the circulation number of the pulse signal in the fourth pulse circulation circuit and operable to output the difference of the circulation numbers;

the conversion control circuit makes the first to the fourth pulse circulation circuits start a circulation operation of the pulse signal concurrently, switches the coupling state for every cycle of a reference clock signal with a constant period set up longer than 1/(4M) of the A/D conversion time, to repeat a switching operation M times in one A/D conversion period, the switching operation being an operation in which the first to the fourth ring delay line operate for an equal period of time as the first to the fourth pulse circulation circuit respectively, makes the first counter continue a count operation during 4M cycles of the reference clock signal except for the time of switching of the coupling state, sets the first counter to the normal counting mode at a start time of each cycle of the reference clock signal, sets the first counter to the double counting mode, when an output value of the 2b-th counter from the time concerned reaches the normal measuring time count value produced in the preceding period of the reference clock signal, sets the first counter to the normal counting mode, when an output value of the 2a-th counter from a start time of each cycle of the reference clock signal reaches 1/(4M) of the specified value, resets the 2a-th counter to continue counting, holds an output value of the 2a-th counter as a normal measuring time count value at a start time of the following cycle of the reference clock signal, and outputs the difference outputted by the first counter at the time of ending 4M cycles of the reference clock signal as A/D conversion data to the analog input voltage.

16. The A/D converter circuit of claim 15, further comprising:
a first circulating position detecting circuit operable to detect the pulse position in the first pulse circulation circuit; and
a second circulating position detecting circuit operable to detect the pulse position in the second pulse circulation circuit,
wherein the conversion control circuit stores difference data of the pulse position in the first pulse circulation circuit and the pulse position in the second pulse circulation circuit, at a start of a period, at the time of alteration from the double counting mode to the normal counting mode, at the time of alteration from the normal counting mode to the double counting mode, and at an end of the period, in each period of 4M cycles of the reference clock signal, calculates total difference data for generation of A/D conversion data, by adding over 4M cycles a value produced after subtracting the difference data at the start of the period from the difference data at the time of alteration to the normal counting mode, and a value produced after subtracting the difference data at the time of alteration to the normal counting mode from the difference data at the end of the period, sets the lower-order bits of the total difference data as lower-order data of the A/D conversion data in conformity with the predetermined number of bits, and sets the sum of the difference outputted by the first counter and the higher-order bits of the total difference data as higher-order data of the A/D conversion data.

17. The A/D converter circuit of claim 1, wherein:
the first pulse circulation circuit, the second pulse circulation circuit and the first counter are provided for each of plural analog input voltages, and
the third pulse circulation circuit, the fourth pulse circulation circuit and the second counter are provided in common for all the plural analog input voltages,
the A/D converter circuit operating as a plurality of channels for performing A/D conversion of the plurality of analog input voltages concurrently.

18. The A/D converter circuit of claim 17, wherein:
the number of channels is N (N=1, 2, - - - );
a first to a (2N+2)-th ring delay lines (a to d), each of which includes the plurality of delay units coupled together in the ring shape, are formed on a semiconductor substrate;
the first to the (2N+2)-th ring delay lines (a to d) are operable to switch a respective coupling state so as to operate as any of the first to the fourth pulse circulation circuits; and
wherein the conversion control circuit switches the coupling state for every 1/((2N+2)·M) period, so as to repeat M times (M=1, 2, - - - ) a switching operation, in which the first to the (2N+2)-th ring delay lines operate for an equal period of time as the first to the fourth pulse circulation circuit, respectively.

19. The A/D converter circuit of claim 1, wherein:
the analog input voltage is a sub-divided voltage of the specified voltage corresponding to detected physical quantity outputted from a sensor to which the specified voltage is supplied as a power supply voltage; and
the set voltage is a voltage produced by sub-dividing the specified voltage.

20. The A/D converter circuit of claim 1, further comprising:
operational amplifiers for receiving a detection voltage outputted from a sensor as the analog input voltage and the set voltage, respectively,
wherein each of the operational amplifiers includes
a differential pair sub-circuit, which has a first and a second transistor,
an output sub-circuit located in an output stage of the differential pair sub-circuit,
an input switching sub-circuit operable to output input voltages to a non-inverting input terminal and an inverting input terminal, to the first and the second transistors, or to the second and the first transistors, respectively, according to a switching signal, and
an output switching sub-circuit operable to output an output voltage of the first or the second transistor to the output sub-circuit, according to the switching signal, and
wherein the conversion control circuit switches the switching signal, at the time when the first half period of one A/D conversion period has elapsed.

21. The A/D converter circuit of claim 1, further comprising:
full-differential operational amplifiers for receiving a detection voltage outputted from a sensor as the analog input voltage and the set voltage, respectively,
wherein each of the full differential operation amplifiers includes
a first differential pair sub-circuit provided with a common mode feedback input terminal and a differential output format,
a pair of the first output sub-circuits located in an output stage of a non-inverted output terminal and an inverted output terminal of the first differential pair sub-circuit, respectively, a first switching circuit operable to transpose connecting lines between a non-inverting input terminal and an inverting input terminal of the full-differential operational amplifier concerned, and a non-inverting input terminal and an inverting input terminal of the first differential pair sub-circuit, a second switching circuit operable to transpose connecting lines between a non-inverted output terminal and an inverted output terminal of the differential pair sub-circuit, and the pair of output sub-circuits, and a common mode feedback circuit, wherein the common mode feedback circuit includes a common mode voltage detection unit operable to input output voltages of the pair of first output sub-circuits to detect a common mode voltage, a third switching circuit operable to transpose connecting lines between the pair of first output sub-circuits and the common mode voltage detection unit, a second differential pair sub-circuit, a fourth switching circuit operable to transpose an input line of the reference voltage and an input line of the common mode voltage, to the second differential pair sub-circuit, and a fifth switching circuit operable to select one of two output terminals of the second differential pair sub-circuit, and to couple the selected output terminal to the common mode feedback input terminal, and wherein the conversion control circuit switches the first to the fifth switching circuits by the switching signal at a time when the first half period of one A/D conversion period has elapsed.

22. The A/D converter circuit of claim 1, wherein:

the analog input voltage is supplied from a Hall element provided with four terminals serving as a pair of opposed input terminals, through which a control current flows, and as a pair of opposed output terminals from which a Hall voltage is outputted, a differential amplifier circuit for amplifying the Hall voltage, and a switching circuit for switching the input terminals and the output terminals according to a switching signal, and the conversion control circuit controls percentage of a coupling period to the input terminals and the output terminals at ½ and ½, in one A/D conversion period.

* * * * *